US012679191B2

(12) United States Patent
Fogle et al.

(10) Patent No.: US 12,679,191 B2
(45) Date of Patent: Jul. 14, 2026

(54) ELECTRIC DRIVE MOTOR FOR MOVING APPARATUS

(71) Applicant: BLACK & DECKER INC., New Britain, CT (US)

(72) Inventors: John B. Fogle, White Hall, MD (US); Kevin L. Pulley, White Marsh, MD (US); Mark J. Clementi, Mint Hill, NC (US); James M. Nobis, Waxhaw, NC (US); Shailesh P. Waikar, Perry Hall, MD (US); David M. Kelly, Olmsted Township, OH (US); Nathaniel K. Byrne, Columbia Station, OH (US); Timothy A. Clapp, Queen Creek, AZ (US)

(73) Assignee: Black & Decker Inc., New Britain, CT (US)

( * ) Notice: Subject to any disclaimer, the term of this patent is extended or adjusted under 35 U.S.C. 154(b) by 229 days.

(21) Appl. No.: 18/236,630

(22) Filed: Aug. 22, 2023

(65) Prior Publication Data

US 2024/0072604 A1    Feb. 29, 2024

Related U.S. Application Data

(60) Provisional application No. 63/400,239, filed on Aug. 23, 2022.

(51) Int. Cl.
*H02K 5/10* (2006.01)
*A01D 34/00* (2006.01)
(Continued)

(52) U.S. Cl.
CPC ........... *H02K 9/227* (2021.01); *A01D 34/006* (2013.01); *A01D 34/66* (2013.01); *A01D 34/78* (2013.01);
(Continued)

(58) Field of Classification Search
CPC .. A01D 2101/00; A01D 34/006; A01D 34/58; A01D 34/66; A01D 34/78;
(Continued)

(56) References Cited

U.S. PATENT DOCUMENTS 3,267,594 A    8/1966    Mattson et al.
3,592,566 A    7/1971    Beardslee
(Continued)

FOREIGN PATENT DOCUMENTS

AU    2004205280 A1    9/2004
CA    3107893 A1    2/2020
(Continued)

OTHER PUBLICATIONS

Extended European Search Report mailed May 8, 2024 in corresponding EP application No. 23192744.3, 12 pages.
(Continued)

*Primary Examiner* — Naishadh N Desai
(74) *Attorney, Agent, or Firm* — Brake Hughes Bellermann LLP

(57) ABSTRACT

An electric motor is provided including a stator, a rotor, a motor spindle coupled to the rotor and extending along a center axis, a first end cap formed on a first side of the stator, a second end cap formed on a second side of the stator and secured to the first end cap to form a first compartment around the stator and the rotor, an electro-magnetic brake module disposed on a side of the second end cap opposite the stator and engaged with the motor spindle, and a motor cover mounted on the second end cap to form a second compartment around the electro-magnetic brake module. The first end cap, the second end cap, and the motor cover form a substantially watertight seal around the stator, the rotor, and the position sensor assembly.

20 Claims, 49 Drawing Sheets

(51) Int. Cl.

| | |
|---|---|
| *A01D 34/66* | (2006.01) |
| *A01D 34/78* | (2006.01) |
| *B60K 1/02* | (2006.01) |
| *B60K 1/04* | (2019.01) |
| *B60L 1/00* | (2006.01) |
| *B60L 15/00* | (2006.01) |
| *B60L 50/60* | (2019.01) |
| *H02J 7/14* | (2006.01) |
| *H02K 1/2786* | (2022.01) |
| *H02K 1/32* | (2006.01) |
| *H02K 5/15* | (2006.01) |
| *H02K 5/22* | (2006.01) |
| *H02K 7/00* | (2006.01) |
| *H02K 7/102* | (2006.01) |
| *H02K 9/22* | (2006.01) |
| *H02K 11/21* | (2016.01) |
| *H02K 11/215* | (2016.01) |
| *H02K 11/25* | (2016.01) |
| *H02K 11/30* | (2016.01) |
| *H02K 21/22* | (2006.01) |
| *H05K 7/14* | (2006.01) |
| *H05K 7/20* | (2006.01) |
| *A01D 34/58* | (2006.01) |
| *A01D 101/00* | (2006.01) |
| *H02P 27/06* | (2006.01) |

(52) U.S. Cl.
CPC .................. *B60K 1/02* (2013.01); *B60K 1/04* (2013.01); *B60L 1/003* (2013.01); *B60L 15/007* (2013.01); *B60L 50/60* (2019.02); *H02J 7/1423* (2013.01); *H02K 1/2786* (2013.01); *H02K 1/32* (2013.01); *H02K 5/10* (2013.01); *H02K 5/15* (2013.01); *H02K 5/225* (2013.01); *H02K 7/006* (2013.01); *H02K 7/1021* (2013.01); *H02K 11/21* (2016.01); *H02K 11/215* (2016.01); *H02K 11/25* (2016.01); *H02K 11/30* (2016.01); *H02K 21/22* (2013.01); *H05K 7/1427* (2013.01); *H05K 7/209* (2013.01); *A01D 34/58* (2013.01); *A01D 2101/00* (2013.01); *B60K 2001/0438* (2013.01); *B60Y 2200/223* (2013.01); *H02K 2211/03* (2013.01); *H02P 27/06* (2013.01)

(58) Field of Classification Search
CPC . A01D 69/02; B60K 1/02; B60K 1/04; B60K 2001/0438; B60K 7/0007; B60L 1/003; B60L 15/007; B60L 50/60; B60Y 2200/223; H02J 7/1423; H02K 1/2786; H02K 1/2791; H02K 1/32; H02K 11/21; H02K 11/215; H02K 11/25; H02K 11/30; H02K 21/22; H02K 2211/03; H02K 29/08; H02K 5/10; H02K 5/15; H02K 5/225; H02K 7/006; H02K 7/1021; H02K 7/1023; H02K 9/08; H02K 9/223; H02K 9/227; H02P 27/06; H02P 3/04; H05K 7/1427; H05K 7/209
See application file for complete search history.

(56) References Cited

U.S. PATENT DOCUMENTS

| | | | |
|---|---|---|---|
| 3,657,625 | A | 4/1972 | Miller et al. |
| 3,732,671 | A | 5/1973 | Allen et al. |
| 4,451,750 | A | 5/1984 | Heuer et al. |
| 4,668,898 | A | 5/1987 | Harms et al. |
| 4,890,049 | A | 12/1989 | Auinger |
| 5,089,733 | A | 2/1992 | Fukuoka |
| 5,095,612 | A | 3/1992 | McAvena |
| 5,172,310 | A | 12/1992 | Deam et al. |
| 5,229,674 | A | 7/1993 | Best |
| 5,394,043 | A | 2/1995 | Hsia |
| 5,406,778 | A | 4/1995 | Lamb et al. |
| 5,497,040 | A | 3/1996 | Sato |
| 5,540,037 | A | 7/1996 | Lamb et al. |
| 5,698,915 | A | 12/1997 | Fukuyama et al. |
| 5,717,584 | A | 2/1998 | Rajashekara et al. |
| 5,892,339 | A | 4/1999 | Park et al. |
| 5,915,643 | A | 6/1999 | Dolgas |
| 5,917,295 | A | 6/1999 | Mongeau |
| 6,005,320 | A | 12/1999 | Kim et al. |
| 6,023,113 | A | 2/2000 | Otsuka |
| 6,037,688 | A | 3/2000 | Gilliland et al. |
| 6,081,056 | A | 6/2000 | Takagi et al. |
| 6,169,383 | B1 | 1/2001 | Johnson |
| 6,183,208 | B1 | 2/2001 | Qandil et al. |
| 6,236,583 | B1 | 5/2001 | Kikuchi et al. |
| 6,555,943 | B2 | 4/2003 | Walther et al. |
| 6,591,593 | B1 | 7/2003 | Brandon et al. |
| 6,643,157 | B2 | 11/2003 | Furukawa et al. |
| 6,664,678 | B2 | 12/2003 | Shimizu |
| 6,700,253 | B1 | 3/2004 | Ohnuma et al. |
| 6,707,224 | B1 | 3/2004 | Petersen |
| 6,750,633 | B2 | 6/2004 | Schreiber |
| 6,768,243 | B1 | 7/2004 | Yamazaki et al. |
| 6,798,094 | B2 | 9/2004 | Hirsou et al. |
| 6,857,253 | B2 | 2/2005 | Reimers et al. |
| 6,891,456 | B2 | 5/2005 | Byram |
| 6,949,849 | B1 | 9/2005 | Wright et al. |
| 7,012,392 | B2 | 3/2006 | Nguyen et al. |
| 7,034,417 | B1 | 4/2006 | Liu |
| 7,042,124 | B2 | 5/2006 | Puterbaugh et al. |
| 7,064,462 | B2 | 6/2006 | Hempe et al. |
| 7,064,464 | B2 | 6/2006 | Ickinger |
| 7,076,830 | B2 | 7/2006 | Conner et al. |
| 7,109,615 | B2 | 9/2006 | Doemen et al. |
| 7,342,333 | B2 | 3/2008 | Umezu |
| 7,350,283 | B2 | 4/2008 | Won et al. |
| 7,426,877 | B2 | 9/2008 | Ehrlich et al. |
| 7,547,966 | B2 | 6/2009 | Funakoshi et al. |
| 7,557,478 | B2 | 7/2009 | Hoshika |
| 7,588,444 | B2 | 9/2009 | Kataoka et al. |
| 7,602,137 | B2 | 10/2009 | Du et al. |
| 7,633,758 | B2 | 12/2009 | Oohama |
| 7,652,358 | B2 | 1/2010 | Minakawa et al. |
| 7,661,461 | B2 | 2/2010 | Chen |
| 7,736,062 | B2 | 6/2010 | Hagshenas et al. |
| 7,746,372 | B2 | 6/2010 | Yoo |
| 7,786,635 | B2 | 8/2010 | Gasser et al. |
| 7,812,488 | B2 | 10/2010 | Cosco et al. |
| 7,872,383 | B2 | 1/2011 | Dubuc et al. |
| 7,884,520 | B2 | 2/2011 | Ishida et al. |
| 7,893,579 | B2 | 2/2011 | Rudel et al. |
| 7,915,772 | B2 | 3/2011 | Wong |
| 7,944,074 | B2 | 5/2011 | Longtin et al. |
| 7,978,471 | B2 | 7/2011 | Tokuyama et al. |
| 8,115,433 | B2 | 2/2012 | Welchko |
| 8,193,748 | B2 | 6/2012 | Deller et al. |
| 8,227,948 | B1 | 7/2012 | Fox et al. |
| 8,275,502 | B2 | 9/2012 | Sean |
| 8,283,831 | B1 | 10/2012 | Kaminsky et al. |
| 8,283,841 | B2 | 10/2012 | Lin et al. |
| 8,323,005 | B2 | 12/2012 | Yamada et al. |
| 8,354,766 | B2 | 1/2013 | Maekawa |
| 8,384,256 | B2 | 2/2013 | De Filippis |
| 8,416,574 | B2 | 4/2013 | Tokuyama et al. |
| 8,424,625 | B2 | 4/2013 | Ishii |
| 8,427,086 | B2 | 4/2013 | Vilar |
| 8,471,419 | B2 | 6/2013 | Shimomura et al. |
| 8,546,986 | B2 | 10/2013 | Marchitto et al. |
| 8,550,323 | B2 | 10/2013 | Fujimoto |
| 8,552,675 | B2 | 10/2013 | Asahi et al. |
| 8,610,383 | B2 | 12/2013 | De Sousa et al. |
| 8,615,976 | B1 | 12/2013 | Hauser et al. |
| 8,630,781 | B2 | 1/2014 | Sean |

(56) References Cited

U.S. PATENT DOCUMENTS

| | | |
|---|---|---|
| 8,643,231 B2 | 2/2014 | Flanary |
| 8,659,130 B2 | 2/2014 | Takagi et al. |
| 8,659,251 B2 | 2/2014 | Amagasa |
| 8,675,364 B2 | 3/2014 | Tokuyama et al. |
| 8,688,302 B2 | 4/2014 | Sujan et al. |
| 8,755,188 B2 | 6/2014 | Stella |
| 8,786,151 B1 | 7/2014 | Cole et al. |
| 8,829,826 B2 | 9/2014 | Rozman et al. |
| 8,866,353 B2 | 10/2014 | Miyama et al. |
| 8,917,509 B2 | 12/2014 | Tokuyama et al. |
| 8,919,424 B2 | 12/2014 | Yoshida et al. |
| 9,042,101 B2 | 5/2015 | Tokuyama et al. |
| 9,093,882 B2 | 7/2015 | Mayer et al. |
| 9,132,792 B2 | 9/2015 | Lyons |
| 9,137,932 B2 | 9/2015 | Tokuyama et al. |
| 9,143,021 B2 | 9/2015 | Haruno et al. |
| 9,210,839 B2 | 12/2015 | Schygge et al. |
| 9,226,444 B2 | 1/2016 | Schygge et al. |
| 9,288,942 B2 | 3/2016 | Moriguchi et al. |
| 9,362,261 B2 | 6/2016 | Tokuyama et al. |
| 9,375,531 B1 | 6/2016 | Lee et al. |
| 9,393,483 B2 | 7/2016 | Tan et al. |
| 9,474,191 B2 | 10/2016 | Higuma et al. |
| 9,479,090 B2 | 10/2016 | Ogawa |
| 9,543,811 B2 | 1/2017 | Jiang et al. |
| 9,577,497 B2 | 2/2017 | Taniguchi |
| 9,583,990 B2 | 2/2017 | Tokunaga et al. |
| 9,583,994 B2 | 2/2017 | Jang |
| 9,627,944 B2 | 4/2017 | Nakano et al. |
| 9,648,791 B2 | 5/2017 | Tokuyama et al. |
| 9,685,840 B2 | 6/2017 | Germann et al. |
| 9,699,965 B2 | 7/2017 | Schygge et al. |
| 9,711,767 B2 | 7/2017 | Juenger et al. |
| 9,725,011 B2 | 8/2017 | Kim et al. |
| 9,731,410 B2 | 8/2017 | Hirabayashi et al. |
| 9,748,877 B2 | 8/2017 | Ogawa |
| 9,764,734 B1 | 9/2017 | Brown |
| 9,774,282 B2 | 9/2017 | Bian |
| 9,780,618 B1 | 10/2017 | Hanks et al. |
| 9,793,839 B2 | 10/2017 | Chen |
| 9,800,116 B2 | 10/2017 | Iwai et al. |
| 9,812,931 B2 | 11/2017 | Lankin et al. |
| 9,819,240 B2 | 11/2017 | Hashimoto et al. |
| 9,872,438 B2 | 1/2018 | Eavenson, Sr. et al. |
| 9,885,370 B2 | 2/2018 | Fang et al. |
| 9,912,248 B2 | 3/2018 | Shimazu et al. |
| 9,912,279 B2 | 3/2018 | Chai |
| 9,917,486 B2 | 3/2018 | Kirkley, Jr. et al. |
| 9,929,620 B2 | 3/2018 | Nakamura et al. |
| 9,948,156 B2 | 4/2018 | Anderson et al. |
| 9,973,134 B1 | 5/2018 | Namuduri et al. |
| 10,014,746 B2 | 7/2018 | Kanda et al. |
| 10,075,037 B2 | 9/2018 | Ichikawa et al. |
| 10,104,834 B2 | 10/2018 | Yuki et al. |
| 10,111,378 B2 | 10/2018 | Yamagishi et al. |
| 10,116,244 B2 | 10/2018 | Kumazawa et al. |
| 10,135,321 B2 | 11/2018 | Herrmann et al. |
| 10,171,005 B2 | 1/2019 | Sakakibara |
| 10,243,432 B2 | 3/2019 | Hieda et al. |
| 10,263,481 B2 | 4/2019 | Roberts |
| 10,292,326 B2 | 5/2019 | Tanabe et al. |
| 10,524,398 B2 | 12/2019 | Tokuyama et al. |
| 10,693,344 B2 | 6/2020 | Purohit et al. |
| 10,842,078 B1 | 11/2020 | Goings |
| 10,848,034 B2 | 11/2020 | Purohit et al. |
| 10,862,376 B2 | 12/2020 | Kouda et al. |
| 10,862,408 B2 | 12/2020 | Polcuch |
| 10,966,355 B2 | 3/2021 | Tokuyama et al. |
| 10,980,173 B2 | 4/2021 | Becke et al. |
| 11,021,071 B2 | 6/2021 | Ito et al. |
| 11,032,973 B2 | 6/2021 | Conrad et al. |
| 11,147,209 B1 | 10/2021 | George |
| 11,171,586 B2 | 11/2021 | Waikar et al. |
| 11,211,814 B2 | 12/2021 | Schultz |
| 11,370,100 B2 | 6/2022 | Palich et al. |
| 11,787,551 B1 | 10/2023 | Graves et al. |
| 12,295,120 B2 | 5/2025 | Mahoney |
| 2002/0101122 A1 | 8/2002 | Haines et al. |
| 2003/0127921 A1 | 7/2003 | Akutsu et al. |
| 2004/0027014 A1 | 2/2004 | Weigold et al. |
| 2005/0044838 A1 | 3/2005 | Rinholm et al. |
| 2006/0046895 A1 | 3/2006 | Thacher et al. |
| 2006/0076842 A1 | 4/2006 | Park |
| 2006/0119204 A1 | 6/2006 | Awazu et al. |
| 2006/0201124 A1 | 9/2006 | Hall et al. |
| 2007/0035192 A1 | 2/2007 | Jeon et al. |
| 2008/0042503 A1 | 2/2008 | Hartkorn et al. |
| 2008/0136273 A1 | 6/2008 | Hill et al. |
| 2009/0192661 A1 | 7/2009 | Oconnor et al. |
| 2009/0201650 A1 | 8/2009 | Hauser et al. |
| 2010/0038985 A1 | 2/2010 | Shim et al. |
| 2011/0130238 A1* | 6/2011 | Schoon ................ B60K 17/046 |
| | | 475/149 |
| 2011/0260660 A1 | 10/2011 | Lubawy |
| 2012/0031215 A1 | 2/2012 | Feier |
| 2012/0262021 A1 | 10/2012 | Lafontaine et al. |
| 2013/0009494 A1 | 1/2013 | Oguma |
| 2013/0066500 A1 | 3/2013 | Wyatt et al. |
| 2013/0076176 A1 | 3/2013 | Edrington et al. |
| 2013/0099609 A1 | 4/2013 | Ikeno et al. |
| 2013/0146374 A1 | 6/2013 | Books et al. |
| 2013/0242631 A1 | 9/2013 | Inayoshi et al. |
| 2013/0264980 A1 | 10/2013 | Nilsson et al. |
| 2014/0001987 A1 | 1/2014 | Okada |
| 2014/0021832 A1* | 1/2014 | Palfenier ................ H02K 7/116 |
| | | 310/68 B |
| 2014/0062352 A1 | 3/2014 | Wang et al. |
| 2014/0165524 A1 | 6/2014 | Schygge et al. |
| 2014/0175915 A1 | 6/2014 | Park |
| 2014/0225482 A1 | 8/2014 | Hara et al. |
| 2015/0171632 A1 | 6/2015 | Fry et al. |
| 2015/0219724 A1 | 8/2015 | Gibbs |
| 2015/0340923 A1 | 11/2015 | Lee et al. |
| 2016/0020676 A1 | 1/2016 | Omura et al. |
| 2016/0079822 A1 | 3/2016 | Noguchi |
| 2016/0183451 A1 | 6/2016 | Conrad et al. |
| 2016/0268876 A1 | 9/2016 | Goto |
| 2016/0301276 A1 | 10/2016 | Saki et al. |
| 2016/0352190 A1 | 12/2016 | Hieda et al. |
| 2017/0033720 A1 | 2/2017 | Zeyn et al. |
| 2017/0106522 A1 | 4/2017 | Coates et al. |
| 2017/0110925 A1 | 4/2017 | Fu et al. |
| 2017/0110935 A1 | 4/2017 | Oktavec et al. |
| 2017/0194847 A1 | 7/2017 | Nuzzo et al. |
| 2017/0201150 A1 | 7/2017 | Haga et al. |
| 2017/0238773 A1 | 8/2017 | Chaffin |
| 2017/0310193 A1 | 10/2017 | Ryu |
| 2017/0310249 A1 | 10/2017 | Zheng et al. |
| 2018/0013334 A1 | 1/2018 | Ishikura et al. |
| 2018/0031628 A1 | 2/2018 | Ahrens et al. |
| 2018/0109164 A1 | 4/2018 | Holman |
| 2018/0123416 A1 | 5/2018 | Yamasaki et al. |
| 2018/0198351 A1 | 7/2018 | Akutsu et al. |
| 2018/0241268 A1 | 8/2018 | Asahi et al. |
| 2018/0278113 A1 | 9/2018 | Asahi et al. |
| 2018/0316238 A1 | 11/2018 | Kong |
| 2019/0387670 A1 | 12/2019 | Matsuda et al. |
| 2020/0282839 A1 | 9/2020 | Saiki |
| 2020/0315095 A1 | 10/2020 | Liu et al. |
| 2020/0343780 A1 | 10/2020 | Fogle et al. |
| 2020/0343789 A1 | 10/2020 | Fogle et al. |
| 2021/0091639 A1 | 3/2021 | Purohit et al. |
| 2021/0105939 A1 | 4/2021 | Zeiler et al. |
| 2021/0143650 A1 | 5/2021 | Wang et al. |
| 2021/0152105 A1 | 5/2021 | Froelich |
| 2021/0155099 A1 | 5/2021 | Wei et al. |
| 2021/0169001 A1 | 6/2021 | Xiao |
| 2021/0170852 A1 | 6/2021 | Fan et al. |
| 2021/0296202 A1 | 9/2021 | Bender et al. |
| 2021/0354541 A1 | 11/2021 | Zeiler et al. |
| 2022/0039313 A1 | 2/2022 | Morrison et al. |
| 2022/0077711 A1 | 3/2022 | Schultz |
| 2022/0080834 A1 | 3/2022 | Edlabadkar et al. |
| 2022/0111737 A1 | 4/2022 | Yang et al. |

(56)  References Cited

U.S. PATENT DOCUMENTS

| | | | |
|---|---|---|---|
| 2022/0124972 A1 | 4/2022 | Dai et al. |
| 2022/0200401 A1 | 6/2022 | Gohn et al. |
| 2022/0247275 A1 | 8/2022 | Eguchi et al. |
| 2023/0179070 A1 | 6/2023 | Morimoto |
| 2024/0030096 A1 | 1/2024 | Zhu |
| 2024/0072614 A1 | 2/2024 | Kawano |

FOREIGN PATENT DOCUMENTS

| | | |
|---|---|---|
| CA | 3204067 A1 | 7/2022 |
| CN | 2640110 Y | 9/2004 |
| CN | 204906092 U | 12/2015 |
| CN | 208028797 U | 10/2018 |
| CN | 210669696 U | 6/2020 |
| CN | 112018984 A | 12/2020 |
| CN | 112838656 A | 5/2021 |
| CN | 113162289 A | 7/2021 |
| CN | 113965020 A | 1/2022 |
| CN | 215379928 U | 1/2022 |
| CN | 215379941 U | 1/2022 |
| CN | 114467238 A | 5/2022 |
| DE | 3329720 A1 | 2/1984 |
| DE | 4127706 C2 | 11/1993 |
| DE | 10221617 A1 | 12/2002 |
| DE | 102005008751 A1 | 8/2006 |
| DE | 102006035839 A1 | 3/2007 |
| DE | 10228988 B4 | 1/2008 |
| DE | 102008019569 A1 | 11/2008 |
| DE | 102008044168 A1 | 6/2009 |
| DE | 102008000145 A1 | 7/2009 |
| DE | 102010014650 A1 | 10/2011 |
| DE | 102010063973 A1 | 6/2012 |
| DE | 112011104517 T5 | 10/2013 |
| DE | 102013011483 A1 | 1/2014 |
| DE | 102013014609 A1 | 3/2014 |
| DE | 102013106675 A1 | 12/2014 |
| DE | 102013222534 A1 | 5/2015 |
| DE | 102010016105 B4 | 10/2015 |
| DE | 102015106077 A1 | 10/2015 |
| DE | 10355076 B4 | 3/2016 |
| DE | 102016004062 A1 | 10/2017 |
| DE | 102016208888 A1 | 11/2017 |
| DE | 102016215762 A1 | 3/2018 |
| DE | 102017217710 A1 | 6/2018 |
| DE | 112017001144 T5 | 11/2018 |
| DE | 112017001146 T5 | 11/2018 |
| DE | 112017001149 T5 | 11/2018 |
| DE | 102018112912 A1 | 12/2019 |
| DE | 102019131670 A1 | 6/2020 |
| EP | 0270935 A2 | 6/1988 |
| EP | 1542340 A2 | 6/2005 |
| EP | 1758228 A1 | 2/2007 |
| EP | 1768234 A1 | 3/2007 |
| EP | 1774639 A1 | 4/2007 |
| EP | 1985487 A2 | 10/2008 |
| EP | 2023466 B1 | 1/2011 |
| EP | 2329983 B1 | 11/2011 |
| EP | 2509188 A2 | 10/2012 |
| EP | 2647523 A1 | 10/2013 |
| EP | 2648329 A1 | 10/2013 |
| EP | 2978115 A1 | 1/2016 |
| EP | 3086461 A1 | 10/2016 |
| EP | 3125431 A1 | 2/2017 |
| EP | 1717932 B1 | 4/2017 |
| EP | 2422422 B1 | 12/2017 |
| EP | 3299506 A1 | 3/2018 |
| EP | 2695289 B1 | 5/2018 |
| EP | 2814161 B1 | 8/2018 |
| EP | 3389168 A1 | 10/2018 |
| EP | 1986234 B1 | 2/2019 |
| EP | 3188357 B1 | 4/2019 |
| EP | 3116020 B1 | 1/2020 |
| EP | 3648255 A1 | 5/2020 |
| EP | 3068018 B1 | 12/2020 |
| EP | 3574572 B1 | 3/2021 |
| EP | 3789231 A1 | 3/2021 |
| EP | 3217535 B1 | 4/2021 |
| EP | 2490320 B1 | 6/2021 |
| EP | 3837957 A1 | 6/2021 |
| EP | 3526887 B1 | 7/2021 |
| EP | 3588525 B1 | 2/2022 |
| EP | 3945661 A1 | 2/2022 |
| FR | 3091066 B3 | 1/2021 |
| JP | S6324966 U | 2/1988 |
| JP | H06351262 A | 12/1994 |
| JP | 2004040944 A | 2/2004 |
| JP | 2007252097 A | 9/2007 |
| JP | 2008175090 A | 7/2008 |
| JP | 2008265685 A | 11/2008 |
| JP | 2010213385 A | 9/2010 |
| JP | 2012170336 A | 9/2012 |
| JP | 6123722 B2 | 5/2017 |
| JP | 6334966 B2 | 5/2018 |
| JP | 6601839 B2 | 11/2019 |
| KR | 200157525 Y1 | 9/1999 |
| KR | 20130016703 A | 2/2013 |
| RU | 2251199 C1 | 4/2005 |
| RU | 99668 U1 | 11/2010 |
| RU | 2444834 C1 | 3/2012 |
| WO | 2001043260 A1 | 6/2001 |
| WO | 2010079301 A1 | 7/2010 |
| WO | 2013030108 A2 | 3/2013 |
| WO | 2018061818 A1 | 4/2018 |
| WO | 2018099667 A2 | 6/2018 |
| WO | 2018123849 A1 | 7/2018 |
| WO | 2018135248 A1 | 7/2018 |
| WO | 2018172018 A1 | 9/2018 |
| WO | 2018180361 A1 | 10/2018 |
| WO | 2019033714 A1 | 2/2019 |
| WO | 2019044105 A1 | 3/2019 |
| WO | 2019044112 A1 | 3/2019 |
| WO | 2019116551 A1 | 6/2019 |
| WO | 2019116714 A1 | 6/2019 |
| WO | 2019143032 A1 | 7/2019 |
| WO | 2019229791 A1 | 12/2019 |
| WO | 2020066960 A1 | 4/2020 |
| WO | 2020075859 A1 | 4/2020 |
| WO | 2020108250 A1 | 6/2020 |
| WO | 2020129127 A1 | 6/2020 |
| WO | 2020195344 A1 | 10/2020 |
| WO | 2020203526 A1 | 10/2020 |
| WO | 2020211410 A1 | 10/2020 |
| WO | 2021004484 A1 | 1/2021 |
| WO | 2021019608 A1 | 2/2021 |
| WO | 2021071655 A1 | 4/2021 |
| WO | 2021104549 A1 | 6/2021 |
| WO | 2021104551 A1 | 6/2021 |
| WO | 2021200591 A1 | 10/2021 |
| WO | 2022262762 A1 | 12/2022 |

OTHER PUBLICATIONS

Extended European Search Report mailed May 2, 2024 in corresponding EP application No. 23192743.5, 9 pages.
Extended European Search Report mailed May 14, 2024 in corresponding EP application No. 23192789.8, 10 pages.
Extended European Search Report mailed May 15, 2024 in corresponding EP application No. 23192748.4, 11 pages.
Extended European Search Report mailed May 21, 2024 in corresponding EP application No. 23192745.0, 9 pages.
Extended European Search Report mailed May 24, 2024 in corresponding EP application No. 23192786.4, 10 pages.
Extended European Search Report mailed Jun. 6, 2024 in corresponding EP application No. 23192746.8, 18 pages.
Extended European Search Report dated Jan. 22, 2024 in corresponding EP application No. 23192747.6, 12 pages.
Partial European Search Report dated Feb. 15, 2024 in corresponding EP application No. 23192744.3, 14 pages.
Uematsu, et al., "Design of a 100KW Switch Reluctance Motor for Electric Vehicle Propulsion", Proceedings of 1995 IEEE Applied Power Electronics Conference and Exposition—APEC'95, 2002.
Ozer, et al., "Design and Analysis of a High Power Density

(56) References Cited

OTHER PUBLICATIONS

Burshless DC Motor for a Multi-Rotor Unmanned Aircraft", 2021
13th International Conference on Electrical and Electronics Engi-
neering (ELECO), Jan. 21, 2022, pp. 378-382.

* cited by examiner

334

330

214

212

336

340

334      336

330

332

338

210

216

340

342

340

200

ELECTRIC DRIVE MOTOR FOR MOVING APPARATUS

RELATED APPLICATION

This utility patent application claims the benefit of U.S. Provisional Application No. 63/400,239 filed Aug. 23, 2022, which is incorporated herein by reference in its entirety.

FIELD

This application relates to an electric lawn apparatus, and in particular to various motor and control features of a battery-operated electric lawn apparatus.

BACKGROUND

Manufacturers of power equipment for outdoor maintenance applications offer many types of machines for general maintenance and mowing applications. Generally, these machines can have a variety of forms depending on application, from general urban or suburban lawn maintenance, rural farm and field maintenance, to specialty applications. Even specialty applications can vary significantly. For example, mowing machines suitable for sporting events requiring moderately precise turf, such as soccer fields or baseball outfields may not be suitable for events requiring very high-precision surfaces such as golf course greens, tennis courts and the like.

Modern maintenance machines also offer multiple options for power source. The various advantages associated with electric motor engines, gasoline engines, natural gas engines, diesel engines and so forth also impact the mechanical design and engineering that go into these different maintenance devices. Meeting the various challenges associated with different maintenance and mowing applications and the benefits and limitations of different power sources results in a large variety of maintenance machines to meet consumer preferences.

Electric mowing machines have gained popularity in recent years. In these machines, a combination of one or more electric mowing or drive motors may be utilized. The challenge presented in such machines is providing a robust and effective mechanism to accurately control the operation of each motor, to securely mount and operate each motor, and to design each motor in a compact and robust manner that maximizes runtime and cutting area. Various embodiments of the invention described herein aim to overcome these challenges.

SUMMARY

According to an embodiment of the invention, an electric lawn apparatus is provided comprising: a frame including an upper body, two side plates extending downwardly from sides of the upper body, and a lower support body extending forward at a lower position than the upper body; an operator seat mounted on the upper body; two drive motors secured to the side plates for driving two rear tires located adjacent the side plates; a mow deck secured below the lower support body of the frame, the mow deck supporting a plurality of deck motors each driving at least one mow blade; at least one battery supported by the frame and configured to supply electric power to the two drive motors and the plurality of deck motors; and a footrest platform secured to the lower support body of the frame forward of the operator seat positioned for placement of the operator's feet when the operator is in a seated position. In an embodiment, a motor control panel is secured to the lower support body of the frame between the mow deck and the footrest platform, wherein the motor control panel comprises a plate that supports a plurality of control modules configured to control a supply of electric power from the battery packs to the drive motors and the plurality of deck motors.

In an embodiment, the plate extends substantially parallel to the footrest platform, and the control modules are mounted on an upper surface of the plate facing the footrest platform.

In an embodiment, at least one of the plurality of control modules comprises a mounting frame made of thermally-conductive material fastened to the plate, a circuit board mounted within the mounting frame, a plurality of power switches configured as an inverter circuit, and a controller configured to control a switching operation of the plurality of power switches to regulate a supply of power to the respective drive motor or deck motor.

In an embodiment, in the at least one control module, the plurality of power switches comprises a first array of power switches mounted on a top surface of the circuit board and a second array of power switches mounted on a bottom surface of the circuit board.

In an embodiment, the plurality of power switches includes three pairs of high-side power switches and three pairs of low-side power switches, wherein each pair includes two power switches connected in parallel and driven via a common drive signal.

In an embodiment, the lower support body comprises two link rods extending forward from the upper body and supporting two front caster wheels, and wherein the plate of the motor control panel is secured between the two link rods.

In an embodiment, the plurality of deck motors includes at least three deck motors, and wherein two of plurality of deck motors are located outside an envelope defined by the lower support body of the frame and one of the plurality of deck motors is located below the plate of the motor control panel.

In an embodiment, the motor control panel further comprises at least one at least one regenerative energy control module configured to monitor a voltage from the at least one battery, the electric lawn apparatus further comprising at least one regenerative energy absorbing module that is activated by the at least one regenerative energy control module when the voltage from the battery exceeds a voltage threshold.

In an embodiment, there is further provided two operator side pods on two sides of the operator seat, wherein the at least one regenerative energy absorbing module is housed within one of the operator side pods.

In an embodiment, there is further provided a bus line configured to deliver electric power from the battery to the plurality of control modules, wherein the at least one at least one regenerative energy control module comprises a controller and at least one power switch, and wherein the controller is configured to switchably activate the at least one regenerative energy absorbing module across the bus line via the at least one power switch when the voltage on the bus line exceeds the voltage threshold.

According to another embodiment of the invention, an electric lawn apparatus is provided comprising: a frame including an upper body, two side plates extending downwardly from sides of the upper body, and a lower support body extending forward at a lower position than the upper body; an operator seat mounted on the upper body; two drive motors secured to the side plates for driving two rear tires located adjacent the side plates; a mow deck secured below the lower support body of the frame, the mow deck supporting a plurality of deck motors each driving at least one mow blade; at least one battery supported by the frame and configured to supply electric power to the two drive motors and the plurality of deck motors; a motor control panel secured to the lower support body of the frame above the mow deck along a first plane, wherein the motor control panel comprises a plurality of control modules configured to control a supply of electric power from the battery packs to the drive motors and the plurality of deck motors; and a footrest platform mounted above the motor control panel along a second plane substantially parallel to the first plane, the footrest platform being positioned for placement of the operator's feet when the operator is in a seated position. In an embodiment, the electric lawn apparatus may include any of the features described in the preceding paragraphs.

In an embodiment, the motor control panel comprises a plate, wherein the plurality of control modules is mounted on an upper surface of the plate facing the footrest platform.

In an embodiment, the at least one battery comprises a plurality of battery packs received into a battery compartment at least partially between the two rear tires, wherein the first plane intersects the plurality of battery packs.

According to another embodiment of the invention, an electric lawn apparatus is provided comprising: a frame including an upper body and two side plates extending downwardly from sides of the upper body defining a cavity therein, and a lower support body extending forward long a lower plane than the upper body; an operator seat mounted on the upper body; a battery compartment formed within the cavity configured to receive a plurality of battery packs therein, wherein the plurality of battery packs is receivable into the battery compartment along a rear-front axis of the electric lawn apparatus in a side-by-side orientation, wherein each battery pack has a maximum rated voltage of approximately 40V to 80V; two drive motors secured to the side plates away from the cavity; a mow deck secured below the lower support body of the frame, the mow deck supporting a plurality of deck motors each driving at least one mow blade; and a footrest platform secured to the lower support body of the frame forward of the operator seat positioned for placement of the operator's feet when the operator is in a seated position. In an embodiment, a ratio of the cumulative energy output of the plurality of battery packs to a lateral distance between the drive motors is greater than or equal to approximately 0.23 kW/cm.

In an embodiment, a horizontal plane formed by a lower surface of the plurality of battery packs intersects the two drive motors.

In an embodiment, the horizontal plane formed by the lower surface of the plurality of battery packs further intersects the plurality of deck motors.

In an embodiment, a vertical plane formed by a rear surface of the plurality of battery packs intersects the two drive motors.

In an embodiment, the battery compartment occupies a lateral width of approximately 45 to 55 cm and a total volume of approximately 92,500 cm^3 to 107,500 cm^3 between the two side plates.

In an embodiment, each battery pack has a capacity of greater than or equal to approximately 60 ampere-hours and an impedance of smaller than or equal to 30 mOhms.

In an embodiment, the battery packs are capable of powering the drive motors to produce a maximum power output of greater than equal to approximately 6,200 watts from each of the drive motors while simultaneously powering the plurality of deck motors to output a continuous torque output of at least 6 Newton-meters from each deck motor.

In an embodiment, there is further provided a mounting bracket mounted on each side plate of the frame to hold a respective one of the drive motors relative to the side plate.

In an embodiment, the mounting bracket includes a body having a substantially cylindrical profile and an annular rim formed proximate a front end of the body, wherein the drive motor is mounted at least partially within the body, and a transmission assembly is mounted outside the body in engagement with the annular rim and driveably coupled to the deck motor.

In an embodiment, each of the drive motors is a brushless direct-current (BLDC) motor including a stator disposed within an outer rotor, a first end cap, a second end cap configured to secure the stator and coupled to the first end cap to form a first containment around the stator and the outer rotor, and a motor cover coupled to the second end cap to form a second containment around at least one of electronic components or current-carrying components of the motor, wherein the first end cap, the second end cap, and the cover cooperate to form a substantially watertight seal around the first containment and the second containment.

In an embodiment, there is further provided at least one regenerative energy control module configured to monitor a voltage from the battery packs; at least one regenerative energy absorbing module that is activated by the at least one regenerative energy control module when the voltage from the plurality of battery packs exceeds a voltage threshold; and two operator side pods provided on two sides of the operator seat, wherein the at least one regenerative energy absorbing module is housed within one of the operator side pods.

According to another embodiment of the invention, an electric lawn apparatus comprising: a frame including an upper body and two side plates extending downwardly from sides of the upper body defining a cavity therein, and a lower support body extending forward long a lower plane than the upper body; an operator seat mounted on the upper body; a battery compartment formed within the cavity configured to receive a plurality of battery packs therein, wherein the plurality of battery packs is receivable into the battery compartment along a rear-front axis of the electric lawn apparatus in a side-by-side orientation, wherein each battery pack has a maximum rated voltage of approximately 40V to 80V; two drive motors secured to the side plates away from the cavity; a mow deck secured below the lower support body of the frame, the mow deck supporting a plurality of deck motors each driving at least one mow blade; and a footrest platform secured to the lower support body of the frame forward of the operator seat positioned for placement of the operator's feet when the operator is in a seated position. In an embodiment, a horizontal plane formed by a lower surface of the plurality of battery packs intersects the two drive motors and is above a plane of an upper surface of the mow deck. In an embodiment, the electric lawn apparatus may include any of the features described in the preceding paragraphs.

According to another embodiment of the invention, an electric lawn apparatus is provided comprising: a frame including an upper body, two side plates extending downwardly from sides of the upper body, and a lower support body extending forward at a lower position than the upper body; an operator seat mounted on the upper body; two drive motors secured to the side plates for driving two rear tires located adjacent the side plates; a mow deck secured below the lower support body of the frame, the mow deck supporting a plurality of deck motors each driving at least one mow blade; at least one battery supported by the frame and configured to supply electric power to the two drive motors and the plurality of deck motors; a motor control panel comprising at least one control module configured to control a supply of electric power to the drive motors and the plurality of deck motors, and at least one regenerative energy control module configured to monitor a voltage from the at least one battery; and at least one regenerative energy absorbing module that is activated by the at least one regenerative energy control module when the voltage from the at least one battery exceeds a voltage threshold. In an embodiment, the regenerative energy absorbing module is physically decoupled from the motor control panel but electrically connected to the at least one regenerative energy control module.

In an embodiment, two operator side pods are provided on two sides of the operator seat, wherein the at least one regenerative energy absorbing module is housed within one of the operator side pods.

In an embodiment, the regenerative energy absorbing module comprises a resistor network and a metal housing arranged to house the resistor network and to dissipate heat away from the resistive network, and there is further provided a mounting bracket arranged to support the at least one regenerative energy absorbing module.

In an embodiment, two fenders are mounted on the two side plates above the two rear tires, wherein the mounting bracket comprises a leg securely fastened to a top surface of the one of the fenders, and a planar plate extending angularly from the leg.

In an embodiment, the regenerative energy absorbing module comprises two regenerative energy absorbing modules mounted on opposite surfaces of the mounting bracket, each including a metal housing having a plurality of outer fins.

In an embodiment, the mounting bracket is mounted on one of the side plates to support the at least one regenerative energy absorbing module at a location above one of the rear tires.

In an embodiment, the mounting bracket comprises a leg securely fastened to the one of the side plates, and a V-shaped frame extending from the leg.

In an embodiment, the regenerative energy absorbing module comprises two regenerative energy absorbing modules mounted on opposite surfaces of the V-shaped frame, each including a metal housing having a plurality of outer fins.

In an embodiment, a footrest platform is secured to the lower support body of the frame forward of the operator seat positioned for placement of the operator's feet when the operator is in a seated position, wherein the motor control panel comprises a plate positioned below the footrest platform configured to support the at least one control module and at least one regenerative energy control module.

In an embodiment, the at least one at least one regenerative energy control module comprises a controller and at least one power switch, and wherein the controller is configured to switchably activate the at least one regenerative energy absorbing module across the bus line via the at least one power switch when the voltage on the bus line exceeds the voltage threshold.

In an embodiment, a flyback diode is provided in parallel with the at least one regenerative energy absorbing module to provide a return path for inductive energy of the at least one regenerative energy absorbing module when the controller switchably deactivates the at least one regenerative energy absorbing module.

According to another embodiment of the invention, an electric lawn apparatus is provided comprising: a frame including an upper body, two side plates extending downwardly from sides of the upper body, and a lower support body extending forward at a lower position than the upper body; an operator seat mounted on the upper body; two drive motors secured to the side plates for driving two rear tires located adjacent the side plates; a mow deck secured below the lower support body of the frame, the mow deck supporting a plurality of deck motors each driving at least one mow blade; and at least one battery supported by the frame and configured to supply electric power to the two drive motors and the plurality of deck motors; a motor control panel comprising at least one control module configured to control a supply of electric power to the drive motors and the plurality of deck motors. There is further provided at least one regenerative energy control module configured to monitor a voltage from the at least one battery, wherein the motor control panel is mounted to the lower support body of the frame. Further, there is provided at least one regenerative energy absorbing module that is activated by the at least one regenerative energy control module when the voltage from the at least one battery exceeds a voltage threshold, wherein the at least one regenerative energy absorbing module is mounted on the frame at a location other than the lower support body. In an embodiment, the electric lawn apparatus may include any of the features described in the preceding paragraphs.

According to another embodiment of the invention, an electric motor is provided comprising: a stator having a stator core, a plurality of stator teeth extending radially from the stator core, and a plurality of windings wound around the plurality of stator teeth; a rotor rotatably positioned relative to the stator and having a rotor core and a plurality of permanent magnets secured to the rotor core in magnetic interface with the plurality of stator windings; a motor spindle coupled to the rotor and extending along a center axis; a first end cap formed on a first side of the stator; a second end cap formed on a second side of the stator and secured to the first end cap to form a first compartment around the stator and the rotor; a position sensor assembly mounted on the second end cap outside the first compartment and arranged to sense a magnetic orientation of the motor spindle; and a motor cover mounted on the second end cap to form a second compartment around the position sensor assembly, In an embodiment, the first end cap, the second end cap, and the motor cover form a substantially watertight seal around the stator, the rotor, and the position sensor assembly.

In an embodiment, at least the second end cap comprises thermally-conductive material, and there is provided a plurality of gap pads mounted on an axial end of the plurality of windings in contact with the second end cap, the plurality of gap pads being made of thermally-conductive but electrically-insulating material to transfer heat from the plurality of windings to the second end cap.

In an embodiment, the second end cap includes an outer annular body having a stepped portion forming a recessed annular wall in an upper portion thereof, and the motor cover includes an annular wall extending fittingly around the recessed annular wall of the second end cap.

In an embodiment, the recessed annular wall of the second end cap includes an annular groove therein, and an elastically-deformable ring member is located partially within the annular groove in engagement with the annular wall of the motor cover to provide a seal between the second end cap and the motor cover.

In an embodiment, an elastically-deformable ring member is located against the stepped-portion of the second end cap and a frontal end of the annular wall of the motor cover to provide a seal between the second end cap and the motor cover.

In an embodiment, a strain relief is provided to capture a wire cord at at least an exit point of the wire cord from the second compartment, wherein the motor cover cooperates with the second end cap to form a grommet around the strain relief, the grommet and the strain relief providing a seal for at the exit point of the wire cord from the second compartment.

In an embodiment, a rear end of the motor spindle is received through a center opening of the second end cap into the second compartment, and the position sensor assembly comprises a circuit board having a generally U-shaped profile sized to be located around the rear end of the motor spindle.

In an embodiment, the second end cap includes an inner annular body that forms the center opening therein, a rear bearing is mounted on the motor spindle with its outer race securely coupled with the inner annular body, and a sense magnet is mounted on the motor spindle within the inner annular body in magnetic interface with the position sensor assembly.

In an embodiment, a lateral width of an inner opening of the circuit board is greater than a diameter of the rear end of the motor spindle, but smaller than a diameter of the inner annular body of the second end cap to facilitate the position sensor assembly being mounted on the surface of the second end cap.

In an embodiment, the second end cap includes an outer annular surface extending from the motor cover to the first end cap, a flange projecting outwardly from the outer annular body to create a mating surface with the first end cap, and a plurality of fins that extend longitudinally along the outer annular surface and include sloped outer edges proximate the flange.

In an embodiment, the rotor core comprises an outer annular body surrounding the stator configured to support the plurality of permanent magnets, a radial wall extending from the outer annular body and coupled to the motor spindle, a plurality of peripheral openings formed in the radial wall, and a plurality of ribs formed between the plurality of peripheral openings and configured to generate an airflow circulated through the electric motor.

According to another embodiment of the invention, an electric motor is provided comprising: a stator having a stator core, a plurality of stator teeth extending radially from the stator core, and a plurality of windings wound around the plurality of stator teeth; a rotor rotatably positioned relative to the stator and having a rotor core and a plurality of permanent magnets secured to the rotor core in magnetic interface with the plurality of stator windings; a motor spindle coupled to the rotor and extending along a center axis; a first end cap formed on a first side of the stator; a second end cap formed on a second side of the stator and secured to the first end cap to form a first compartment around the stator and the rotor; a plurality of stator terminals electrically coupled to the plurality of windings and projecting axially from the stator through at least one slot of formed in the second end cap such that a distal end of the plurality of stator terminals projects from a surface of the second end cap facing away from the stator; a plurality of power wires coupled to the distal end of the plurality of stator terminals to supply electric power to the plurality of stator windings via the plurality of stator terminals; and a motor cover mounted on the second end cap to form a second compartment around the distal end of the plurality of stator terminals and at least a portion of the plurality of power wires. In an embodiment, the first end cap, the second end cap, and the motor cover form a substantially watertight seal around the stator, the rotor, and the position sensor assembly. In an embodiment, the electric motor may include any of the features described in the preceding paragraphs.

In an embodiment, a strain relief is provided to capture the plurality of power wires at at least an exit point of the plurality of power wires from the second compartment, wherein the motor cover cooperates with the second end cap to form a grommet around the strain relief, the grommet and the strain relief providing a seal at the exit point of the plurality of power wires from the second compartment.

In an embodiment, a position sensor assembly is mounted on a surface of the second end cap outside the first compartment and arranged to sense a magnetic orientation of the motor spindle, wherein a rear end of the motor spindle is received through a center opening of the second end cap into the second compartment, and wherein the position sensor assembly comprises a circuit board having a generally U-shaped profile sized to be located around the rear end of the motor spindle.

In an embodiment, the stator terminals are positioned equidistantly around the motor spindle peripherally surrounding the circuit board.

In an embodiment, the plurality of power wires and a plurality of control wires are receives through a grommet into the second compartment, wherein the plurality of single wires is electrically coupled to the position sensor assembly, and the plurality of power sires is routed around the position sensor assembly and coupled to the plurality of stator terminals.

According to another embodiment of the invention, an electric power apparatus is provided comprising: a main planar body having a circular opening; at least one brushless direct-current (BLDC) motor mounted on the main planar body. In an embodiment, the motor comprises: a stator having a stator core, a plurality of stator teeth extending radially from the stator core, and a plurality of windings wound around the plurality of stator teeth; a rotor rotatably positioned relative to the stator and having a rotor core and a plurality of permanent magnets secured to the rotor core in magnetic interface with the plurality of stator windings; a motor spindle coupled to the rotor and extending along a center axis through the circular opening of the main planar body; a first end cap formed on a first side of the stator and mounted on the main planar body, wherein a front surface of the first end cap facing away from the stator comprises a projected inner circular surface sized to be fittingly received into the circular opening of the main planar body, and an annular outer recessed surface arranged to be mounted on the main planar body around the circular opening; and a second end cap formed on a second side of the stator and secured to the first end cap to form a compartment around the stator and the rotor.

In an embodiment, the second end cap includes an outer annular surface extending along an outer circumferential surface of the stator, and a flange projecting outwardly from the outer annular body to create a mating surface with the first end cap.

In an embodiment, the motor further comprises a plurality of first fasteners extending upwardly through a plurality of first through-holes of the first end cap and securely fastened into a plurality of threaded openings of the second end cap formed within the flange.

In an embodiment, a plurality of second fasteners is received downwardly through a plurality of through-holes of the first end cap formed through the flange, passed through a plurality of second through-holes of the first end cap and a plurality of corresponding through-holes of the main planar body distributed around the circular opening, and fastened to a plurality of nuts below the main planar body to securely fasten the motor to the main planar body, wherein the plurality of first through-holes and the plurality of second through-holes of the first end cap are alternatingly arranged.

In an embodiment, the first end cap includes an annular peripheral projection within which the plurality of first through-holes is formed, and the second end cap includes an annular projection sized to be fittingly received within the annular peripheral projection of the first end cap, and wherein the motor further comprises an elastically-deformable ring member located between the annular peripheral projection of the first end cap and the annular projection of the second end cap proximate the plurality of first fasteners to provide a substantially watertight seal between the first end cap and the second end cap.

In an embodiment, the motor further comprises a plurality of fins that extend longitudinally along the outer annular surface and include sloped outer edges proximate the flange.

In an embodiment, the first end cap includes a center opening through which the motor spindle passes and a center bearing pocket coaxial with the center opening sized to securely receive a front bearing mounted on the motor spindle, wherein the projected inner circular surface of the first end cap is located at a lower plane than a lower surface of the main planar body to allow a plane of an upper surface of the main planar body to intersect the front bearing.

In an embodiment, the main planar body is a part of a mow deck and the motor spindle is coupled to a torque limiter member mounted below the main planar body configured to rotatably drive a mow blade, wherein the torque limiter member is configured to provide torque protection for the motor during impact of the mow blade with hard objects.

In an embodiment, the circular opening of the main planar body includes a larger diameter than an outer diameter of the torque limiter member. In an embodiment, a plurality of fasteners is received downwardly through a plurality of through-holes formed through the projected inner circular surface of the first end cap, extending through the circular opening of the main planar body, and securely coupled to the torque limiter member.

In an embodiment, a thermally-conductive gap pad is disposed between the annular outer recessed surface and the main planar body to transfer heat from the motor to the main planar body.

In an embodiment, a ratio of a maximum power output of the motor when powered by at least one battery pack to a height of the motor as measured from an upper surface of the main planar body to a top surface of the motor is greater than or equal to approximately 34 watts/mm.

According to another embodiment of the invention, an electric power apparatus is provided comprising: a main planar body having a circular opening; at least one brushless direct-current (BLDC) motor mounted on the main planar body. In an embodiment, the motor comprises: a stator having a stator core, a plurality of stator teeth extending radially from the stator core, and a plurality of windings wound around the plurality of stator teeth; a rotor rotatably positioned relative to the stator and having a rotor core and a plurality of permanent magnets secured to the rotor core in magnetic interface with the plurality of stator windings; a motor spindle coupled to the rotor and extending along a center axis through the circular opening of the main planar body; a first end cap formed on a first side of the stator and mounted on the main planar body; and a second end cap formed on a second side of the stator and secured to the first end cap to form a substantially watertight seal around the stator and the rotor. In an embodiment, a ratio of a maximum power output of the motor when powered by at least one battery pack to a height of the motor as measured from an upper surface of the main planar body to a top surface of the motor is greater than or equal to approximately 34 watts/mm. In an embodiment, the motor may include any of the features described in the preceding paragraphs.

In an embodiment, the second end cap comprises a radial main body including a center opening through which the motor spindle extends and is arranged to support a position sensor assembly on a surface thereof that faces away from the stator, and a motor cover mounted on the radial main body to substantially seal the second end cap.

In an embodiment, a front surface of the first end cap facing away from the stator comprises a projected inner circular surface sized to be fittingly received into the circular opening of the main planar body, and an annular outer recessed surface arranged to be mounted on the main planar body around the circular opening.

In an embodiment, the second end cap includes an outer annular surface extending along an outer circumferential surface of the stator, and a flange projecting outwardly from the outer annular body to create a mating surface with the first end cap.

In an embodiment, the motor further comprises a plurality of first fasteners extending upwardly through a plurality of first through-holes of the first end cap and securely fastened into a plurality of threaded openings of the second end cap formed within the flange.

According to another embodiment of the invention, an electric motor is provided comprising: a motor spindle extending along a center axis; a stator having a stator core having a center opening through which the motor spindle rotatably extends, a plurality of stator teeth extending radially outwardly from the stator core, and a plurality of windings wound around the plurality of stator teeth; a rotor including a plurality of permanent magnets in magnetic interface with the plurality of stator windings and a rotor core, the rotor core comprising an outer annular body surrounding the stator and supporting the plurality of permanent magnets, a radial wall extending from the outer annular body and coupled to the motor spindle, and a plurality of openings formed in the radial wall; a first end cap formed on a first side of the stator and mounted on the main planar body; and a second end cap formed on a second side of the stator and secured to the first end cap to form a substantially airtight sealed compartment around the stator and the rotor with no air inlets or outlets to allow passage of air therethrough between the sealed compartment and an outside environment. In an embodiment, the first and second end caps are substantially made of metal and a rotation of the rotor causes an airflow to be generated by the plurality of openings of the rotor and circulated through the sealed compartment to transfer heat from the stator to the first end cap and the second end cap.

In an embodiment, the plurality of openings is formed peripherally and abutting the outer annular body.

In an embodiment, the rotor core further comprises a plurality of ribs projecting from the radial wall in the direction of the stator between the plurality of peripheral openings, the plurality of ribs being configured to cooperate with the plurality of openings to generate the airflow.

In an embodiment, the second end cap comprises a radial main body including a center opening through which the motor spindle extends and is arranged to support at least one electrical component on a side thereof opposite the stator, and a motor cover mounted on the radial main body to substantially seal the second end cap.

In an embodiment, the electric component comprises a position sensor assembly arranged to sense a magnetic orientation of the motor spindle.

In an embodiment, a plurality of stator terminals is provided and electrically coupled to the plurality of windings and projecting axially from the stator through at least one slot of formed in the second end cap such that a distal end of the plurality of stator terminals projects from a surface of the second end cap facing away from the stator, wherein the at least one electric component comprises a plurality of power wires coupled to the distal end of the plurality of stator terminals to supply electric power to the plurality of stator windings via the plurality of stator terminals.

In an embodiment, the rotor comprises an overmold structure arranged to secure the plurality of permanent magnets to the outer annular body of the rotor core.

In an embodiment, gap pads are mounted on an axial end of the plurality of windings in contact with the second end cap, where the gap pads are made of thermally-conductive but electrically-insulating material to transfer heat from the plurality of windings to the second end cap.

In an embodiment, the first end cap includes an annular peripheral projection forming a first mating surface; the second end cap includes an outer annular surface extending around the rotor to the first end cap, a flange projecting outwardly from the outer annular body forming a second mating surface mounted on the first mating surface, and an annular projection sized to be fittingly received within the annular peripheral projection of the first end cap; and the motor further comprises an elastically-deformable ring member located between the annular peripheral projection of the first end cap and the annular projection of the second end cap to provide a substantially airtight seal between the first end cap and the second end cap.

In an embodiment, the first end cap includes a cylindrical body that surrounds the rotor; the second end cap includes an annular projection arranged to be fittingly received within an end of the cylindrical body along approximately a radial plane that intersects an axial end of the plurality of stator windings; and the motor further comprises an elastically-deformable ring member located between the of the cylindrical body of the first end cap and the annular projection of the second end cap to provide a substantially airtight seal between the first end cap and the second end cap.

According to another embodiment of the invention, an electric motor is provided comprising: a stator having a stator core, a plurality of stator teeth extending radially from the stator core, and a plurality of windings wound around the plurality of stator teeth; a rotor rotatably positioned relative to the stator and having a rotor core and a plurality of permanent magnets secured to the rotor core in magnetic interface with the plurality of stator windings; a motor spindle coupled to the rotor and extending along a center axis; a first end cap formed on a first side of the stator; a second end cap formed on a second side of the stator and secured to the first end cap to form a compartment around the stator and the rotor, wherein the second end cap comprises thermally-conductive material; and a plurality of gap pads mounted on an axial end of the plurality of windings in contact with the second end cap, the plurality of gap pads being made of thermally-conductive but electrically-insulating material to provide a direct thermal pathway from the plurality of windings to the second end cap.

In an embodiment, the second end cap comprises a main radial body including: an inner portion forming a center opening that securely receives a bearing mounted on the motor spindle along a first plane, and an outer portion extending at close proximity to the axial end of the plurality of windings along a second plane that is closer to the stator core than the first plane, wherein the plurality of gap pads is disposed in contact with the axial end of the plurality of windings and the outer portion of the main radial body.

In an embodiment, the rotor core comprises an outer annular body surrounding the stator configured to support the plurality of permanent magnets, and a radial wall extending from the outer annular body between the stator and the first end cap and coupled to the motor spindle.

In an embodiment, the rotor core further includes a plurality of peripheral openings formed in the radial wall, and a plurality of ribs formed between the plurality of peripheral openings and configured to generate an airflow circulated through the electric motor.

In an embodiment, the first end cap comprises thermally-conductive material and includes an annular peripheral projection forming a first mating surface; and the second end cap includes an outer annular surface extending around the rotor to the first end cap, and a flange projecting outwardly from the outer annular body forming a second mating surface mounted on the first mating surface.

In an embodiment, the first end cap comprises thermally-conductive material and includes a cylindrical body that surrounds the rotor; and the second end cap includes an annular projection arranged to be fittingly received within an end of the cylindrical body along approximately a radial plane that intersects the axial end of the plurality of stator windings.

According to an embodiment of the invention, an electric motor is provided comprising: a stator having a stator core, a plurality of stator teeth extending radially from the stator core, and a plurality of windings wound around the plurality of stator teeth; a rotor rotatably positioned relative to the stator and having a rotor core and a plurality of permanent magnets secured to the rotor core in magnetic interface with the plurality of stator windings; a motor spindle coupled to the rotor and extending along a center axis; a first end cap formed on a first side of the stator; a second end cap formed on a second side of the stator and secured to the first end cap to form a first compartment around the stator and the rotor; an electro-magnetic brake module disposed on a side of the second end cap opposite the stator and engaged with the motor spindle, electro-magnetic brake module being configured to selectively apply a braking force to the motor spindle; and a motor cover mounted on the second end cap to form a second compartment around the electro-magnetic brake module. In an embodiment, the first end cap, the second end cap, and the motor cover form a substantially watertight seal around the stator, the rotor, and the electro-magnetic brake module.

In an embodiment, the second end cap comprises a rear wall having an annular or semi-annular profile formed on a surface thereof facing away from the stator and around the center axis, wherein the electro-magnetic brake module is mounted on the rear wall.

In an embodiment, a position sensor assembly is mounted within the rear wall and arranged to sense a magnetic orientation of the motor spindle.

In an embodiment, a plurality of stator terminals is electrically coupled to the plurality of windings and projecting axially from the stator through at least one slot of formed in the second end cap such that a distal end of the plurality of stator terminals is located within the rear wall; and a wire cord including a plurality of power wires is coupled to the distal end of the plurality of stator terminals to supply electric power to the plurality of stator windings via the plurality of stator terminals and at least one additional wire coupled to the electro-magnetic brake module.

In an embodiment, the electro-magnetic brake module is configured to apply the braking force to the output spindle when it does not receive a supply of electric power.

In an embodiment, the electro-magnetic brake module receives a pinion mounted on the output spindle, and comprises a friction disc mounted onto the pinion and a plate that selectively disengages the friction disk when the electro-magnetic brake module receives the supply of electric power.

In an embodiment, the first end cap, the second end cap, and the cover comprise thermally-conductive material, the electric motor further comprising a plurality of gap pads mounted on an axial end of the plurality of windings in contact with the second end cap, the plurality of gap pads being made of thermally-conductive but electrically-insulating material to transfer heat from the plurality of windings to the second end cap.

In an embodiment, a first elastically-deformable ring member is disposed between the first end cap and the second end cap to provide a seal between the first end cap and the second end cap, and a second elastically-deformable ring member is disposed between the second end cap and the motor cover to provide a seal between the second end cap and the motor cover.

In an embodiment, the first end cap includes a first cylindrical body that surrounds the rotor; the second end cap includes a front annular projection arranged to be fittingly received within an end of the first cylindrical body forming a seal therebetween; and the end cap comprises a second cylindrical body having a smaller diameter than the first cylindrical body, a flange projecting outwardly from the second cylindrical body and mounted on the second end cap, and a plurality fins having sloped external edges extending from the second cylindrical body to a peripheral portion of the flange.

In an embodiment, the rotor core comprises an outer annular body surrounding the stator configured to support the plurality of permanent magnets, a radial wall extending from the outer annular body and coupled to the motor spindle, a plurality of peripheral openings formed in the radial wall, and a plurality of ribs formed between the plurality of peripheral openings and configured to generate an airflow circulated through the electric motor.

According to another embodiment of the invention, an electric apparatus is provided comprising: a frame including an upper body and a side plate extending downwardly from a side of the upper body; a drive motor secured to the side plate and having a motor spindle; a transmission assembly mounted on the drive motor and drivably coupled to the motor spindle; an output hub mounted on the transmission assembly for driving a tire located adjacent the side plate; a mounting bracket mounted on the side plate and including a body having a substantially cylindrical profile and an annular rim formed proximate a front end of the body. In an embodiment, the drive motor is mounted at least partially within the body, and the transmission assembly is mounted outside the body and fastened to the annular rim.

In an embodiment, the drive motor is a brushless direct-current (BLDC) motor including a stator, rotor mounted on the motor spindle, a first end cap, a second end cap configured to secure the stator and coupled to the first end cap to form a first containment around the stator and the rotor, and a motor cover coupled to the second end cap to form a second containment around at least one of electronic components or current-carrying components of the motor. In an embodiment, the first end cap, the second end cap, and the cover cooperate to form a substantially watertight seal around the first containment and the second containment.

In an embodiment, the motor cover is located adjacent the side plate of the frame with a space therebetween.

In an embodiment, the first end cap includes a cylindrical body that surrounds the rotor; the second end cap includes an annular projection arranged to be fittingly received within an end of the cylindrical body along approximately a radial plane that intersects an axial end of the plurality of stator windings; and the motor further comprises an elastically-deformable ring member located between the of the cylindrical body of the first end cap and the annular projection of the second end cap to provide a substantially watertight seal between the first end cap and the second end cap.

In an embodiment, the first end cap includes a first radial body and a first substantially cylindrical body extending from the radial portion; and the transmission assembly includes a mounting frame including a second radial body that forms a mounting surface for contact with the first radial body, and a second substantially cylindrical body that extends fittingly around the first substantially cylindrical body.

In an embodiment, the motor further comprises a first plurality of fasteners that fastens the first end cap to the second end cap, and a second plurality of fasteners that fastens the first end cap to the mounting frame of the transmission assembly.

In an embodiment, the motor further comprises an elastically-deformable ring member located between the of the first substantially cylindrical body and the second substantially cylindrical body to provide a substantially watertight seal between the first end cap and the second end cap.

In an embodiment, the first end cap further includes a rear substantially cylindrical body extending from the first substantially cylindrical body to the second end cap, wherein the rear substantially cylindrical body has a larger diameter than the first substantially cylindrical body and is disposed outside the mounting frame of the transmission assembly.

In an embodiment, an electro-magnetic brake module is disposed within the second compartment and configured to selectively apply a braking force to the motor spindle.

In an embodiment, the second end cap comprises a rear wall having an annular or semi-annular profile formed on a surface thereof facing away from the stator and around the center axis, wherein the electro-magnetic brake module is mounted on the rear wall.

According to another embodiment of the invention, a control module is provided comprising: a mounting frame made up of thermally-conductive material and comprising a bottom wall and four side walls projecting from the bottom wall; a circuit board disposed within the side walls of the mounting frame; a plurality of power switches configured as an inverter circuit, the plurality of power switches comprising: a first array of power switches mounted on a first surface of the circuit board, and a second array of power switches mounted on a second surface of the circuit board opposite the first array of power switches; an auxiliary circuit board extending substantially perpendicularly from the first surface of the circuit board; a plurality of capacitors mounted on the auxiliary circuit board with a long axis thereof extending parallel to the circuit board and away from the first array of power switches, with a distal end thereof leading towards a first edge of the circuit board; and a plurality of connectors mounted on the first surface of the circuit board adjacent the first edge of the circuit board and adjacent the distal end of the plurality of capacitors.

In an embodiment, the module further includes a first heat sink disposed above the circuit board and in thermal contact with the first array of power switches; and a second heat sink mounted on the bottom wall of the mounting frame below the circuit board and in thermal contact with the second array of power switches.

In an embodiment, the module further includes a plurality of power output terminals mounted on the first surface of the circuit board adjacent a second edge of the circuit board opposite the first edge and proximate the first array of power switches.

In an embodiment, the plurality of power output terminals includes output posts that extend perpendicularly from the first surface along an axis that is substantially parallel to the first array of power switches.

In an embodiment, the first heat sink includes at least one circumferential rib arranged to penetrate into a space between the respective plurality of power output terminals.

In an embodiment, the at least one circumferential rib comes into contact with one of the sidewalls of the mounting frame.

In an embodiment, the output posts are received through the circuit board and coupled to metal slugs mounted on the second surface of the circuit board.

In an embodiment, the first and second heat sinks are secured to one another via a plurality of fasteners passing through the circuit board.

In an embodiment, the module further includes two power input posts mounted on the top surface of the circuit board adjacent the auxiliary board, wherein the two power input posts receive electric power from a power source and are coupled to the inverter circuit.

In an embodiment, the module further includes a controller mounted on the circuit board and configured to control a switching operation of the inverter circuit.

In an embodiment, the inverter circuit comprises three pairs of high-side Field-Effect Transistors (FETs) and three pairs of low-side FETs, wherein each pair includes two power switches coupled in parallel, and wherein the first array of power switches comprises the three pairs high-side FETs and the second array of power switches comprises the three pairs of low-side FETs.

In an embodiment, the inverter circuit comprises three pairs of high-side Field-Effect Transistors (FETs) and three pairs of low-side FETs, wherein each pair includes two power switches coupled in parallel, and wherein the first array of power switches comprises one high-side FET from each pair of high-side FETs and one low-side FET from each pair of low-side FETs, and the second array of power switches comprises the other high-side FET from each pair of high-side FETs and the other low-side FET from each pair of low-side FETs.

In an embodiment, a height of the plurality of capacitors relative to the circuit board is less than a height of the plurality of connectors.

According to another embodiment of the invention, a control module is provided comprising: a mounting frame made up of thermally-conductive material and comprising a bottom wall and four side walls projecting from the bottom wall; a circuit board disposed within the side walls of the mounting frame; a plurality of power switches configured as an inverter circuit, the plurality of power switches comprising: a first array of power switches mounted on a first surface of the circuit board, and a second array of power switches mounted on a second surface of the circuit board opposite the first array of power switches; a first heat sink disposed above the circuit board and in thermal contact with the first array of power switches; and a second heat sink mounted on the bottom wall of the mounting frame below the circuit board and in thermal contact with the second array of power switches. In an embodiment, the first and second heat sinks are secured to one another via a plurality of fasteners passing through the circuit board.

In an embodiment, the module further includes a plurality of power output posts extending perpendicularly from the first surface of the circuit board proximate the first array of power switches and oriented along an axis that is substantially parallel to the first array of power switches.

In an embodiment, wherein the first heat sink includes at least one circumferential rib arranged to penetrate into a space between the respective plurality of power output terminals.

In an embodiment, the at least one circumferential rib comes into contact with one of the sidewalls of the mounting frame.

In an embodiment, the module further includes an auxiliary circuit board extending substantially perpendicularly from the first surface of the circuit board adjacent the first heat sink; and a plurality of capacitors mounted on the auxiliary circuit board with a long axis thereof extending parallel to the circuit board and away from the first heat sink, with a distal end thereof leading towards a first edge of the circuit board.

In an embodiment, the module further includes a plurality of connectors mounted on the first surface of the circuit board adjacent the first edge of the circuit board and adjacent the distal end of the plurality of capacitors.

In an embodiment, the module further includes two power input posts mounted on the top surface of the circuit board adjacent the auxiliary board, wherein the two power input posts receive electric power from a power source and are coupled to the inverter circuit, wherein the first heat sink includes recessed portions arranged to accommodate the two power input posts.

Embodiments and/or aspects of the invention may include any combination of one of more features described above or discussed in detail in this disclosure.

BRIEF DESCRIPTION OF THE DRAWINGS

The drawings described herein are for illustration purposes only and are not intended to limit the scope of this disclosure in any way.

Corresponding reference numerals indicate corresponding parts throughout the several views of the drawings.

DETAILED DESCRIPTION

Figure 1A:
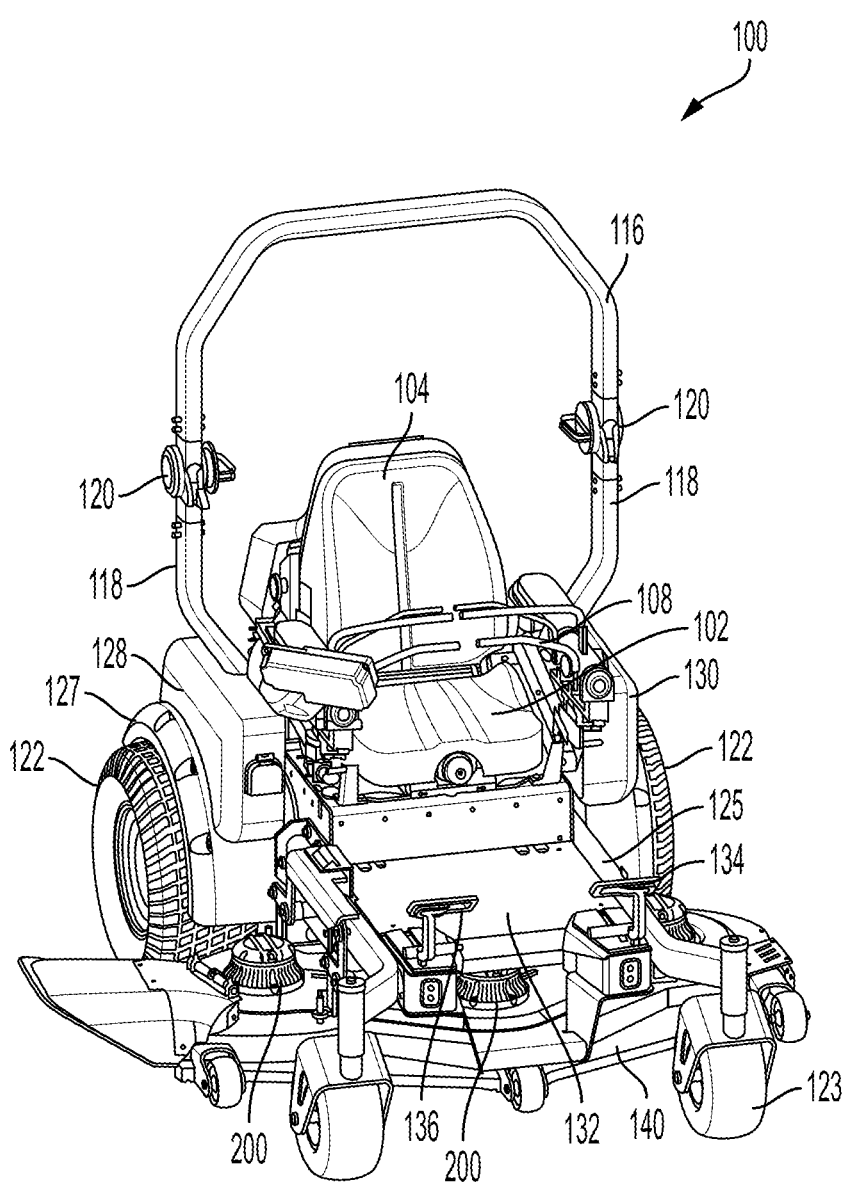
FIGS. 1A and 1B depict exemplary perspective views of an electric lawn apparatus, according to an embodiment.

The following description illustrates the claimed invention by way of example and not by way of limitation. The description clearly enables one skilled in the art to make and use the disclosure, describes several embodiments, adaptations, variations, alternatives, and uses of the disclosure, including what is presently believed to be the best mode of carrying out the claimed invention. Additionally, it is to be understood that the disclosure is not limited in its application to the details of construction and the arrangements of components set forth in the following description or illustrated in the drawings. The disclosure is capable of other embodiments and of being practiced or being carried out in various ways. Also, it is to be understood that the phraseology and terminology used herein is for the purpose of description and should not be regarded as limiting.

The following terms are used throughout the description, the definitions of which are provided herein to assist in understanding various aspects of the subject disclosure.

As used in this application, the terms "outdoor power equipment", "outdoor power equipment machine", "power equipment", "maintenance machine" and "power equipment machine" are used interchangeably and are intended to refer to any of robotic, partially robotic ride-on, walk-behind, sulky equipped, autonomous, semi-autonomous (e.g., user-assisted automation), remote control, or multi-function variants of any of the following: powered carts and wheel barrows, lawn mowers, lawn and garden tractors, lawn trimmers, lawn edgers, lawn and leaf blowers or sweepers, hedge trimmers, pruners, loppers, chainsaws, rakes, pole saws, tillers, cultivators, aerators, log splitters, post hole diggers, trenchers, stump grinders, snow throwers (or any other snow or ice cleaning or clearing implements), lawn, wood and leaf shredders and chippers, lawn and/or leaf vacuums, pressure washers, lawn equipment, garden equipment, driveway sprayers and spreaders, and sports field marking equipment.

In an embodiment, the terms "airtight", "substantially airtight", "air-sealed" and "substantially air-sealed" refer to significant resistance against ingress or passage of air from and to the outside environment. It should be understood, however, that ingress or passage of miniscule and negligible amounts of air leakage through microscopic gaps and cracks is encompassed within the scope of these limitations.

The terms "watertight", "substantially watertight", "water-sealed" and "substantially water-sealed" refer to significant resistance against ingress or passage of water from and to the outside environment. This include protection against ingress of water when subject to powerful water jets testing (IPX6 testing) at a minimum, or temporary immersion in water (IPX7 testing), continuous immersion in water (IPX8 testing), or high-pressure water jets testing (IPX9 rating) in some applications. It should be understood, once again, that ingress or passage of miniscule and negligible amounts of water leakage through microscopic gaps and cracks is encompassed within the scope of these limitations.

Figure 1B:
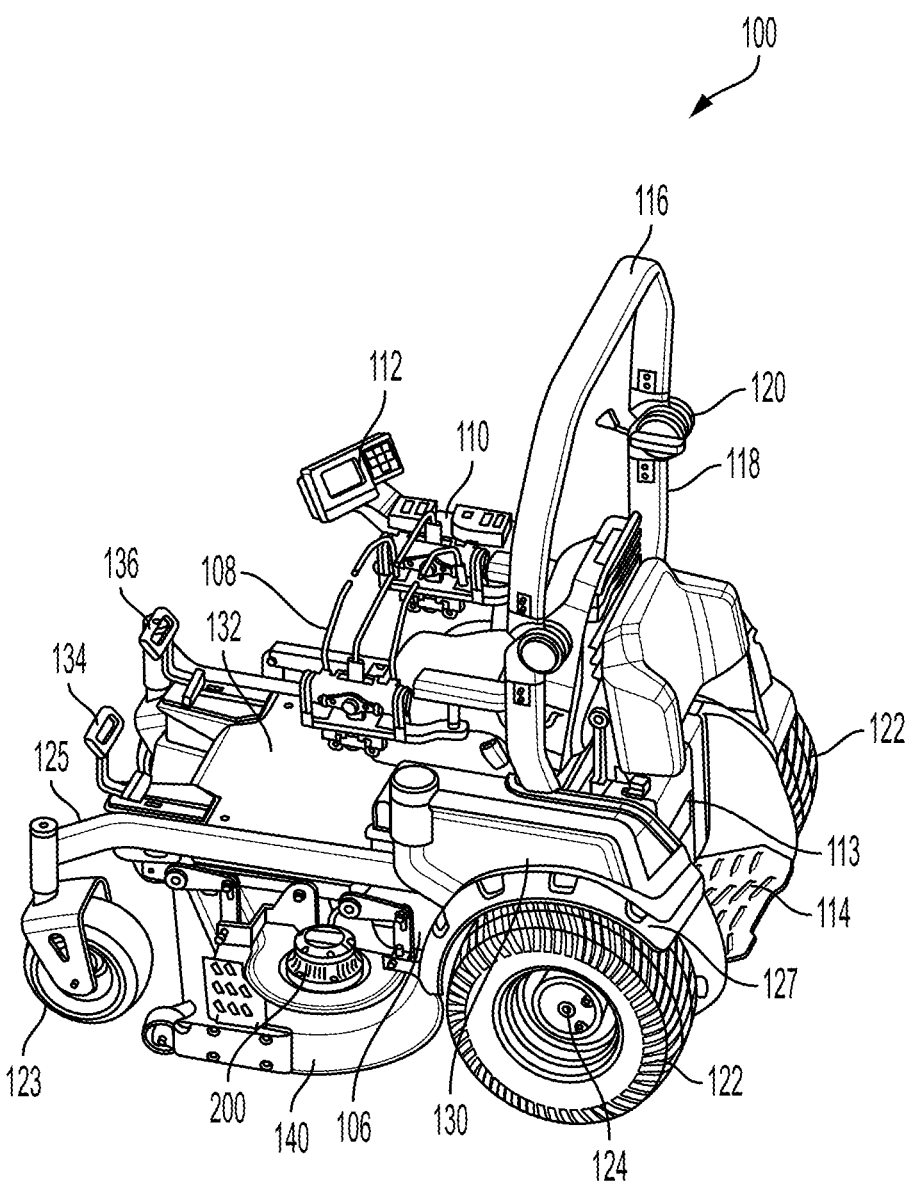
Figure 1C:
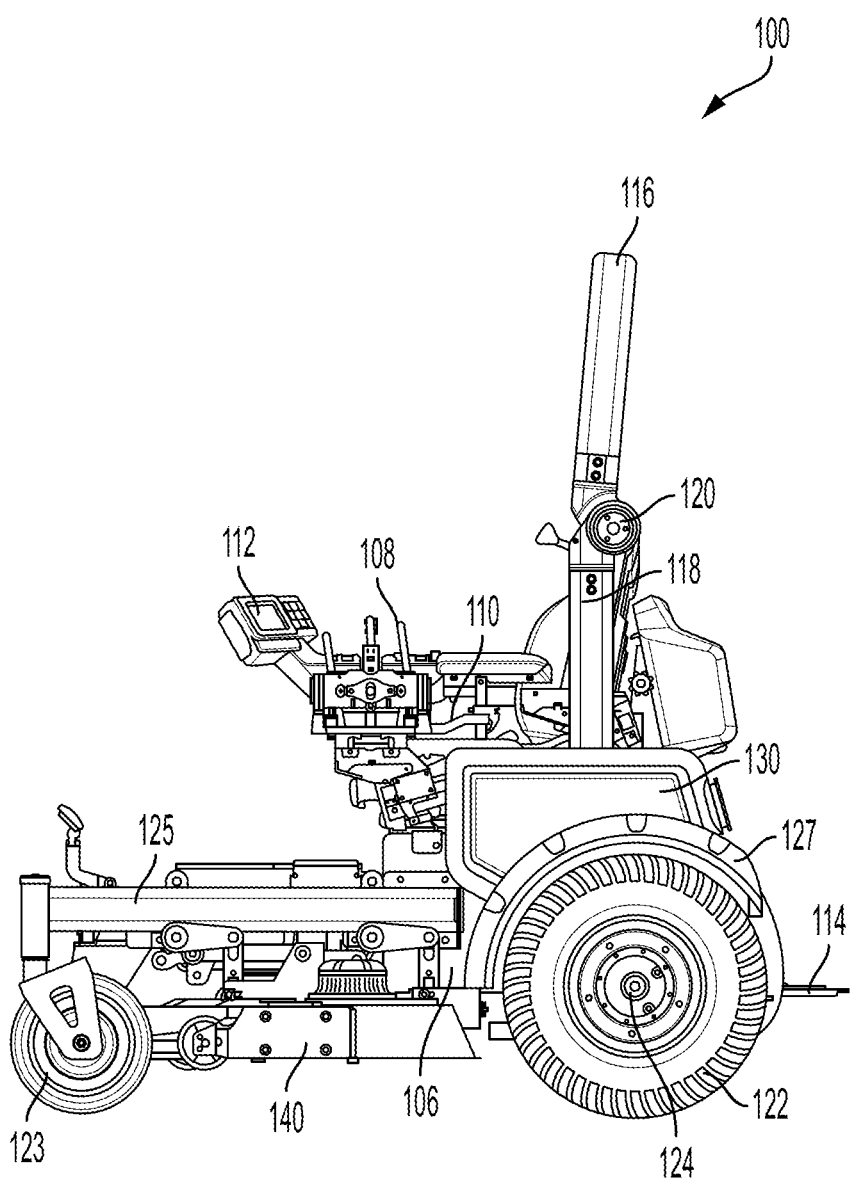
FIGS. 1C through 1E respectively depict side, front, and rear views of the electric lawn apparatus, according to an embodiment.
Figure 1D:
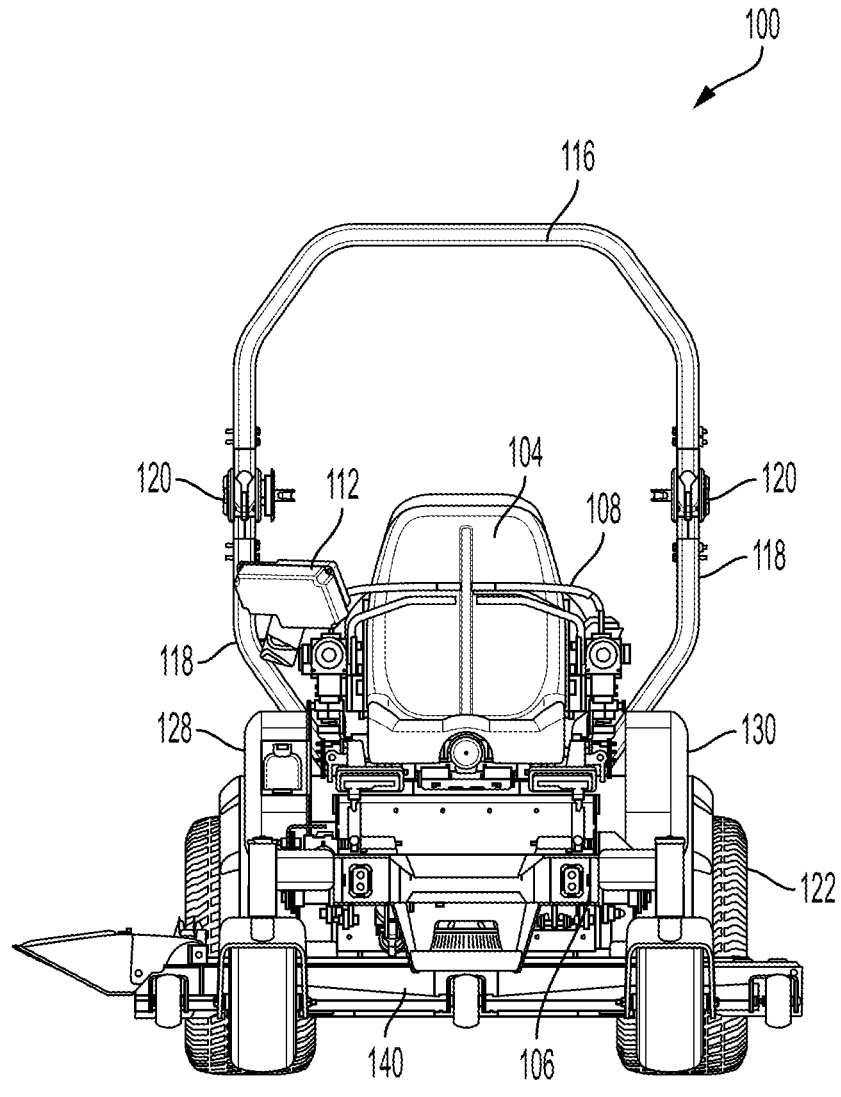
Figure 1E:
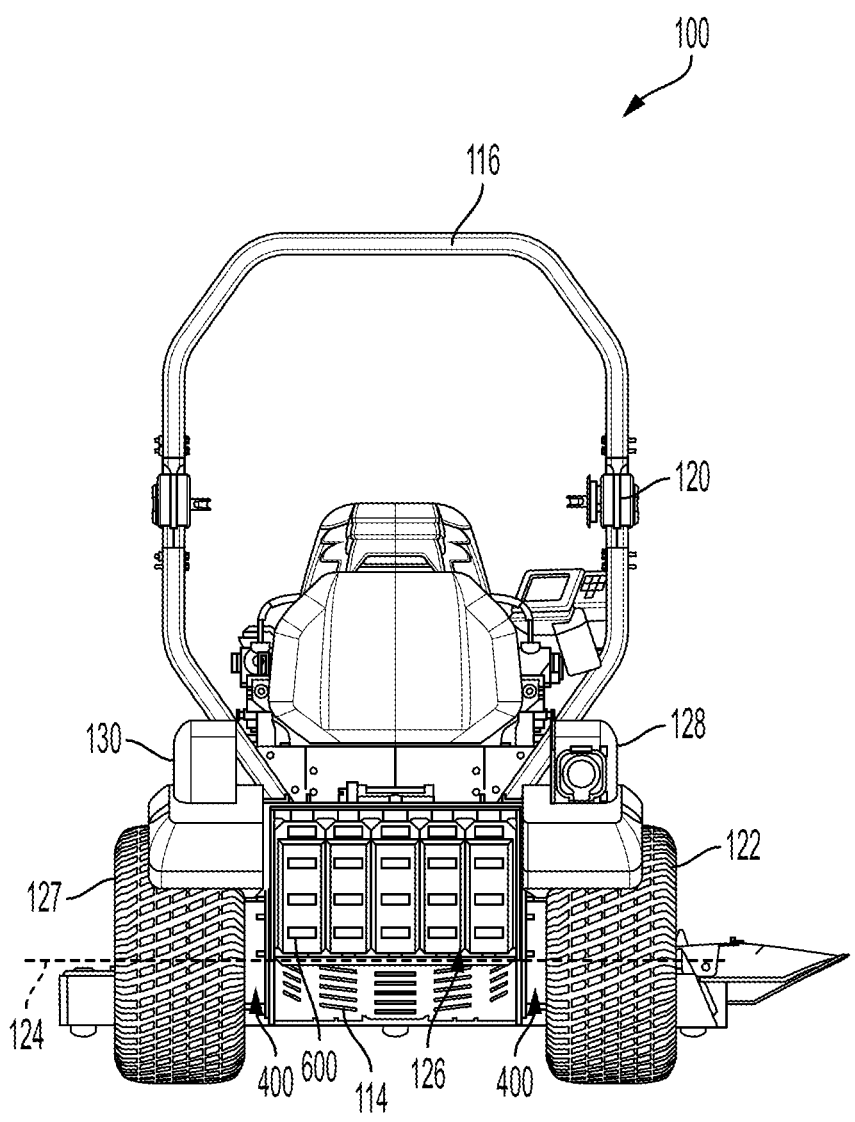

FIGS. 1A and 1B depict exemplary perspective views of an electric lawn apparatus 100, according to an embodiment. FIG. 1C through 1E respectively depict side, frontal, and rear views of the electric lawn apparatus 100 respectively, according to an embodiment. With reference to these figures, the exemplary electric lawn apparatus 100 includes an operator seat 102 having a seat cushion 104 on which an operator can be seated, mounted on a main frame 106. In an embodiment, a set of mower control bars 108 are coupled via a moveable control mount 110 to the main frame 106 and are provided proximate the operator for controlling one or more aspects of the operation of the electric lawn apparatus 100. In an embodiment, a display interface 112 is mounted on the moveable control mount 110 operable to display information related to operation of the apparatus to the operator. In an embodiment, electric lawn apparatus 100 may be configured as a convertible standing/sitting lawn maintenance apparatus switchable between a seated configuration, in which the operator is allowed to sit on the operator seat 102 and the control bars 108 and the display interface 112 are positioned forward of the operator's seated position, and a standing configuration, in which the operator is allowed to stand on a stand platform 114 provided on a rear side of the main frame 106 and the control bars 108 and the display interface 112 are moved forward of the standing position of the operator.

In an embodiment, electric lawn apparatus 100 may include a roll over protection (ROP) bar 116 that mounted to a pair of ROP anchor bars 118 extending from the main frame 106 along the sides of the operator seat 102. In an embodiment, the ROP bar 116 is pivotably mounted to the ROP anchor bars 118 via ROP pivots 120, allowing the ROP bar 116 to pivot from an upward position in the seated configuration of the electric lawn apparatus 100 to a forward position (not shown) in the standing configuration of the electric lawn apparatus 100.

In an embodiment, electric lawn apparatus 100 may include two rear tires 122 driven independently by two electric brushless direct-current (BLDC) drive motors 400 as discussed later in detail, and two front caster wheels 123. In an embodiment, each drive motor 400 may include an outer housing secured directly to a respective side plate 152 of the main frame 106. Alternatively, each drive motor 400 may be secured to the side plate 152 via a mounting bracket 156 as described later. In an embodiment, the two rear tires 122 are coaxially driven around a rear wheel rotation axis 124. In an embodiment, a battery compartment 126 is provided between the two rear tires 122 partially intersecting the rear wheel rotation axis 124. In an embodiment, the front caster wheels 123 are coupled to the main frame 106 via link rods 125.

In an embodiment, electric lawn apparatus 100 may include a footrest platform 132 forward of the operator seat 102 positioned for placement of the operator's feet when the electric lawn apparatus 100 is in the seated configuration. In an embodiment, two foot pedals 134 and 136 (e.g., a speed pedal and a brake pedal) may be mounted forward of the footrest platform 132 between the front caster wheels 123.

In an embodiment, electric lawn apparatus 100 may include a mow deck 140 secured beneath the main frame 106 and the footrest platform 132 between the front and rear wheels 123 and 122. In an embodiment, mow deck 140 supports a series of (e.g., three) electric brushless direct-current (BLDC) deck motors 200 for driving a series of mower blades. In an embodiment, a motor control panel 500 is mounted below the footrest platform 132 to control the operation of the drive and deck motors.

In an embodiment, electric lawn apparatus 100 may include a right operator side pod 128 and a left operator side pod 130 provided on either side of the operator seat 102 above the rear tires 122. In an embodiment, right and left operator side pods 128 and 130 integrally form two fenders 127 above the rear tires 122. In an embodiment, as described later in detail, the right operator side pod 128 houses a series of vehicle controllers, power distribution modules, and charging ports for charging the battery packs. In an embodiment, the left operator side pod 130 houses one or more regenerative energy absorbing components such as resistors, as described later in detail.

For various details of the electric lawn apparatus 100, reference is made to US Patent Publication No. 2022/0379781, filed on Mar. 14, 2022, content of which is incorporated herein by reference in its entirety.

In an embodiment, the battery compartment 126 receives a series of battery packs 600 configured to supply electric power for operating the electric lawn apparatus 100 including the drive motors. In an embodiment, each battery pack 600 includes a housing that houses a plurality of battery cells, handles for easy portability mounted outside the housing, and battery terminals that are coupleable to corresponding terminals within the battery compartment 126. In an embodiment, the battery compartment 126 includes a series of railings that allow insertion and removal of the battery packs 600 along a rear-front axis of the electric lawn apparatus 100, with the battery packs 600 being mounted side-by-side within the battery compartment 126. In an embodiment, the battery compartment 126 also includes a rear door (FIG. 1B) that covers the rear end of the battery packs 600 adjacent the stand platform 114. For a complete description of the battery compartment 126 and the battery packs 600, reference is made to PCT Application No. PCT/US23/70782 filed Jul. 21, 2023, content of which is incorporated herein by reference in its entirety.

In an embodiment, each battery pack 600 may have a maximum rated voltage of 60V (i.e., a nominal voltage of 54V), a battery capacity of approximately 60 ampere-hours (A.h.), and an impedance of 30 mOhms. The battery packs 600 are coupled in parallel to provide a cumulative total energy of at least approximately 14 kWh, preferably at least approximately 16 kWh, to the electric lawn apparatus 100. This energy is used to drive the two drive motors 400 and the three deck motors 200.

In an embodiment, the weight of each battery pack 600 is approximately 42 to 51 lbs, preferably approximately 45 to 48 lbs. Each battery pack is approximately 9 to 11 cm in width and has a volume of approximately 18,500 to 21,500 cm^3. Accordingly, the entire battery compartment 126 may occupy a width of approximately 45 to 55 cm and a total volume of approximately 92,500 cm^3 to 107,500 cm^3 between the two side plates 152 of the main frame 106. Thus, in an embodiment, the lateral width between the two side plates 152 (and accordingly between the drive motors 400) is less than or equal to approximately 65 cm, preferably less than or equal to approximately 63 cm, more preferably less than or equal to approximately 61 cm. This arrangement provides a significant amount of energy from the battery packs 600 within a limited space suitable for a riding mowing apparatus. In an embodiment, a ratio of the maximum cumulative energy output of the battery packs 600 to the lateral distance between the drive motors is greater than or equal to approximately 0.23 kW/cm, preferably greater than or equal to approximately 0.235 kW/cm, more preferably greater than or equal to approximately 0.24 kW/cm.

In an embodiment, battery packs 600 are oriented such that lower walls of the housings of the battery packs 600 is oriented at close proximity to a horizontal plane that intersects a rear wheel rotation axis 124 of the drive motors 400. In the illustrated example, the rear wheel rotation axis 124 is located slightly below or in line with the lower walls of the battery packs 600, though it should be understood that alternatively, the rear wheel rotation axis 124 may pass through lower portions of the battery packs 600.

Figure 1F:
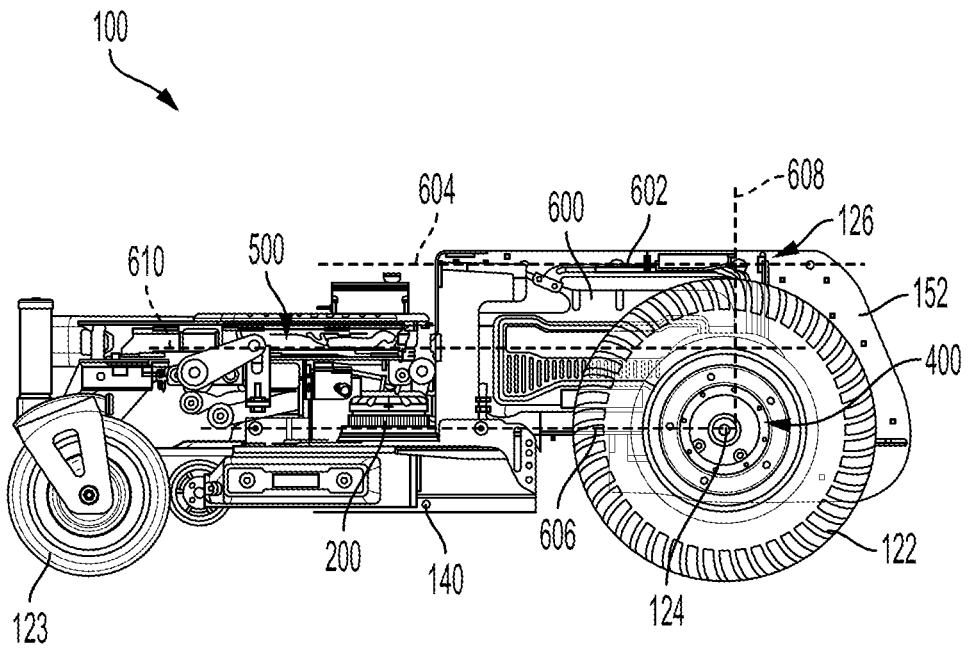
FIG. 1F depicts a partial side view of the electric lawn apparatus, according to an embodiment.

FIG. 1F depicts a partial side view of the electric lawn apparatus 100, according to an embodiment. In this figure, the rear tire 122 and the side plate 152 are shown translucently to illustrate the position of the battery packs 600 relative to other components of the electric lawn apparatus 100.

In an embodiment, an upper surface of the plurality of battery packs 600 (i.e., the upper edges of handles 602 of the battery packs 600) lies along a first horizontal plane 604 that is oriented above a top of the rear tire 122.

In an embodiment, a lower surface of the plurality of battery packs 600 (i.e., the mating surface of the battery packs and the railings) lies along a second horizontal plane 606 that passes through the drive motors 400. In an embodiment, the second horizontal plane 606 is oriented approximately 1 mm to 15 mm below the rear wheel rotation axis 124. Further, in an embodiment, second horizontal plane 606 passes above a top surface of the mow deck 140 and intersects the deck motors 200.

In an embodiment, a rear surface of the plurality of battery packs 600 lies along a vertical plane 608 that also passes through the drive motors 400. In an embodiment, the vertical plane 608 is oriented approximately 1 mm to 50 mm rearward of the rear wheel rotation axis 124.

In an embodiment, a third horizontal plane 610 formed by a top surface of motor control panel 500 passes through the battery packs 600 approximately halfway between the first and second horizontal planes.

Figure 2A:
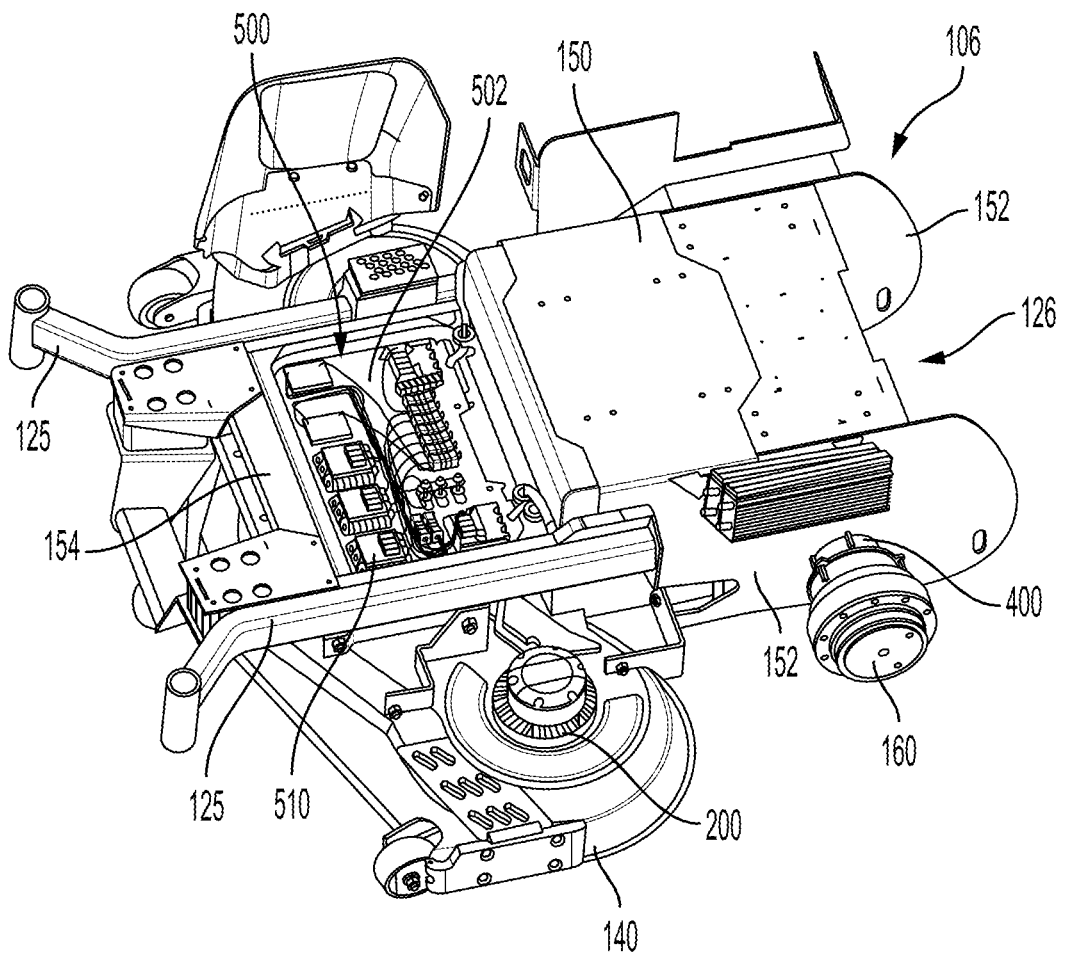
FIGS. 2A and 2B depict perspective views of a main frame of the electric lawn apparatus including a mow deck, according to an embodiment.
Figure 2B:
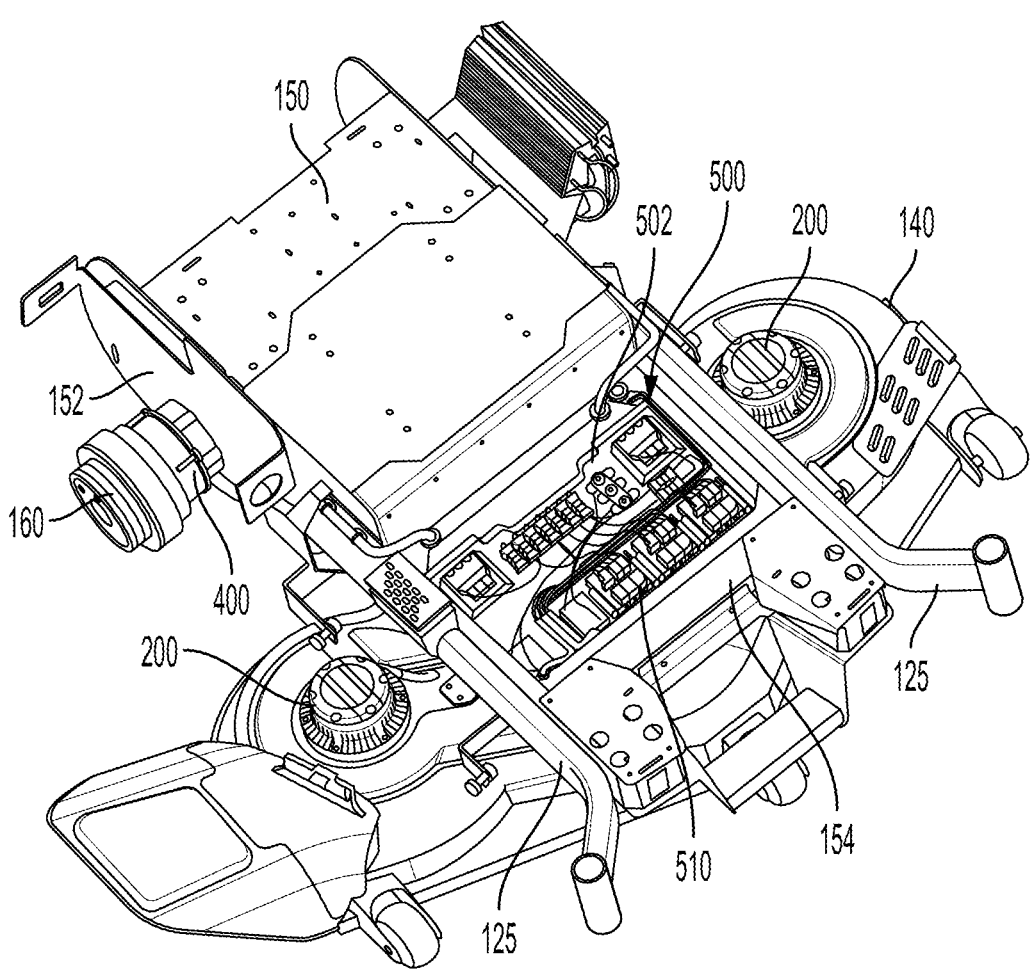

FIGS. 2A and 2B depict perspective views of the main frame 106 of the electric lawn apparatus 100 including the mow deck 140, according to an embodiment. In these figures, the main frame 106 includes an upper body 150 on which the operator seat 102 is mounted, two side plates 152 extending downwardly from the upper body 150, and a lower support body 154 stepped down from the upper body 150 and extending forwardly therefrom between the link rods 125. In an embodiment, BLDC drive motors 400 are secured outside the side plates 152. In an embodiment, transmission assemblies 160 are rotationally secured to the outputs of the drive motors 400 and form drive hubs for mounting the rear tires 122. In an embodiment, the mow deck 140 is secured beneath the lower support body 154 and extends laterally on two sides of the lower support body 154 such that one of the deck motors 200 is positioned directly below the lower support body 154 and two of the deck motors 200 are positioned outside the body of the lower support body 154. In an embodiment, the battery compartment 126 is formed within the cavity of the upper body 150 and the two side plates 152 below the operator seat 102 and laterally between the drive motors 400.

In an embodiment, a motor control panel 500 is mounted on the lower support body 154. In an embodiment, motor control panel 500 includes a metal (e.g., steel) plate 502 securely received into a cavity of the lower support body 154, a series of control and power modules 510 (e.g., in this example five) mounted on the metal plate 502 for controlling supply of electric power into the deck motors 200 and the drive motors 400, and other associated electronics and circuitry for power supply management. In an embodiment, motor control panel 500 is covered by the footrest platform 132 so as to be disposed below the feet of the operator in the seated configuration of the electric lawn apparatus 100.

Figure 3:
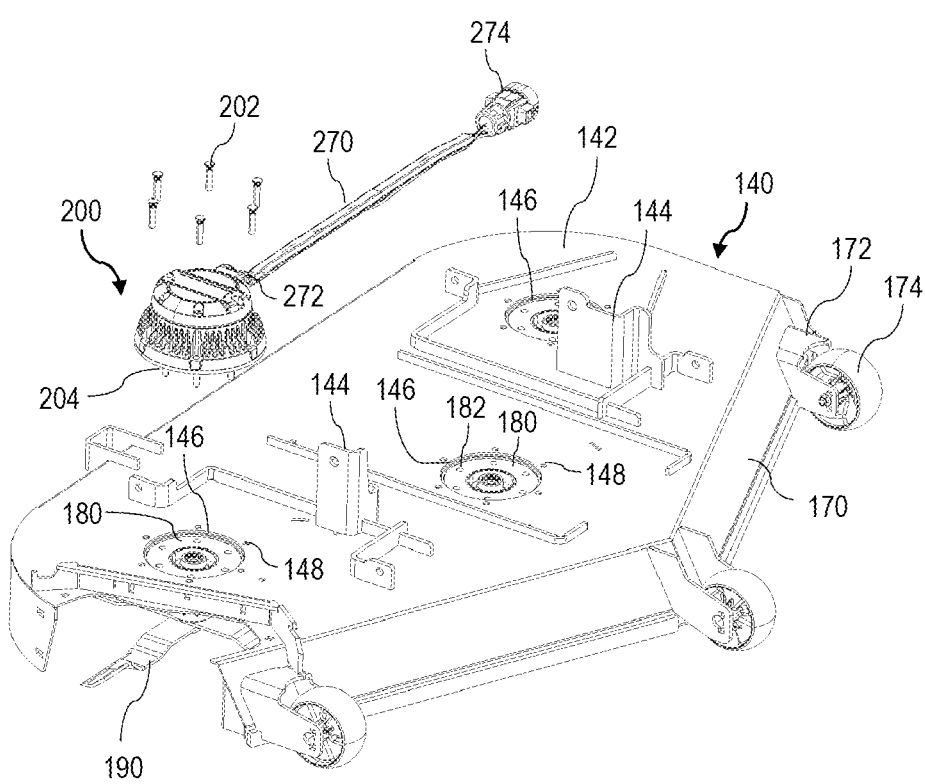
FIG. 3 depicts a perspective view of the mow deck and an electric brushless direct-current (BLDC) deck motor prior to mounting thereto, according to an embodiment.

FIG. 3 depicts a perspective view of the mow deck 140 and one of the three deck motors 200 prior to mounting thereto, according to an embodiment.

As shown in this figure, in an embodiment, mow deck 140 includes a main planar body 142 that is orientated substantially parallel to a ground surface, a series of posts 144 that project upwardly from the main planar body 142 for attachment to the lower support body 154 of the main frame 106, and a series of circular opening 146 through which an output spindle (not shown) of the deck motor 200 is received for coupling to mow blade 190 through a torque limiter member 180. In an embodiment, circular opening 146 is sized to allow the torque limiter member 180 to be mounted to the deck motor 200 and dropped through the circular opening 146 during the assembly process. In an embodiment, a mow deck 140 further includes a sloped front surface 170 having a series of wheel support members 172 that support a series of wheels 174.

In an embodiment, a wire cord 270 including a strain relief 272 is coupled to the deck motor 200 on one end and to a control and power module (not shown) via connector 274 on another end.

Figure 4:
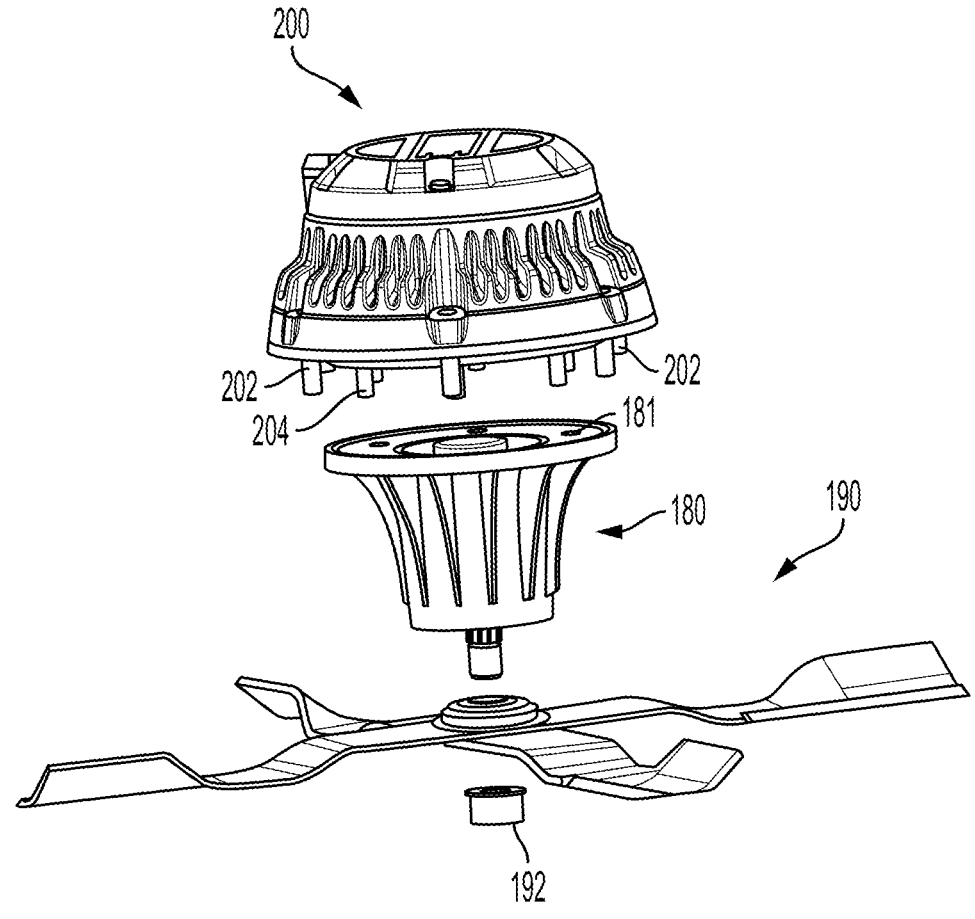
FIG. 4 depicts a partial exploded view of a deck motor, a torque limiter member, and a mow blade, according to an embodiment.
Figure 5:
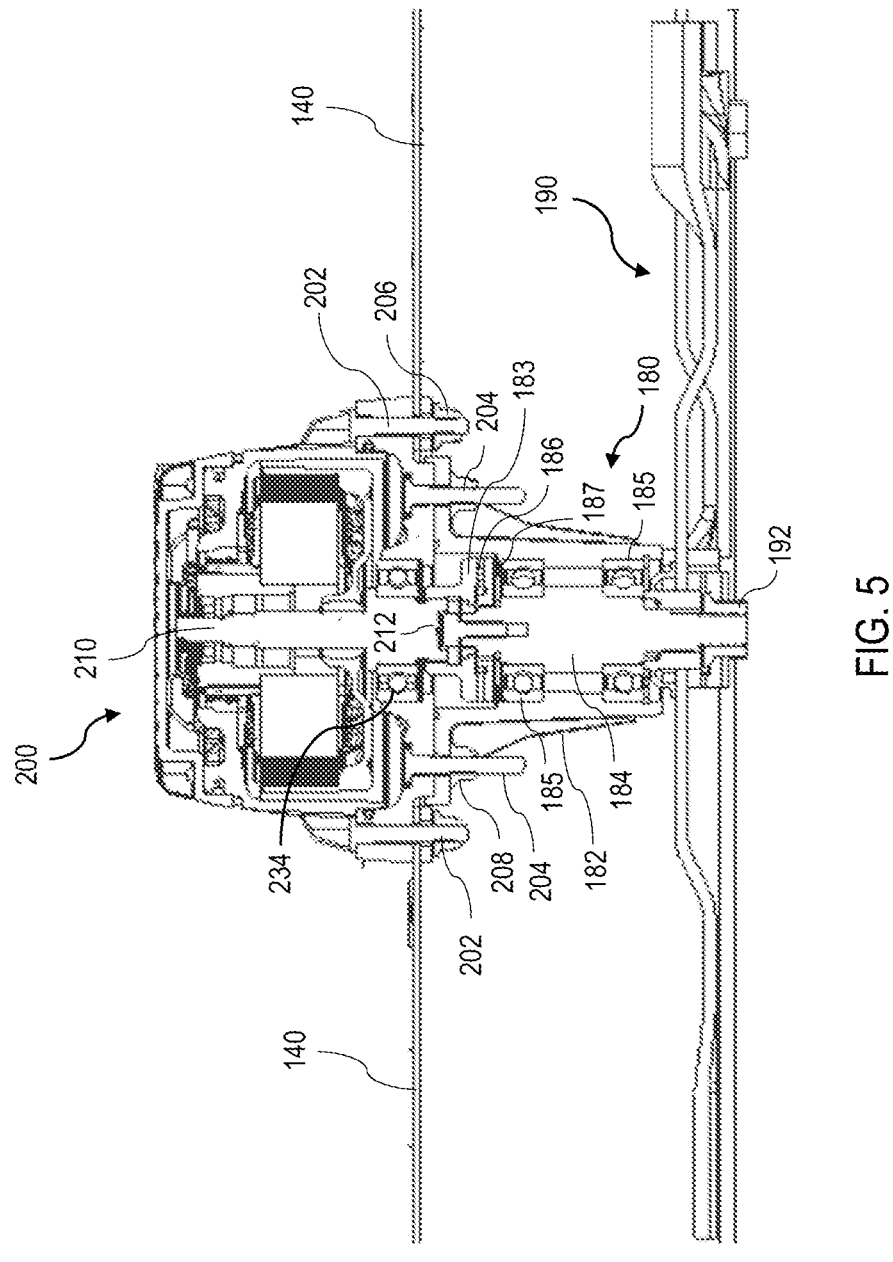
FIG. 5 depicts a cross-sectional view of the deck and one of the deck motors mounted thereon, according to an embodiment.

FIG. 4 depicts a partial exploded view of one of the deck motors 200, a corresponding torque limiter member 180, and a corresponding mow blade 190, according to an embodiment. FIG. 5 depicts a cross-sectional view of the mow deck 140 and one of the deck motors 200 mounted thereon, according to an embodiment.

With reference to these figures and continued reference to FIG. 3, in an embodiment, mow deck 140 includes a first series of through-holes 148 provided around each circular opening 146. A series of outer fasteners 202 is received through corresponding through-holes formed in the deck motor 200 and the first series of through-holes 148 of the mow deck 140 and fastened into a first series of nuts 206 below the mow deck 140 to secure the deck motor 200 to the mow deck 140.

In an embodiment, torque limiter member 180 includes a second series of through-holes 181 facing the deck motor 200. A series of inner fasteners 204 is received from the motor deck 200 into the second series of through-holes 181 and fastened into a second series of nuts 208 to secure the torque limiter member 180 to the deck motor 200.

In an embodiment, as will be described later in this disclosure, deck motor 200 includes a motor spindle 210 and a spline 212 formed on a front (bottom) end of the motor spindle 210. In an embodiment, spline 212 may be male or female body arranged to mate with a corresponding female or male spline on the torque limiter member 180. In an embodiment, spline 212 may be integrally formed. Alternatively, in an embodiment spline 212 may be a pinion mounted on the motor spindle 210.

In an embodiment, torque limiter member 180 is mounted between the deck motor 200 and the mow blade 190 to provide torque protection for the deck motor 200 during impact with hard objects such as rocks and provide structural support for the mow blade 190. In an embodiment, torque limiter member 180 includes a housing 182, a torque transfer plate 183 rotationally coupled to the spline 212 of the motor spindle 210, a torque limiter shaft 184 extending through the housing 182 and secured via a pair of bearings 185, a friction disc 186 mounted between the torque transfer plate 183 and the torque limiter shaft 184 to transfer torque to the torque limiter shaft 184, and a preload spring 187 that biases the friction disc 186 into contact with the torque transfer plate 183. In an embodiment, the mow blade 190 is secured to a threaded lower end of the torque limiter shaft 184 via a nut 192. In an embodiment, if during operation of the electric lawn apparatus 100, the mow blade 190 comes into contact with a hard object such as a rock, where the force of rapid deceleration is greater than the frictional force between the friction disc 186 and the torque transfer plate 183, the friction disc 186 disengages from the torque transfer plate 183 so the force of rapid deceleration is not transferred to the deck motor 200.

The deck motors 200 and the drive motors 400 are described herein in detail. The deck motors 200 and the driver motors 400 are designed for high efficiency and high power density to deliver the power needed to efficiently mow a large area of grass from a single charge of the battery packs 600. Further, each motor is designed to be fully water-sealed and at least substantially air-sealed to allow operators to operator the electric lawn apparatus 100 in wet conditions and wash or even pressure-wash the electric lawn apparatus 100 including the motors 200 and 400 when needed. As such, each motor is unitarily fully sealed without a need for a secondary outer housing.

It should be understood that for the deck motor 200, terms "bottom", "lower", "below" and "front" are used in reference to a longitudinal direction of the motor along its rotational axis and in the direction of the ground when the deck motor 200 is mounted on the mow deck 140. Similarly, terms "top", "upper", "above" and "rear" are used in reference to the longitudinal direction of the motor in the direction away from the ground. For the drive motor 400, terms "bottom", "lower", "below" and "front" are used in reference to a longitudinal direction of the motor along its rotational axis and in the direction of the transmission assembly 160 when the deck motor 200 is mounted on the side plate 152. Similarly, terms "top", "upper", "above" and "rear" are used in reference to the longitudinal direction of the motor in the direction of the side plate 152.

Deck Motor

The deck motor 200 is described in detail herein with reference to FIGS. 6A through 25.

Figure 6A:
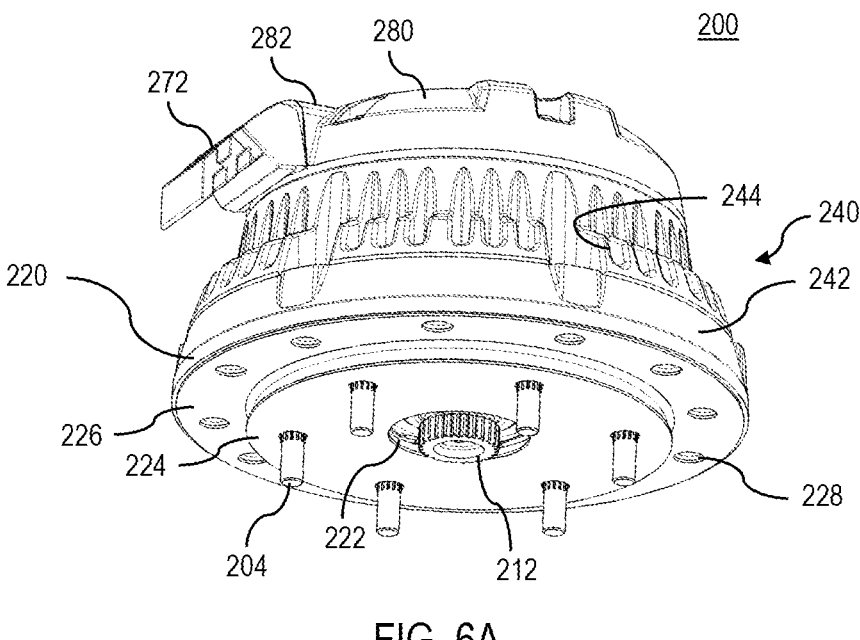
FIGS. 6A and 6B depict perspective views of the deck motor including a first end cap, a second end cap, and a motor cover, according to an embodiment.
Figure 6B:
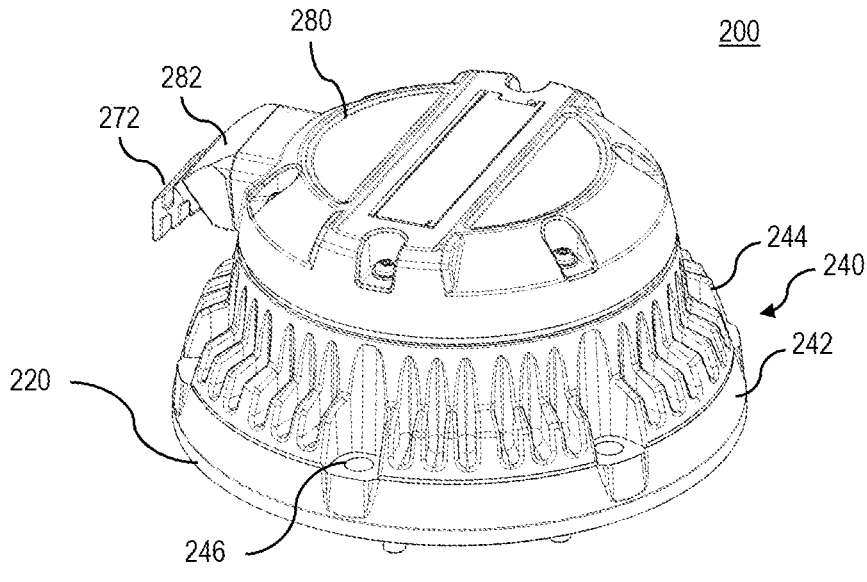
Figure 7:
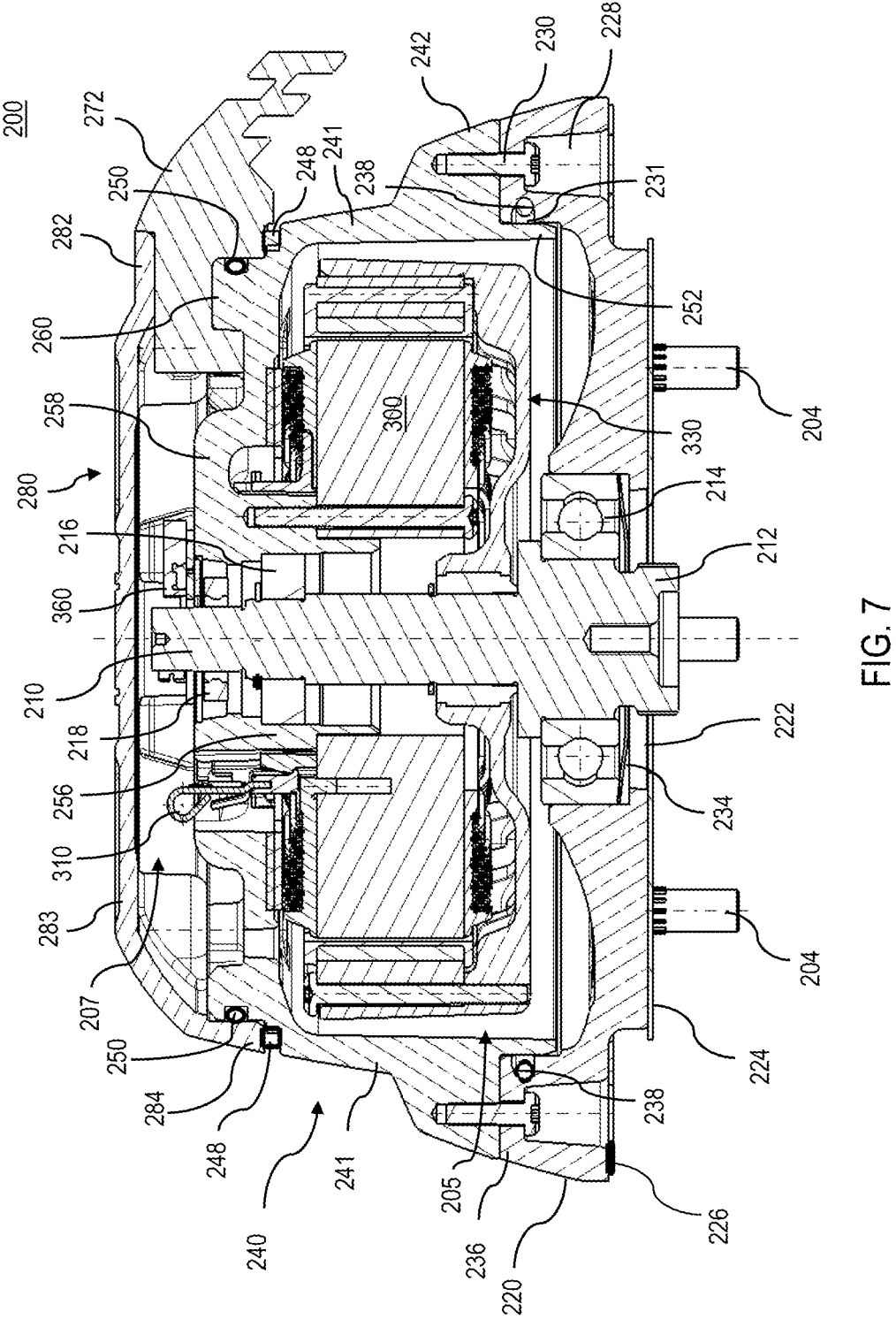
FIG. 7 depicts a cross-sectional view of the deck motor, according to an embodiment.
Figure 8A:
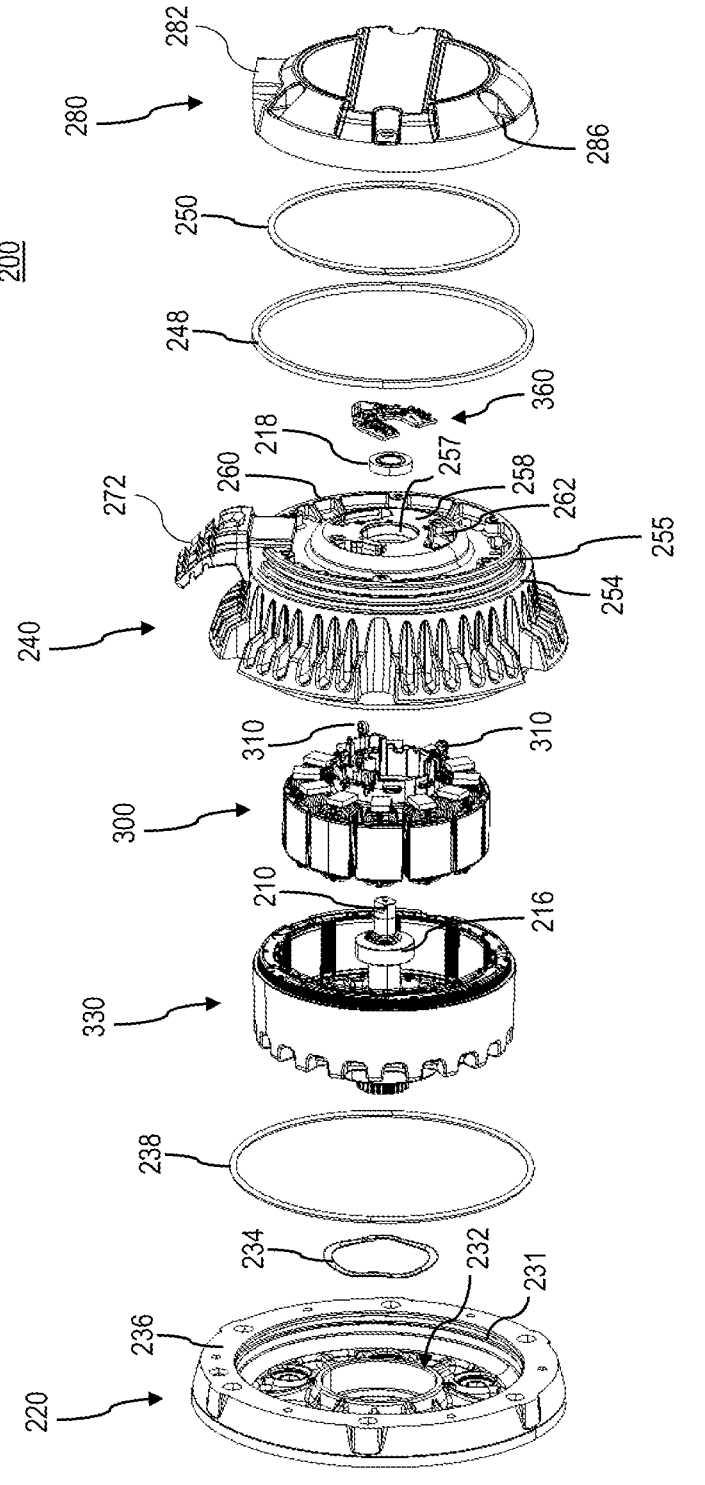
FIGS. 8A and 8B depict perspective exploded views of the deck motor additionally including a stator assembly, a rotor assembly, and a Hall assembly, according to an embodiment.
Figure 8B:
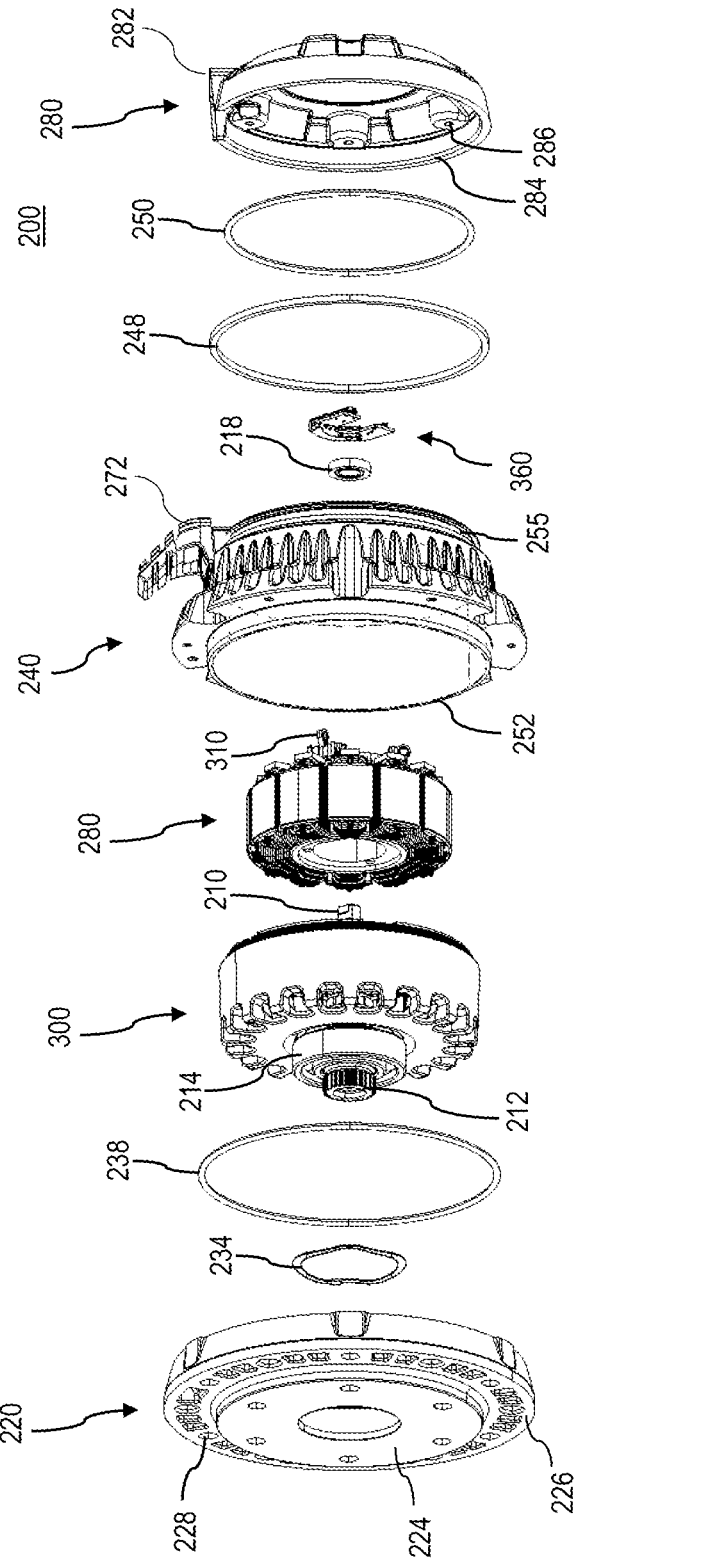

FIGS. 6A and 6B depict perspective views of the deck motor 200, according to an embodiment. FIG. 7 depicts a cross-sectional view of the deck motor 200, according to an embodiment. FIGS. 8A and 8B depict perspective exploded views of the deck motor 200, according to an embodiment.

As shown in these figures, in an embodiment, deck motor 200 is an outer-rotor BLDC motor and includes a first end cap 220, also referred to herein as a deck plate or a motor plate, a second end cap 240, also referred to herein as a motor cup or stator mount, and a motor cover 280. These components together form a motor housing. In an embodiment, deck motor 200 further includes a stator assembly 300, a rotor assembly 330, and a Hall assembly 360, housed within the motor housing.

In an embodiment, the first end cap 220 includes a center opening 222 inside which the spline 212 is located. In an embodiment, a bottom surface of the first end cap 220 includes a projected inner circular surface 224 sized to fit into the circular opening 146 of the mow deck 140, and an annular outer recessed surface 226 configured to rest of the mow deck 140. In an embodiment, a series of peripheral through-holes 228 are formed through the outer recessed surface 226. A first subset of the peripheral through-holes 228 is used for securing the motor deck 200 to the mow deck 140 via outer fasteners 202 (FIG. 4). A second subset of the peripheral through-holes 228 is used for securing the second end cap 240 to the first end cap 220 via fasteners 230.

In an embodiment, a top surface of the first end cap 220 forms a center bearing pocket (or bearing holder) 232 coaxial with the center opening 222 and having a larger diameter than the center opening 222. The center bearing pocket 232 receives a front bearing 214 of the motor spindle 210 to provide axial and radial support for the motor spindle 210 relative to the first end cap 220. In an embodiment, a wave spring 234 preloads onto the front bearing 214 inside the center bearing pocket 232. Further, in an embodiment, the top surface of the first end cap 220 includes an annular peripheral projection 236 that receives at least a portion of the rotor assembly 330.

In an embodiment, the second end cap 240 is positioned between the first end cap 220 and the motor cover 280 and mates with the first end cap 220 to form a first compartment 205 around the stator assembly 300 and the rotor assembly 330, and a second compartment 207 around the Hall assembly 360 and the wiring connections. In an embodiment, while the first and second compartments are in fluid communication through the second end cap 240, the second end cap 240 forms fully-sealed connections with the first end cap 220 and the motor cover 280 around the first and second compartments to substantially block ingress of liquid and air into the deck motor 200. In an embodiment, these include a first O-ring 238 disposed between the first end cap 220 and the second end cap 240, and second O-ring 248 and third O-ring 250 disposed between the second end cap 240 and the motor cover 280. In an embodiment, these seals provide a substantially and/or fully watertight and a substantially and/or fully airtight motor housing around the internal motor components including the stator assembly 300, the rotor assembly 330, and the Hall assembly 360, with no air inlets or outlets to allow ingress of water or air inside the motor housing.

In an embodiment, the second end cap 240 includes an outer annular body 241 formed around the stator assembly 300 and the rotor assembly 330; a flange 242 projecting outwardly from the outer annular body 241 to form approximately the same outer diameter as the annular peripheral projection 236 of the first end cap 240 and configured to rest on a top surface of the annular peripheral projection 236 and form a substantially flush outer surface with the annular peripheral projection 236; and an annular projection 252 projecting from the bottom surface of the flange 242. In an embodiment, the annular projection 252 is securely received, e.g. via press-fitting or slip-fitting, inside the annular peripheral projection 236 of the first end cap 240 to form a seal between the two end caps. In an embodiment, O-ring 238 is received inside an annular groove 231 formed in the annular peripheral projection 236 in elastic engagement with the annular projection 252 for improved sealing between the two end caps.

In an embodiment, the second end cap 240 includes a series of peripheral through-holes 246 formed through the flange 242 that align with corresponding the second subset of the peripheral through-holes 228 of the first end cap 220 and through which the outer fasteners 202 (FIGS. 4 and 5) are received and secured to the mow deck 140.

In an embodiment, the second end cap 240 is made of heat conductive material such as aluminum, thus acting as a heat sink for the deck motor components. In an embodiment, the annular body of the second end cap 240 includes a sloped outer surface and a series of fins 244 that extend longitudinally along the outer surface for improved heat transfer from the deck motor 200. In an embodiment, fins 244 include sloped outer edges that extend from the flange 242.

In an embodiment, the second end cap 240 further includes an inner annular body 256 provided radially inwardly of the outer annular body 241 and forming a center opening 257 therein for receiving the end of the motor spindle 210, and a main radial body 258 disposed on one side of the stator assembly 300 and extending from the inner annular body 256 and the outer annular body 241. As will be described later in detail, the inner annular body 256 provides a bearing pocket to received and support a rear bearing 216 of the motor spindle 210 from a bottom surface thereof to provide axial and radial support for the motor spindle 210 relative to the second end cap 240. In an embodiment, the inner annular body 256 also includes supports a sense magnet 218 received through the center opening 257 on an upper side of the second end cap 240. Further, in an embodiment, a front portion of the inner annular body 256 forms a stator mount onto which the stator assembly 300 is mounted.

In an embodiment, an upper portion of the outer annular body 241 of the second end cap 240 includes a stepped portion 254 that leads to formation of an annular wall 260 around the main radial body 258. In an embodiment, the annular wall 260 includes an annular groove 255 formed therein at a distance above the stepped portion 254. In an embodiment, a second O-ring 248 is mounted on the stepped portion 254, and a third O-ring 250 is received within the annular groove 255.

In an embodiment, Hall assembly 360 is mounted on the top surface of the main radial body 258 around the center opening 257 in close proximity to the sense magnet 218. As will be described later, Hall assembly 360 magnetically interacts with the sense magnet 218 to provide signals associated with an angular orientation of the motor spindle 210. In an embodiment, sense magnet 218 is a ring-shaped member formed of magnetic material having, for example, a N-S-N-S orientation. Additionally, in an embodiment, the main radial body 258 a series of slots 262 formed around the center opening 257. In an embodiment, series of stator terminals 310 projecting axially from the stator assembly 300 is received through the slots 262 to the upper side of the second end cap 240.

In an embodiment, the wire cord 270 includes positional signal wires coupled to the Hall assembly 360 and power wires coupled to the stator terminals 310 on the upper side of the second end cap 240. In an embodiment, additional signal wires, e.g., a wire coupled to a thermistor within the stator assembly 300 for detecting a temperature of the stator windings, may also be included as a part of the wire cord 270. The entirety of the wire cord 270 is captured by the strain relief 272 at the point of exit from the second end cap 240. In an embodiment, the strain relief 272 is molded to engage the annular wall 260 of the annular wall 260 of the second end cap 240.

In an embodiment, the motor cover 280 encapsulates the second compartment 207 to complete the motor seal. In cooperation with other sealing components described above, the motor cover 280 protects motor power and signal wiring connections, the Hall assembly 360, the sense magnet 218, and other motor components against ingress of water and contaminated air. Further, in an embodiment, the motor cover 280 cooperates with the second end cap 240 to form a grommet 282 around the strain relief 272 and fully seal the area around the strain relief 272.

In an embodiment, the motor cover 280 includes a radial encapsulation body 283 and an annular wall 284 extending in the direction of the second end cap 240. In an embodiment, the annular wall 284 is sized to be securely fitted, e.g., via press-fitting or slip-fitting, around the annular wall 260 of the second end cap 240 against the stepped portion 254. In an embodiment, the second O-ring 248 provides axial sealing between the annular wall 284 of the motor cover 280 and the stepped portion 254 of the second end cap 240. In an embodiment, the third O-ring 250 provides secondary radial sealing between the annular wall 284 of the motor cover 280 and the annular wall 260 of the second end cap 240. In an embodiment, motor cover 280 includes a series of peripheral through-holes 286 that receive fasteners (not shown) for fastening the motor cover 280 to the second end cap 240.

In an embodiment, in addition to the second end cap 240, the first end cap 220 and the motor cover 280 are also made, fully or at least partially, of thermally-conducive material such as metal. These components, in addition to thermal gap pads and other features described below in detail, provide an effective thermal management system for the deck motor 200 despite its high voltage and power output.

Stator assembly 300 is described herein with reference to FIGS. 9-12B. In an embodiment, stator 300 includes many of the same features as a stator assembly described in US Patent Application Publication No. 2020/0343789 filed Apr. 23, 2020, content of which is incorporated herein by reference in its entirety.

Figures 9, 10:
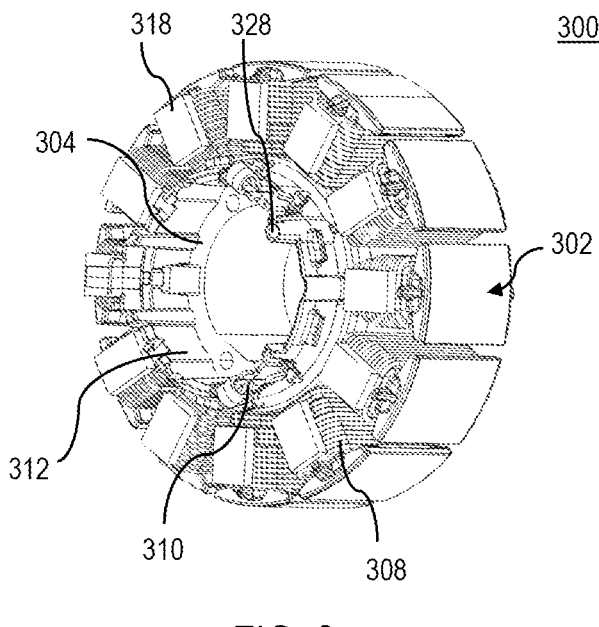
FIG. 9 depicts a perspective view of the stator assembly of the deck motor, according to an embodiment.
FIG. 10 depicts a partially-exploded view of the stator assembly, according to an embodiment.

FIG. 9 depicts a perspective view of stator assembly 300, according to an embodiment. FIG. 10 depicts a partially-exploded view of the stator assembly 300, according to an embodiment.

In an embodiment, as shown in these figures, stator assembly 300 is provided as an inner stator including a stator lamination stack 302 (also referred to as stator core) having a ring-shaped stator bore 304 and a plurality of stator teeth 306 radially projecting outwardly from the stator bore 302 with slots formed therebetween. Stator windings 308 are wound around the stator teeth defining the phases of the deck motor 200. In an embodiment, stator assembly 308 can further include one or more end insulators 309 covering end surfaces of the stator lamination stack 302 to electrically insulate the stator windings 308 from the stator lamination stack 302.

In an embodiment, where the deck motor 200 is a three-phase motor includes 12 stator windings 308, the stator assembly 300 will constitute three group (i.e., phases) of four stator windings 308 connected together on or around the stator bore 304. The stator windings 308 within each phase may be electrically coupled together in a series of a parallel connection, and the three phases of windings may be electrically wired together in a wye or a delta configuration. In one embodiment, the stator windings 308 are configured in a parallel-series delta pattern, with four stator windings 308 within each of the motor, where two of said windings are connected in parallel and two are connected in series.

In an embodiment, stator lamination stack 302 has an axial length of approximately 23-37 mm, preferably approximately 26-34 mm, and a diameter of approximately 100-130 mm, preferably approximately 110-115 mm. Thus, in an embodiment, the stator lamination stack has a diameter to length ratio of approximately 3-6, preferably approximately between 4 to 5.

In an embodiment, stator assembly 300 includes a stator collar 312 for supporting the stator terminals 310. In an embodiment, stator collar 312 is molded from insulating material and is shaped substantially cylindrically to be mounted on the stator bore 304 extending away from the first end cap 220. In an embodiment, stator terminals 310 are axially supported equidistantly around the stator collar 312. In an embodiment, the stator windings 308 make electrical connections to tang portions 314 of the stator terminals 310 in a desired winding configuration. In an embodiment, hook portions 316 of the stator terminals 310 are received through slots 262 of the main radial body 258 so as to be accessible for connections of the power wires.

In an embodiment, stator assembly 300 further includes a series of thermally-conductive gap pads 318 discretely mounted on axial ends of the stator windings 308. In an embodiment, gap pads 318 are made of electrically-insulating material such as graphite. In an embodiment, a same number of gap pads 318 as stator windings 308 are discretely provided, each gap pad 318 covering a substantial portion of axial ends of the corresponding stator winding 308.

Figure 11:
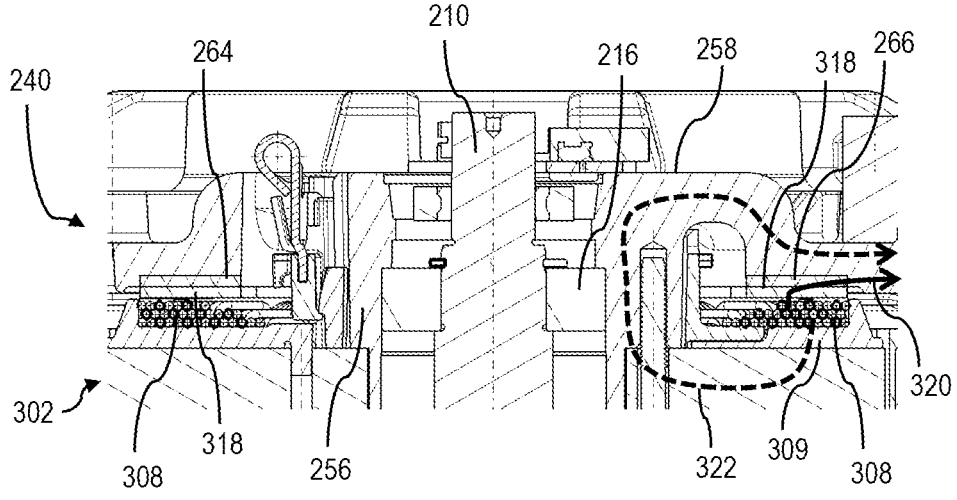
FIG. 11 depicts a partial cross-sectional view of the stator assembly within the deck motor, according to an embodiment.

FIG. 11 depicts a partial cross-sectional view of the stator assembly within the deck motor, according to an embodiment. In an embodiment, after assembly of the stator assembly 300 inside the second end cap 240, the gap pads 318 physically mate the bottom surface of the main radial body 258 of the second end cap 240, thus providing a first thermal path 320 directly between stator windings 308 and the second end cap 240. Without the gaps pads 318, the heat from the stator windings 308 would have a less efficient and longer second thermal path 322 at its disposal, i.e., through the end insulator 309, stator lamination stack 302, the inner annular body 256, and the main radial wall 258. Gap pads 318 thus significantly improve the thermal management of the stator assembly 300.

In an embodiment, a ring-shaped gap pad strip 266 is mounted on the bottom surface of the main radial body 258 in contact with the discrete gap pads 318. In an embodiment, both gap pads 318 and the gap pad strip 266 are made of elastically deformable material to ensure property surface contact between therebetween even with considerable stack-up tolerances. In an embodiment, only one of the ring-shaped gap pad strip 266 and the plurality of gap pads 318 is provided.

Figure 12A:
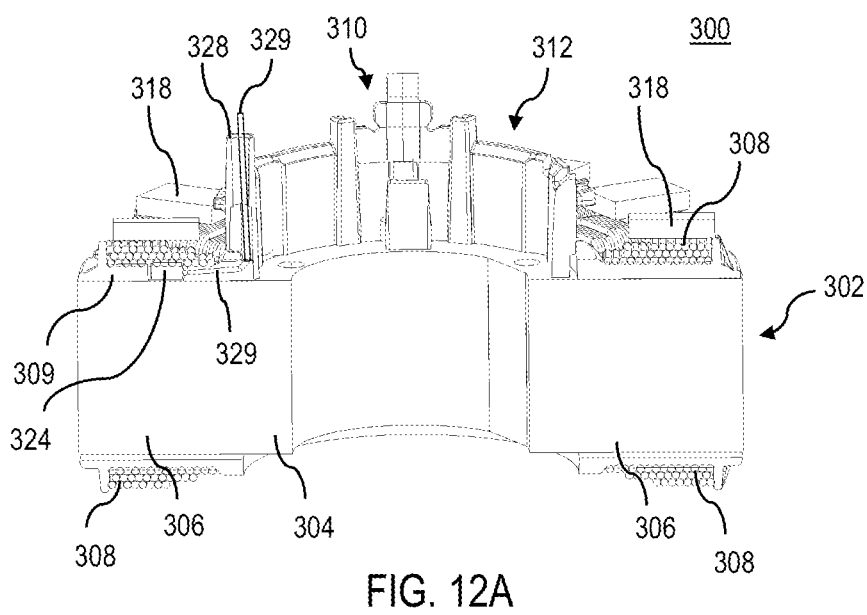
FIG. 12A depicts a cross-sectioned perspective view of the stator assembly, according to an embodiment.
Figure 12B:
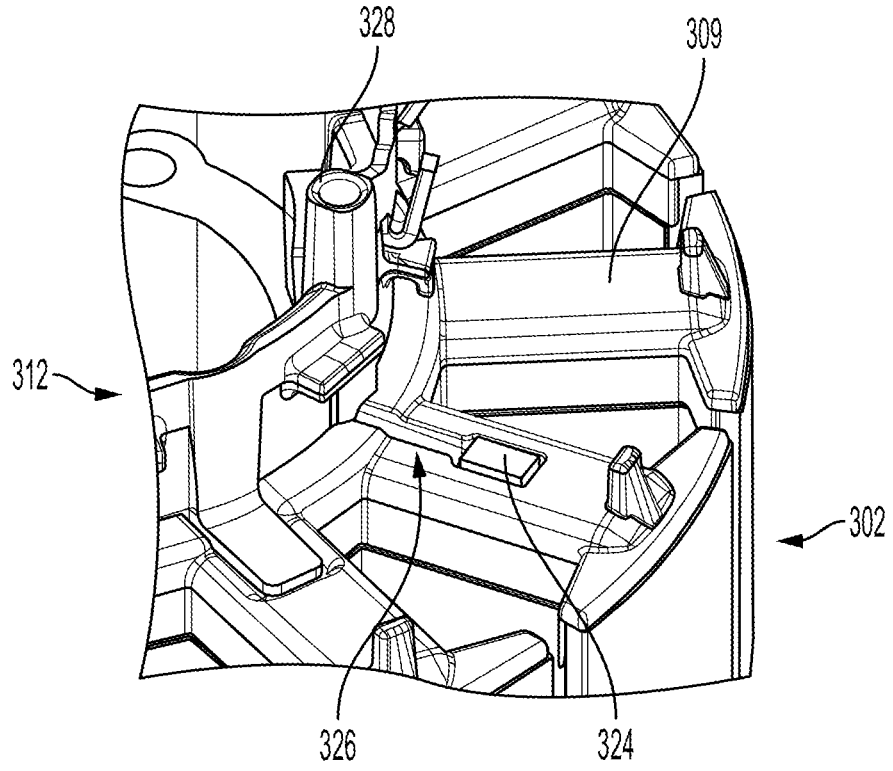
FIG. 12B depicts a perspective view of the stator assembly prior to winding of the stator windings, according to an embodiment.

FIG. 12A depicts a cross-sectioned perspective view of the stator assembly 300, according to an embodiment. FIG. 12B depicts a perspective view of the stator assembly 300 prior to winding of the stator windings 308. In an embodiment, as shown in these figures, stator assembly 300 further includes a thermistor 324 embedded into one of the end insulators 309 in contact with the stator windings 308 to detect a temperature of the stator windings 308. In an embodiment, end insulator 309 includes a channel 326 formed in the outer surface of one of its radial teeth, the channel 326 extending radially and forming a pocket for disposition of the thermistor 324. After the windings 308 are wound on the stator lamination stack 302 and the end insulator 309, one set of the stator windings 308 come into thermal contact with the thermistor 324.

In an embodiment, the thermistor 324 may make physical contact with the stator winding 308. Alternatively, in an embodiment, a layer of soft thermally-conductive gap pad material (not shown) is provided within the channel 326 or at least the pocket portion of the channel 326, and the thermistor is embedded within the gap pad material for improved thermal conductivity with the stator winding 308.

In an embodiment, a temperature signal wire 329 is routed from the thermistor 324 through the channel 326. In an embodiment, the temperature signal wire 329 is guided through an axial hollow post 328 of the stator collar 312 to the upper side of the second end cap 240 and connected to the wire cord 270. This arrangement provides a highly accurate temperature sensing mechanism for detecting the temperature of the stator windings 308 by placing the thermistor between the stator windings 308 and the stator lamination stack 302, in direct contact with or in very close proximity to the stator windings 308.

Figures 13A, 13B:
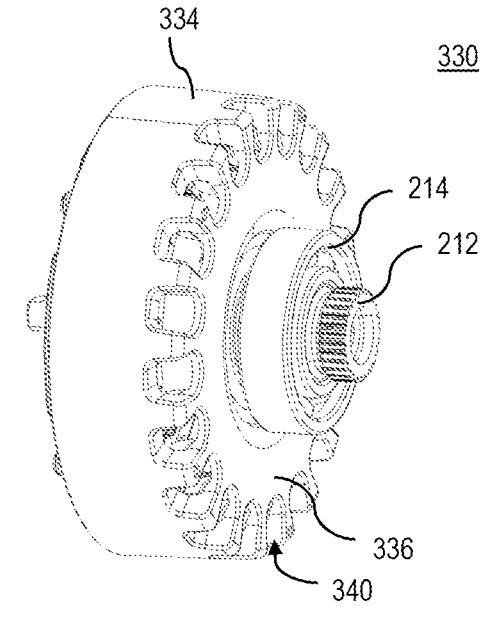
FIGS. 13A and 13B depict perspective views of the rotor assembly of the deck motor including a motor spindle, according to an embodiment.
Figure 14:
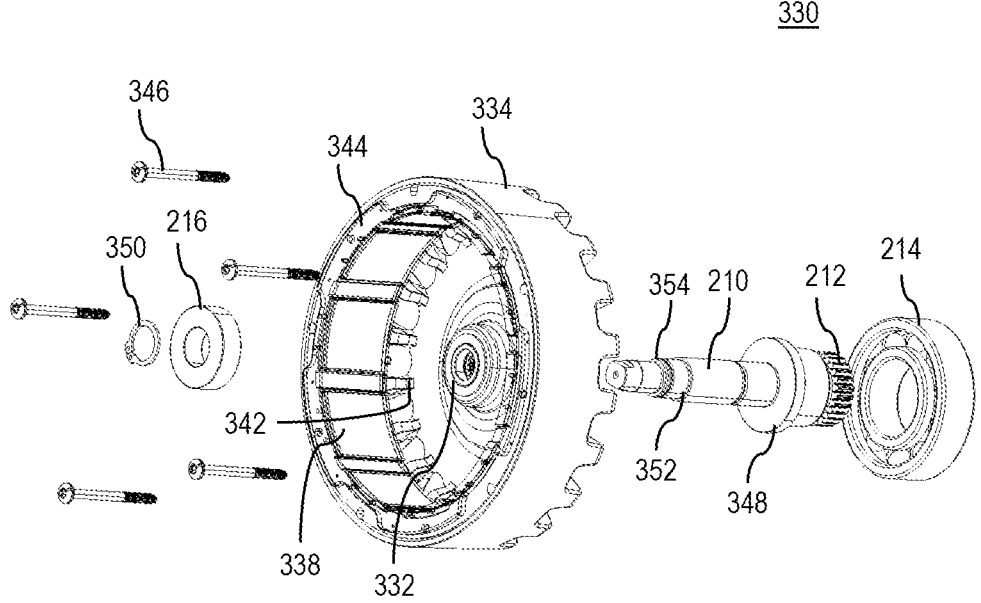
FIG. 14 depicts an exploded view of the rotor assembly, according to an embodiment.

Rotor assembly 330 is described herein with reference to FIGS. 13A-14. In an embodiment, rotor assembly 300 includes many of the same features as a rotor assembly described in US Patent Application Publication No. 2020/0343789 filed Apr. 23, 2020, content of which is incorporated herein by reference in its entirety.

FIGS. 13A and 13B depict perspective views of rotor assembly 330, according to an embodiment. FIG. 14 depicts an exploded view of the rotor assembly 330, according to an embodiment.

In an embodiment, as shown in these figures, rotor assembly 330 is provided as an outer rotor including an inner annular member 332, an outer annular core 334, and a radial wall 336 extending between the two. Inner annular member 332 includes an inner through-hole that is securely mounted over the motor spindle 210 by press-fitting or other known means. Outer annular core 334 is provided with a larger diameter than the stator assembly 300 so as to circumferentially surround the stator assembly 300 with a small airgap therebetween. Outer annular core 334 supports a series of permanent magnets 338 that magnetically interact with the stator windings 308, causing rotation of the rotor assembly 330 around the stator assembly 300 when the stator windings 308 are sequentially energized. In an embodiment, rotor assembly 330 as used in the deck motor 200 is a ten pole rotor and includes a series of ten permanent magnets 338. In an embodiment, an overmold structure 344 may at least partially cover and secure the permanent magnets 338 to the outer annular core 334. In an embodiment, a series of fasteners 346 axially fasten the overmold structure to the outer annular core 334.

In an embodiment, radial wall 336 extends includes a series of peripheral openings 340 that extend partially into the outer annular core 334. In an embodiment, a series of ribs 342 project inwardly between the peripheral openings 340 that generate an airflow through the deck motor 200 for cooling of the motor components. It should be understood that radial wall 336 may alternatively include angular blades or other known features capable of generating an airflow with rotation of the rotor assembly 330. While deck motor 200 is fully sealed and includes no air inlets or outlets, the airflow generates by the rotor assembly 300 through the deck motor 200 sufficiently cools the stator windings 308 and other motor components to stay within thermal limits during normal operations of the electric lawn apparatus 100.

In an embodiment, during the rotor assembly process, the inner annular member 332 is mounted on the motor spindle 210 via, e.g., a bushing press-fitted onto the motor spindle 210. The front bearing 214 is mounted on from the front end of the motor spindle 210 via, e.g., press-fitting or slip-fitting, in axial engagement with an annular flange 348 of the motor spindle 210. The rear bearing 216 is similarly mounted on from the rear end of the motor spindle 210 via, e.g., press-fitting or slip-fitting, in axial engagement with a first shoulder 352. In an embodiment, the rear bearing 216 is further axially retained against the first shoulder 352 via a retaining ring 350. In an embodiment, motor spindle 210 includes a second shoulder 354 disposed between its rear end and the first shoulder 352.

Figure 15:
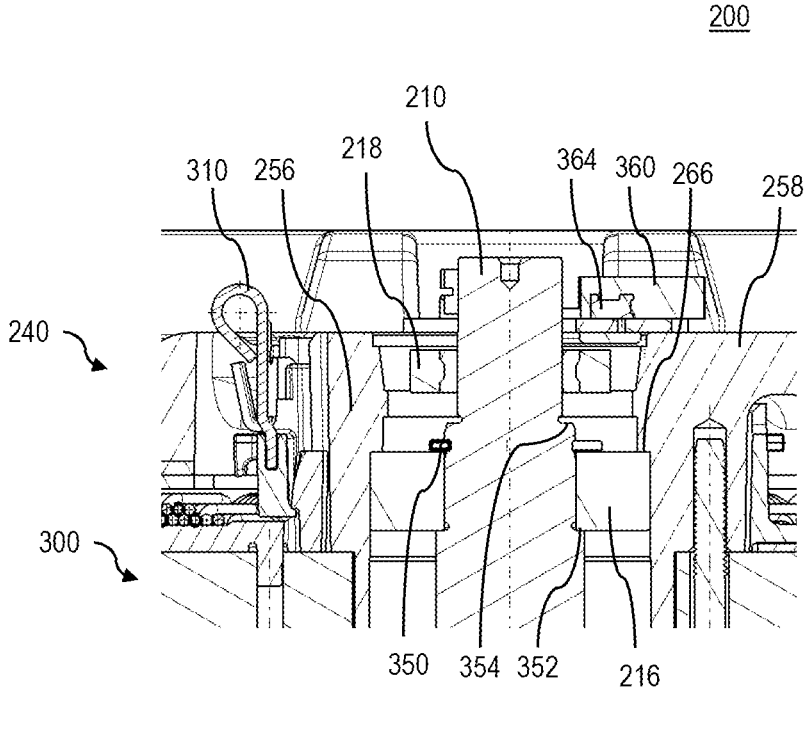
FIG. 15 depicts a zoomed-in cross-sectional view of a rear end of the motor spindle secured within an inner annular body of the second end cap, according to an embodiment.

FIG. 15 depicts a zoomed-in cross-sectional view of the rear end of the motor spindle 210 secured within the inner annular body 256 of the second end cap 240, according to an embodiment. In an embodiment, inner annular body 256 includes a stepped inner profile 264 for axial engagement with the outer race of the rear bearing 216. In an embodiment, in the motor assembly process discussed below in detail, the rotor assembly 330 including the motor spindle 210 is thus received from the lower end of the second end cap 240. In an embodiment, the sense magnet 218 is mounted onto the rear end of the motor spindle 210 from the upper end of the second end cap at a position above the second shoulder 354. The position of the sense magnet 218 may be adjusted during the assembly process along the motor spindle 210 until an optimal position of the sense magnet 218 relative to the Hall assembly 360 is achieved. In an embodiment, this arrangement provides the flexibility to position the sense magnet 218 without regards for stack-up tolerances associated with the second end cap 240 and the motor spindle 210.

Figure 16A:
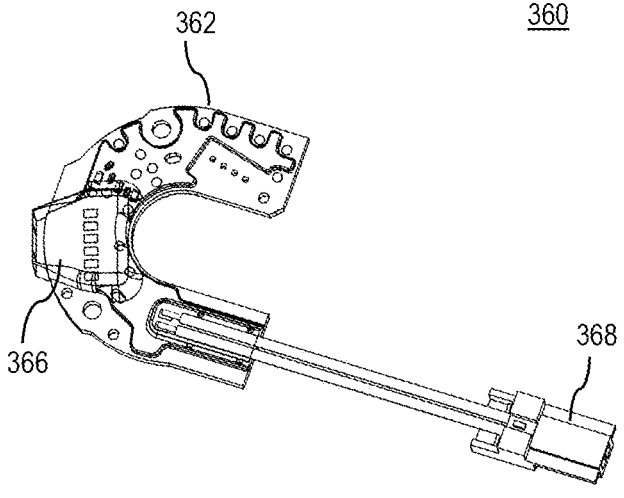
FIGS. 16A and 16B depict perspective views of a Hall assembly of the deck motor, according to an embodiment.
Figure 16B:
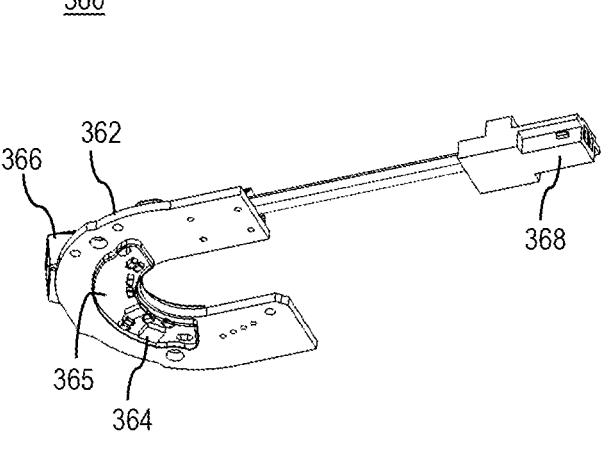
Figure 17:
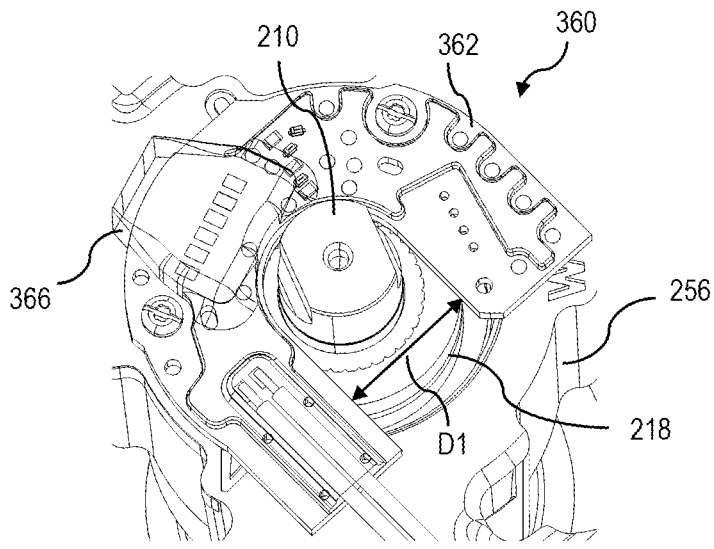
FIG. 17 depicts a perspective zoomed-in view of the Hall assembly relative to a sense magnet mounted on the motor spindle, according to an embodiment.

FIGS. 16A and 16B depict perspective views of the Hall assembly 360, according to an embodiment. FIG. 17 depicts a perspective zoomed-in view of the Hall assembly 360 relative to sense magnet 218, according to an embodiment.

As shown in these figures, and with continued reference to FIG. 15, Hall assembly 360 includes a U-shaped circuit board 362 sized to be disposed around the rear end of the motor spindle 210. In an embodiment, a lateral width D1 of the inner opening of the circuit board 362 is greater than a diameter of the rear end of the motors spindle 210, but smaller than a diameter of the sense magnet 218 and a diameter of the center opening 257 of the inner annular body 256, allowing the Hall assembly 360 to be mounted on the second end cap 240.

In an embodiment, an angle sensor decoder 364, an example of which is the MA302 sensor chip manufactured by Monolithic Power Systems (MPS) Inc., is mounted don the circuit board 362 facing the rotor assembly 330. In an embodiment, the angle sensor decoder 364 includes integrated Hall devices and detects the angle of the magnetic field of the sense magnet 218. In an embodiment, the angle sensor decoder 364 is programmable for calibration with the sense magnet 218. In an alternative embodiment, Hall assembly 360 may include a plurality of Hall sensors directly mounted on the circuit board 362 at predesignated angular positions to cooperatively provide signals indicative of the angle of the magnetic field of the sense magnet 218.

In an embodiment, Hall assembly 360 further includes an overmold portion 365 arranged to at least partially cover the angle sensor decoder 364 on a bottom surface of the circuit board 362, and a terminal connector 366 mounted on a top surface of the circuit board 362 that outputs the positional signals received from the angle sensor decoder 364. In an embodiment, a thermistor connector 368, which is provided for coupling to the temperature signal wire 329 previously discussed, is further coupled to the circuit board 362 to allow the temperature signal from the thermistor 324 to pass through the circuit board 362 and be outputted through the terminal connector 366.

Conventional assembly techniques require that the sense magnet be magnetized in magnetic alignment with the rotor magnets. This would require that the sense magnet be mounted on the motor spindle prior and magnetized prior to assembling the rotor assembly into the motor. Alternatively, the sense magnet can be mounted on the motor spindle after the assembling the rotor assembly into the motor, but this requires the sense magnet to be accessible within a sufficiently large surrounding space to operate a magnetizing equipment. In addition, mechanical alignment of the sense magnet with the rotor magnet usually has high tolerances of ±1.5 mechanical degrees per pole. On a 10-pole motor, this translates to upwards of ±15 degrees of total tolerances, which is highly inaccurate.

In the present embodiment, by using an angle sensor decoder 364 that is programmable to be calibrated after the assembly process, the sense magnet 218 is no longer required to be magnetically aligned with the rotor permanent magnets 338. Rather, according to an embodiment, the sense magnet 218 is pre-magnetized separately from the rotor assembly 330 and assembled onto the motor spindle 210 without a prescribed magnetic alignment with the rotor permanent magnets 338. Thus, the motors on the assembly line may include different offset angles between their respective rotor permanent magnets 338 and the sense magnets 218.

In addition, in an embodiment, when using the angle sensor decoder 364, the sense magnet 218 need not have the same number of magnetic poles as the rotor assembly 330. In an embodiment, the sense magnet 218 may include a N-S orientation (i.e., 2 poles) or N-S-N-S orientation (i.e., 4 poles), which is significantly less than the number of permanent magnets 338 on the rotor assembly 330. The angle sensor decoder 364 can be calibrated to accurately detect the rotor position even with a 2 pole orientation of the sense magnet 218.

In an embodiment, the sense magnet 218 is mounted on the motor spindle 210 at an axial position that is within a prescribed distance from the designated position of the Hall assembly 360. Thus, given different motor stack-up tolerances in different motors on the assembly line, relative positions of the sense magnet 218 along the motor spindle 210 may not be the same for the motors on the assembly line. However, the distances between the sense magnet 218 and the Hall assembly 360 are substantially equal for all motors on the assembly line.

In an embodiment, after the Hall assembly 360 is mounted and the motor assembly is completed, the angle sensor decoder 364 is calibrated to the position of the sense magnet 218 and irrespective of the offset angle between the permanent magnets 338 and the sense magnet 218. This is accomplished, for example, by operating the motor under test conditions and continuously detecting the induced (back-EMF) voltage of the motor to detect the actual angular position of the rotor. This may be done using any known sensorless control scheme, an example of which is described in U.S. Pat. No. 11,171,586, which is incorporated herein by reference in its entirety. The rotor position is utilized to calculate the offset angle between the sense magnet 218 and the permanent magnets 338. The angle sensor decoder 364 is programmed to permanently output rotor angular position as a function of the detected angle plus the offset angle. This configuration significantly reduces inaccuracies associated with high mechanical stack-up tolerances present in conventional sense magnet alignment techniques.

The deck motor 200 assembly process is described herein with reference to FIGS. 18-24.

Figure 18:
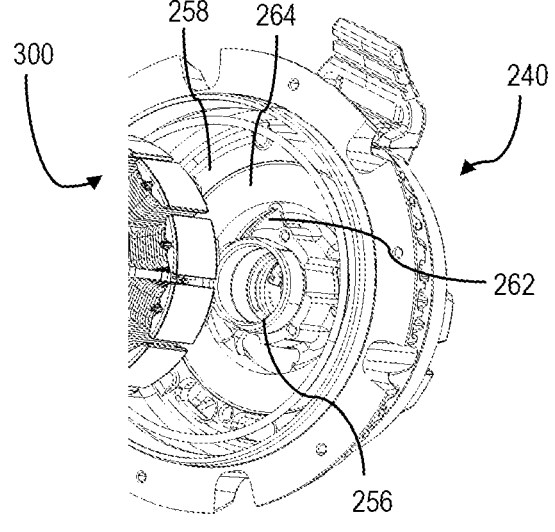
FIG. 18 depicts a partially-exploded view of the stator assembly relative to the second end cap, according to an embodiment.

FIG. 18 depicts a partially-exploded view of the stator assembly 300 relative to the second end cap 240 in a first step of the assembly process, according to an embodiment. In an embodiment, in this step, the stator assembly 300 is received within the second end cap 240, with inner annular body 256 of the second end cap 240 received within the stator collar 312 and at least partially fitted into the body of the stator bore 304. In an embodiment, the stator terminals 310 are received through the series of slots 262 of the second end cap 240. In an embodiment, the stator assembly 300 may be fastened to the second end cap via a series of fasteners.

Figure 19:
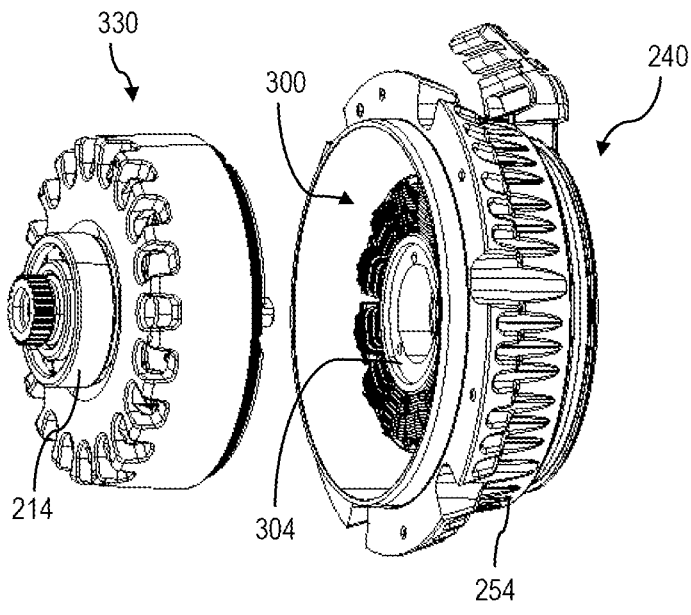
FIG. 19 depicts a partially-exploded view of the rotor assembly relative to the stator and second end cap subassembly, according to an embodiment.

FIG. 19 depicts a partially-exploded view of the rotor assembly 330 relative to the stator and second end cap subassembly in a second step of the assembly process, according to an embodiment. In an embodiment, in this step, the rotor assembly 330 is received into the subassembly consisting of the stator assembly 300 and the second end cap 240, with the rear bearing 216 passing through the stator bore 304 and inserted securely into the inner annular body 256 of the second end cap 240.

Figure 20:
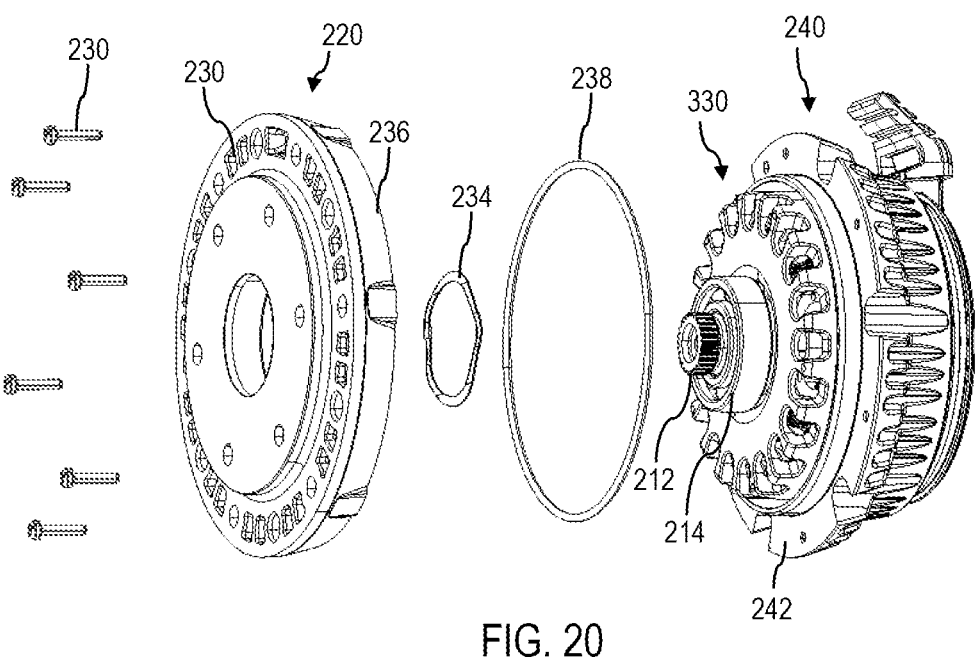
FIG. 20 depicts a partially-exploded view of the first end cap relative to the second end cap and stator/rotor subassembly, according to an embodiment.

FIG. 20 depicts a partially-exploded view of the first end cap 220 relative to the second end cap and stator/rotor subassembly in a third step of the assembly process, according to an embodiment. In an embodiment, in this step, the first O-ring 238 is mounted on flange 242 of the second end cap 240. The wave spring 234 is placed within the center bearing pocket 232 of the first end cap 220. The spline 212 is then passed through the center bearing pocket 232 and the front bearing 214 is securely nested within the center bearing pocket 232 as the first O-ring 238 is sandwiched between the flange 242 of the second end cap 240 and the annular peripheral projection 236 of the first end cap 220. Fasteners 230 are received through peripheral through-holes 228 to secure the first and the second end caps. This process completes the formation of the first compartment 205 for securing the rotor assembly 330 and the stator assembly 300.

Figure 21:
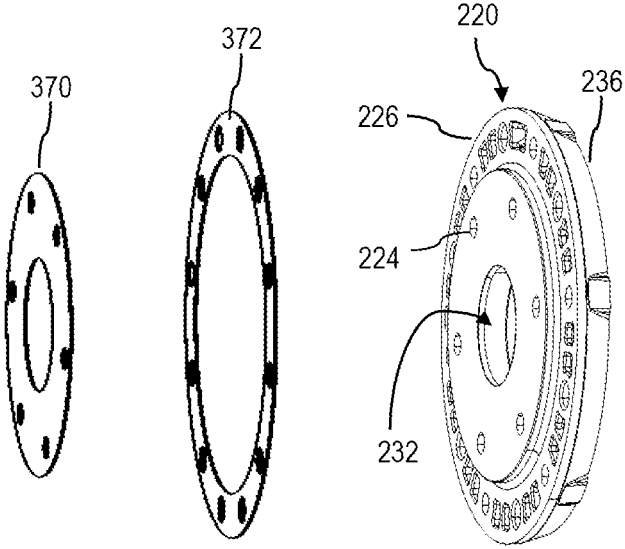
FIG. 21 depicts a perspective view of the first end cap additionally provided with thermally-conductive gap pads, according to an embodiment.

FIG. 21 depicts a perspective view of the first end cap 220 additionally provided with two thermally-conductive gap pads, according to an embodiment. In an embodiment, the bottom surface of the first end cap 220 is provided with two thermally-conductive gap pads to increase thermal conductivity between the deck motor 200 and the mow deck 140. In an embodiment, the two gap pads include a first ring-shaped gap pad 370 attached to the annular outer recessed surface 226 of the first end cap 220, and a second ring-shaped gap pad 372 with a smaller diameter attached to the projected inner circular surface 224 of the first end cap 220. In an embodiment, the gaps pads may be mounted on the bottom surface of the first end cap 220 before or after step three described above.

Figure 22:
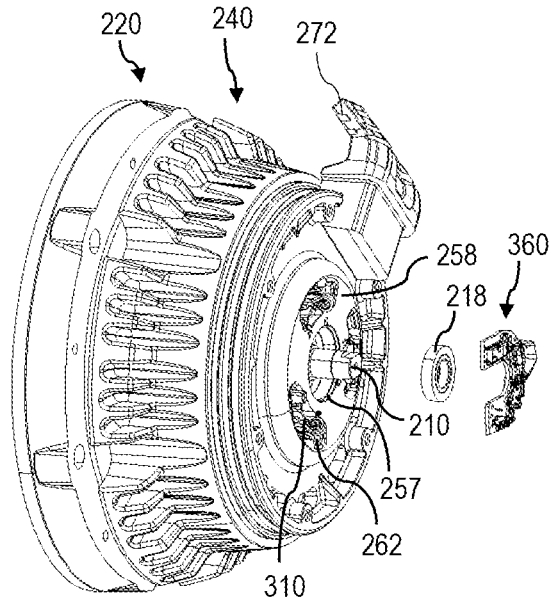
FIG. 22 depicts a partially-exploded view of a Hall assembly relative to the first and second end cap subassembly, according to an embodiment.

FIG. 22 depicts a partially-exploded view of the Hall assembly 360 relative to the first and second end cap subassembly in a fourth step of the assembly process, according to an embodiment. In an embodiment, in this step, the sense magnet 218 is mounted on the motor spindle 210 and inserted into the center opening 257 until it reaches a prescribed location relative to the main radial body 258. In an embodiment, the sense magnet 218 may be secured to the motor spindle 210 using any known method, including but not limited to gluing, clipping, etc. In an embodiment, Hall assembly 360 is then mounted on the main radial body 258 and secured via fasteners or other means.

Figure 23:
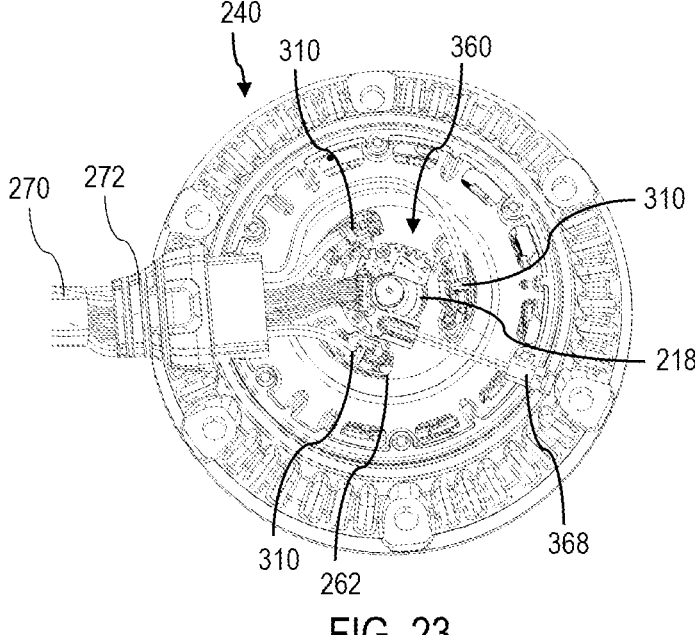
FIG. 23 depicts a perspective view of the motor cup and deck plate subassembly with the Hall assembly and wiring connections, according to an embodiment.

FIG. 23 depicts a top perspective view of the motor cup and deck plate subassembly with the Hall assembly and wiring connections in a fifth step of the assembly process, according to an embodiment. In an embodiment, in this step, the wire cord 270 is passed through the strain relief 272 and appropriate wiring connection is made to the stator terminals 310 and the Hall assembly 360. Further, although not explicitly shown in this figure, thermistor connector 368 is coupling to the temperature signal wire 329 received through one of the slots 262.

Figure 24:
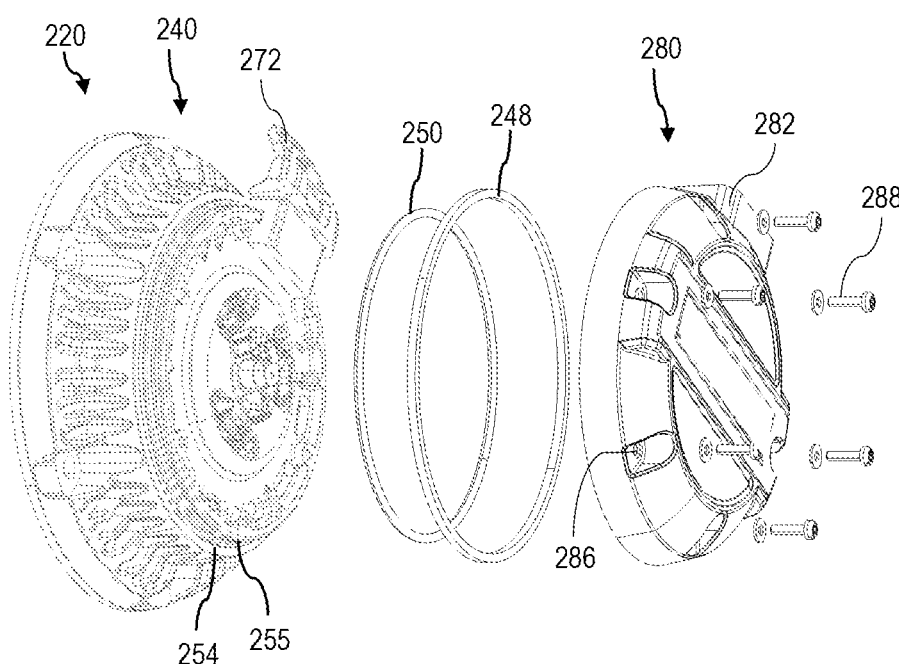
FIG. 24 depicts a partially-exploded view of a motor cover relative to the first and second end cap subassembly, according to an embodiment.

FIG. 24 depicts a partially-exploded view of a motor cover 280 relative to the first and second end cap subassembly in a sixth step of the assembly process, according to an embodiment. In an embodiment, in this step, the second O-ring 248 is mounted on the stepped portion 254 of the second end cap 240, and the third O-ring 250 is received within the annular groove 255 of the second end cap 240. In an embodiment, the above is preferably performed prior to attachment of the wire cord 270 to the stator terminals 310 and the Hall assembly 360 and mounting of the strain relief 272. Thereafter, the motor cover 280 is mounted on the second end cap 240 and fastened via a series of fasteners 288 received through peripheral through-holes 286, with the grommet 282 securely capturing the strain relief 272. This process completes the formation of the second compartment 207 for encapsulating the Hall assembly 360 and the wiring connections and completing the motor sealing process.

Figure 25:
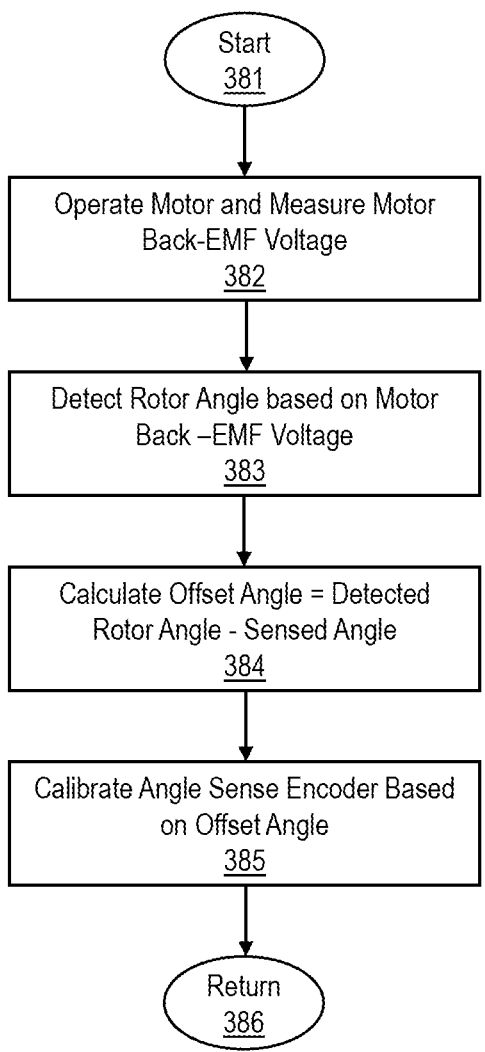
FIG. 25 depicts a flow diagram of a Hall assembly calibration and assembly process, according to an embodiment.

FIG. 25 depicts a flow diagram of a Hall assembly calibration and assembly process 380, according to an embodiment. In an embodiment, after completion of the motor assembly process described above, beginning at step 381, the motor is operated, and the motor back-EMF voltage is measured at step 382. The actual rotor angle is then detected based on the back-EMF voltage of the rotor at step 383. The offset angle is calculated as a function of the difference between the detected rotor angle and the angled sensed by the angle sense encoder at step 384. The angle sense encoder is then permanently programmed and calibrated to adjust the sensed angle by the offset angle from that point on at step 385. The process ends at step 386.

In an embodiment, utilizing at least aspects of the above-described embodiments, the deck motor 200 produces sufficient power to drive the blades at an output speed of approximately 2500 to 3200 rotations-per-minute (RPM) depending on thickness of grass and other conditions. In an embodiment, deck motor 200 produces a maximum power output of at least 3,300 watts, preferably at least 3,500 watts, more preferably at least 3,700 watts; and a continuous (sustained and long—duration) power output of at least 1,550 watts, preferably at least 1,650 watts, more preferably at least 1,750 watts suitable for a high power riding mowing apparatus. In an embodiment, deck motor 200 produces a maximum torque output of at least 10 Newton·meters (N·m.), preferably at least 11 N·m, even more preferably at least 12 N·m; and a rated (long duration and continuous) torque output of at least 3.5 N·m, preferably at least 4 N·m. In an embodiment, the deck motor 200 has a total resistance (from input to output) of less than or equal to 0.044 ohms, preferably less than or equal to 0.04 ohms, more preferably less than or equal to 0.036 ohms. Further, the deck motor 200 has an efficiency of at least 88%, preferably 90%, and even more preferably at least 92%.

In an embodiment, the deck motor 200 provides aforementioned output power, torque, and output speed by utilizing a compact configuration that delivers high power density. In an embodiment, deck motor 200 has a maximum height, as measured from the rear surface of the motor cover 280 to the front surface of the first end cap 220, of at most approximately 14.5 cm, preferably at most approximately 10.8 cm, even more preferably at most approximately 10.1 cm. The maximum outer diameter of the deck motor 200 is at most approximately 21.2 cm, preferably at most approximately 20.7 cm, even more preferably at most approximately 20.3 cm. The total weight of the deck motor 200 is at most 17 lbs, preferably at most 15 lbs, thus providing a maximum power to weight ratio of approximately greater than or equal to 240 watts/lbs.

In an embodiment, referring to FIGS. 5 and 7, the overall axial length (i.e., height) of the motor 200, as defined from the top of the top of the motor cover 280 to the bottom of the projected inner circular surface 224 of the first end cap 220, is approximately in the range of 103 mm to 118 mm, preferably in the range of 107 mm to 114 mm. While this height may vary based on the axial length of the stator lamination stack, in an embodiment, the difference between the overall axial length of the motor 200 and the axial length of the stator lamination stack 302 is smaller than or equal to approximately 85 mm, preferably smaller than or equal to approximately 82 mm. This small relative axial height is made possible by the orientation of the fastening components outside the periphery of the motor end caps 220 and 240, the compact design of the motor cover and the Hall assembly components, the efficiency assembly of the stator mount, among other improvements. It is believed that deck motor 200 offers the lowest profile fully-sealed motor for the amount of power it is able to deliver, which is highly suitable for a mowing application. In an embodiment, a ratio of the maximum power output of the motor 200 to the height of the motor 200 is greater than or equal to approximately 29.7 watts/mm.

In an embodiment, the height of the motor 200 as measured from the top of the mow deck 140 is approximately 8 mm to 12 mm shorter than the overall height of the motor. This due to the design of the projected inner circular surface 224 of the first end cap 220, which allows a part of the motor (including the front bearing 234) to become partially nested into the opening of the mow deck 140. In an embodiment, a ratio of the maximum power output of the motor 200 to the height of the motor 200 as measured from the mow deck 140 is greater than or equal to approximately 34 watts/mm.

Drive Motor

The drive motor 400 is described in detail herein with reference to FIGS. 26 through 35.

Figure 26:
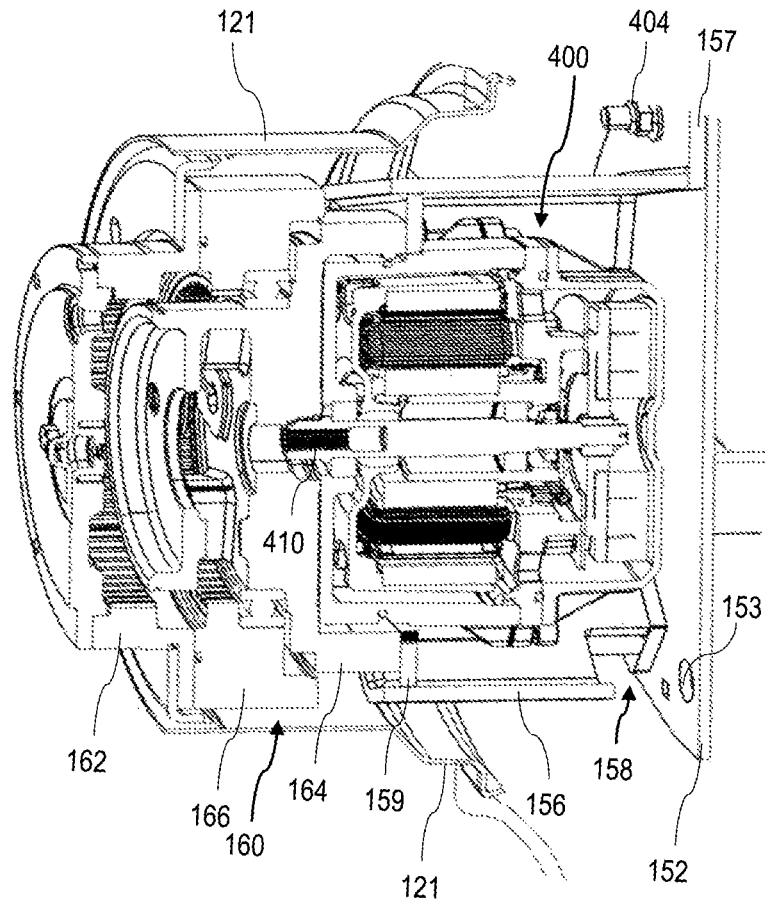
FIG. 26 depicts a cross-sectional perspective view of a drive motor and a transmission assembly having an output hub mounted on the drive motor and secured to the side plate of the main frame, according to an embodiment.
Figure 27:
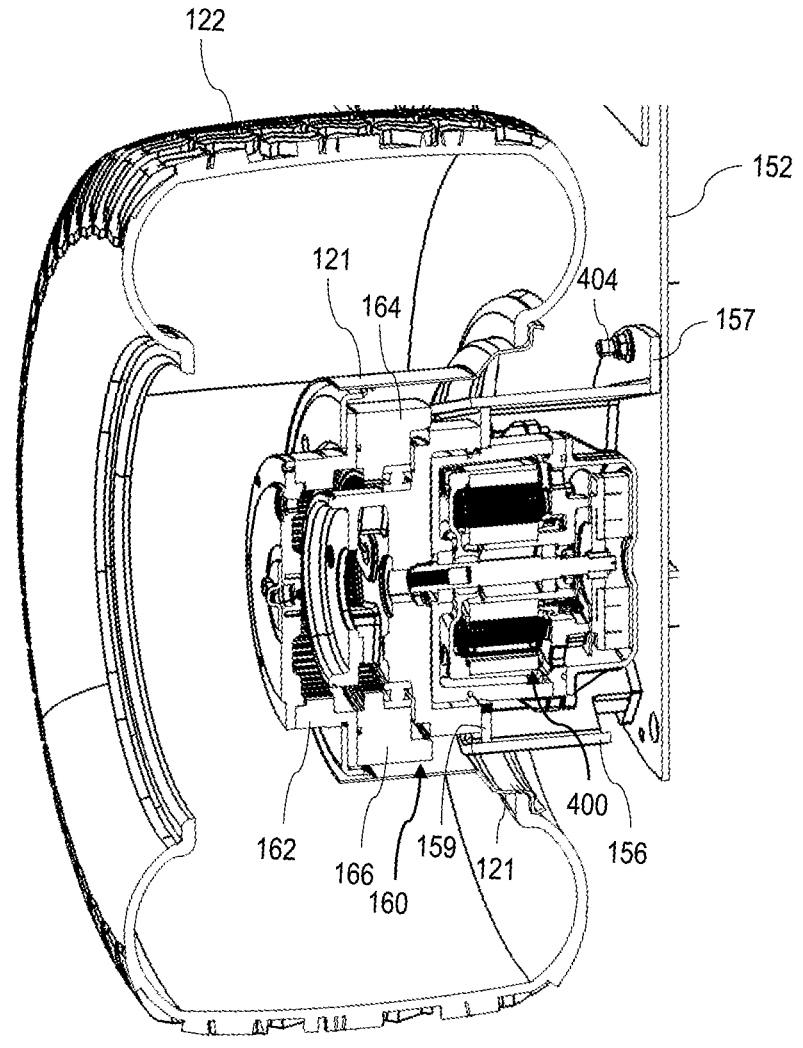
FIG. 27 depicts a cross-sectional perspective view of the drive motor and the transmission assembly with a wheel and a rear tire mounted on the output hub of the transmission assembly, according to an embodiment.
Figure 28:
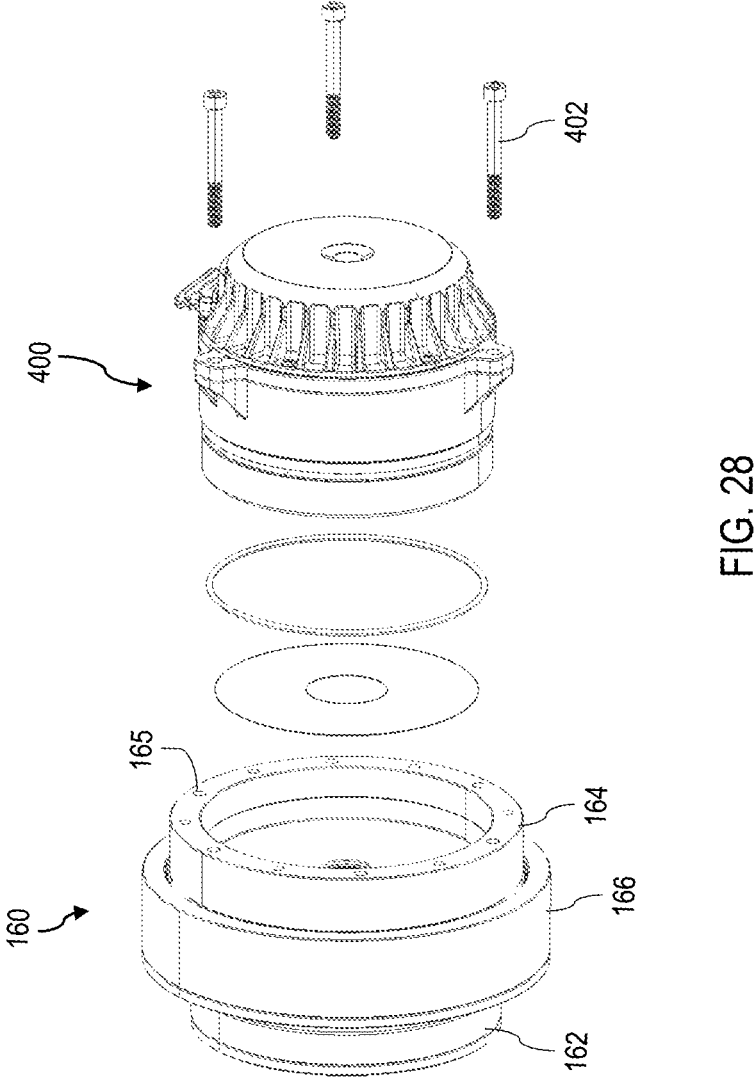
FIG. 28 depicts a partially-exploded view of the drive motor and the transmission assembly, according to an embodiment.

FIG. 26 depicts a cross-sectional perspective view of the drive motor 400 and the transmission assembly 160 having an output hub 162 mounted on the drive motor 400 and secured to the side plate 152 of the main frame 106, according to an embodiment. FIG. 27 depicts a cross-sectional perspective view of the drive motor 400 and the transmission assembly 160 with a wheel 121 and rear tire 122 mounted on the output hub 162 of the transmission assembly 160, according to an embodiment. FIG. 28 depicts a partially-exploded view of the drive motor 400 and the transmission assembly 160, according to an embodiment.

In an embodiment, the transmission assembly 160 is secured to the side plate 152 of the main frame 106 via a mounting bracket 156. Mounting bracket 156 includes an annular flange 157 that is securely fastened to the main frame 106 via a series of frame fasteners 404. The drive motor 400 is disposed within the body of the mounting bracket 156. In an embodiment, mounting bracket 156 includes an opening 158 adjacent a through-hole 153 of side plate 152, through which a wire cord (not shown) is received to the drive motor 400. In an embodiment, the mounting bracket 156 further includes an inwardly-projecting rim 159 formed around the drive motor 400 to which the transmission assembly 160 is securely fastened.

In an embodiment, the transmission assembly 160 includes a mounting frame 164 that is securely fastened to the inwardly-projecting rim 159 of the mounting bracket 156. In an embodiment, the drive motor 400 is also securely fastened to the mounting frame 164. In an embodiment, the mounting frame 164 includes substantially cylindrical body that receives a part of the drive motor 400, and a series of axially-extending threaded openings 165 disposed through the cylindrical body. In an embodiment, the drive motor 400 is securely fastened to a first subset of the threaded openings 165 via a series of outer fasteners 402. In an embodiment, the inwardly-projecting rim 159 of the mounting bracket 156 is securely fastened to a second subset of the threaded openings 165 via another set of fasteners (not shown).

In an embodiment, the distance between the inwardly-projecting rim 159 and the side plate 152 is greater than the distance between the inwardly-projecting rim 159 and a rear end of the drive motor 400 to ensure that an air gap is maintained between the drive motor 400 and side plate 152. This air gap, which may be approximately 8 to 18 mm in an example, protects the drive motor 400 against high impact with the side plate 152 and accounts for the motor stack-up tolerances.

In an embodiment, transmission assembly 160 further includes an intermediate frame 166 to which the output hub 162 is mounted. These components together provide a gear reduction system to convert the rotary output of a motor spindle 410 of the drive motor 400 to a lower speed but higher torque rotary output for driving the output hub 162. In an embodiment, the wheel 121, which supports the rear tire 122, is removably fastened to the output hub 162.

Figure 29A:
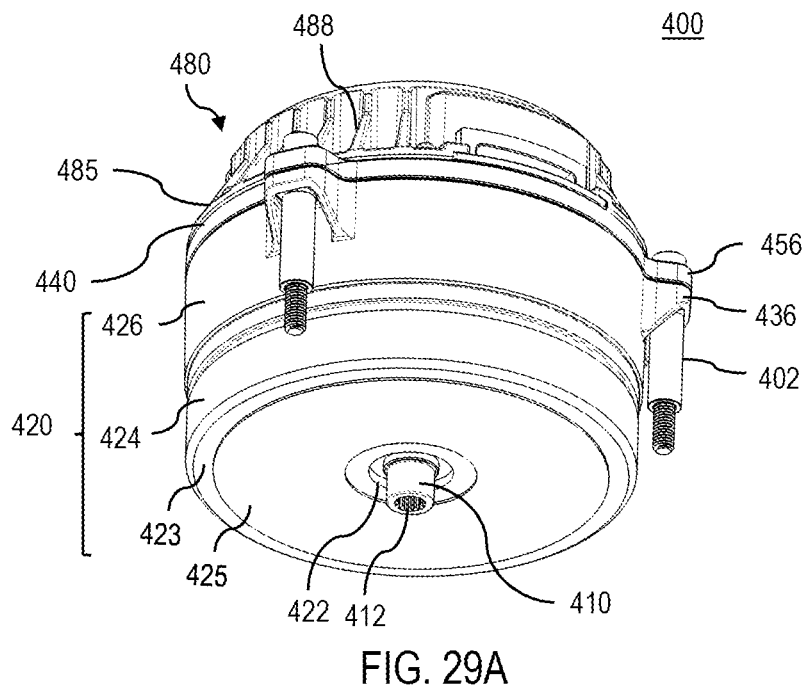
FIGS. 29A and 29B depict perspective views of the drive motor, according to an embodiment.
Figure 29B:
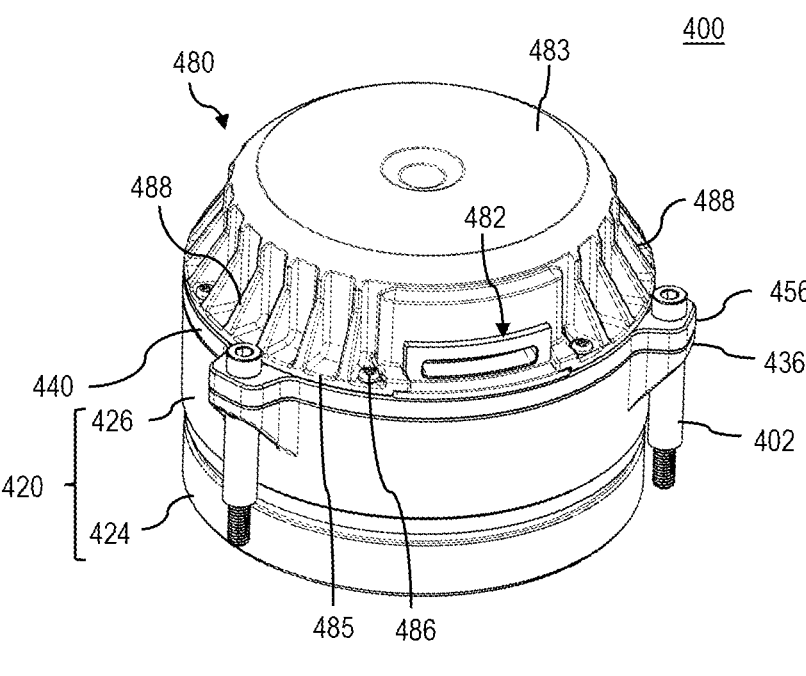
Figure 30:
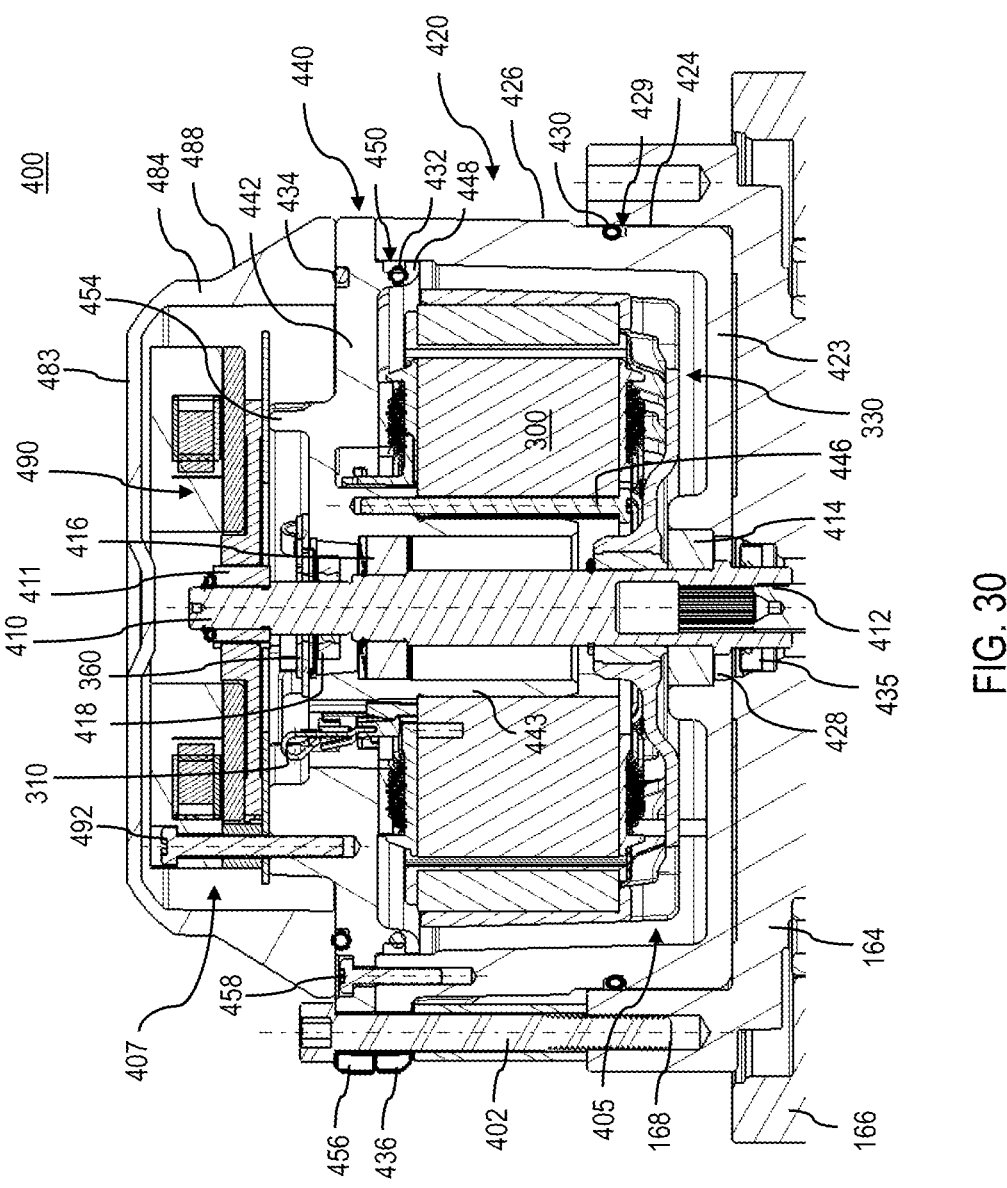
FIG. 30 depicts a cross-sectional view of the drive motor, according to an embodiment.
Figure 31A:
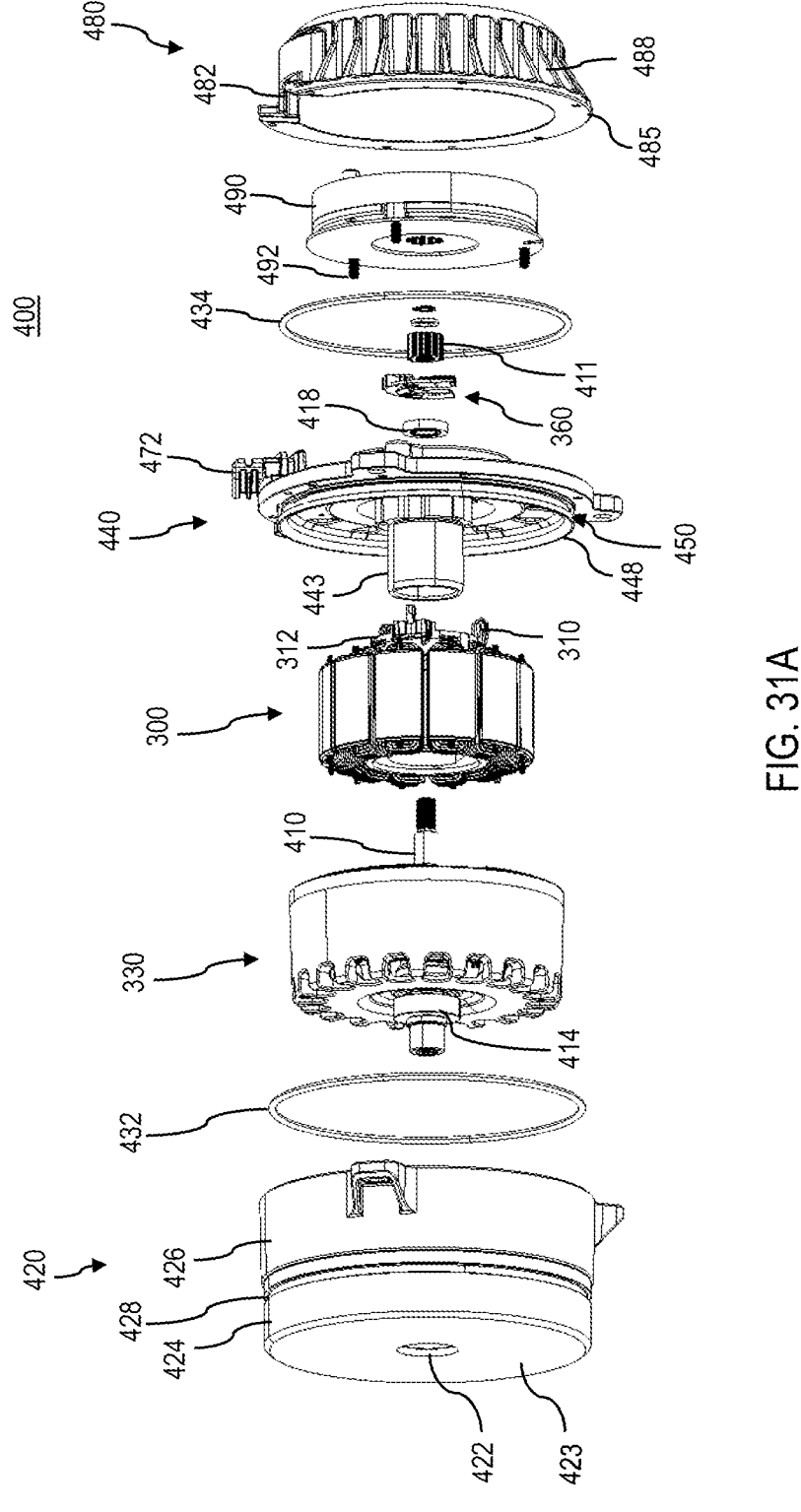
FIGS. 31A and 31B depict perspective exploded views of the drive motor, according to an embodiment.
Figure 31B:
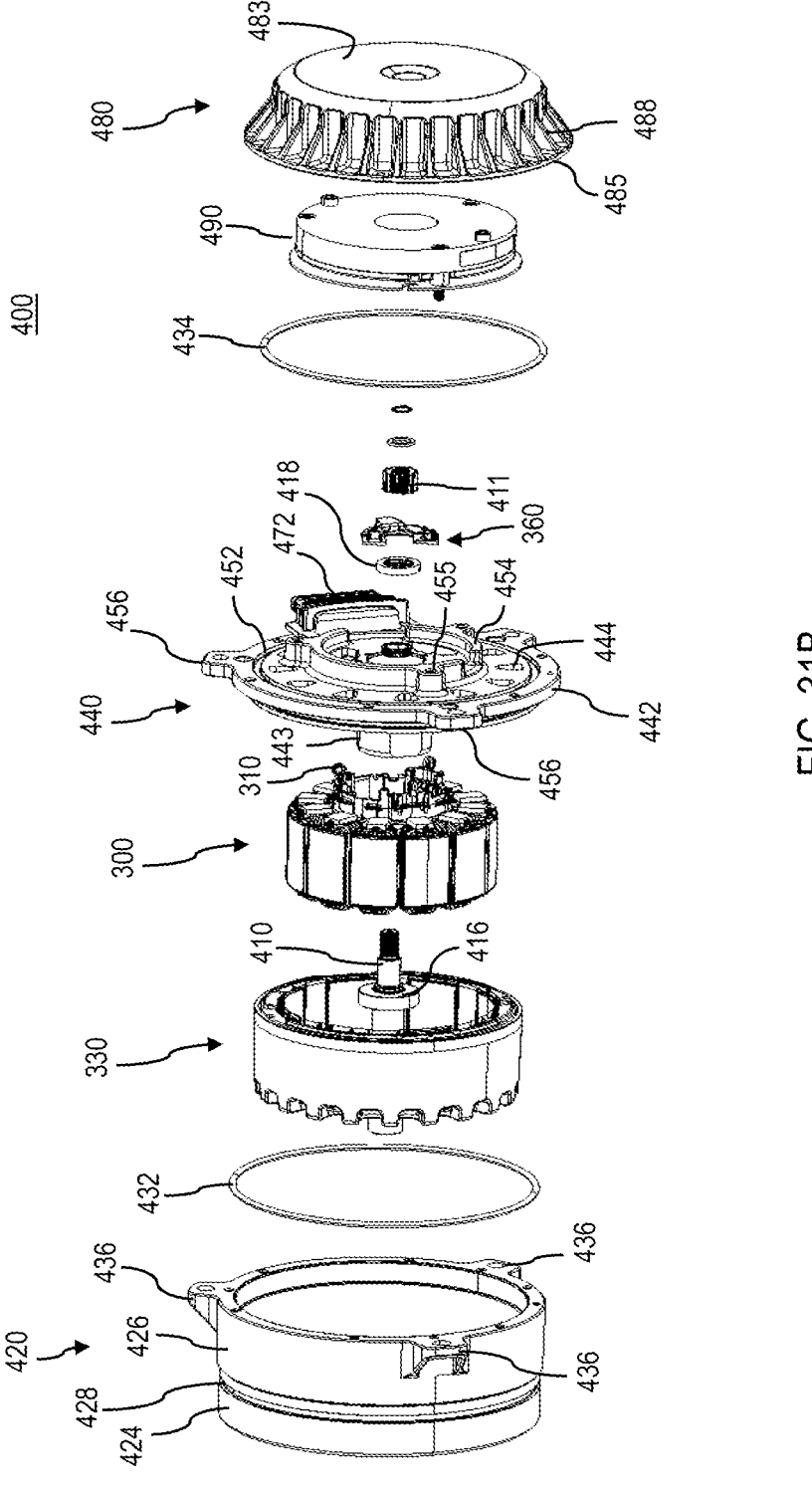

FIGS. 29A and 29B depict perspective views of the drive motor 400, according to an embodiment. FIG. 30 depicts a cross-sectional view of the drive motor 400, according to an embodiment. FIGS. 31A and 31B depict perspective exploded views of the drive motor 400, according to an embodiment.

As shown in these figures, in an embodiment, drive motor 400 is an outer-rotor BLDC motor with a similar stator assembly 300, rotor assembly 330, and Hall assembly 360 construction described above. In an embodiment, an axial length of the stator and rotor assemblies utilized in the drive motor 400 may be greater than that utilized in the deck motor 200 to delivery higher output power required to drive the electric lawn apparatus 100. In an embodiment, rotor assembly 330 as used in the drive motor 400 is an eight pole rotor and includes a series of eight permanent magnets 338. In an embodiment, stator lamination stack 302 in the drive motor 400 has an axial length of approximately 38-52 mm, preferably approximately 42-48 mm, and a diameter of approximately 100-130 mm, preferably approximately 110-115 mm. Thus, in an embodiment, the stator lamination stack in the drive motor 400 has a diameter to length ratio of approximately between 2 to 3. In an embodiment, the stator windings are wound in a parallel-delta configuration.

In an embodiment, drive motor 400 further includes a motor spindle 200; a first end cap 420, also referred to herein as a motor case; a second end cap 440, also referred to herein as a motor cup or stator mount; and a motor cover 480. Like the deck motor 200, components together form a motor housing that fully encapsulates and seals the motor components.

In an embodiment, motor spindle 410 extends axially through the drive motor 400 and includes a front bearing 414 and a rear bearing 416. In an embodiment, the two bearings have approximately the same outer diameter. In an embodiment, a sense magnet 418 is mounted near a rear end of the motor spindle 410. Further, in an embodiment, a pinion 411 is mounted on the rear end of the motor spindle 410 for coupling to an electro-magnetic brake 490 discussed later. In an embodiment, a front end of the motor spindle 410 forms a spline 412, in this example a female spline, arranged to mate with a male spline of the transmission assembly 160.

In an embodiment, the first end cap 420 includes a radial portion 423 defining a center opening 422 through which the front end of the motor spindle 410 projects out of the drive motor 400. In an embodiment, a bottom (front) surface of the radial portion 423 is substantially flat for attachment with the transmission assembly 160. In an embodiment, a thermally-conductive gap pad 425 is mounted on the front surface of the radial portion 423 for enhanced thermal conductivity between the drive motor 400 and the transmission assembly 160, thus allowing heat from the drive motor 400 to dissipate more effectively through the transmission assembly 160.

In an embodiment, the first end cap 420 includes a front cylindrical body 424 extending from the radial portion 423 and having a first diameter sized to be received within the mounting frame 164 of the transmission assembly 160, and a rear cylindrical body 426 extending from the front cylindrical body 424 having a second diameter that is larger than the first diameter and is disposed outside the body of the mounting frame 164. In an embodiment, the front and rear cylindrical bodies 424 and 426 together fully surround the stator and rotor assemblies 300 and 330.

In an embodiment, a rear surface of the radial portion 423 forms a center bearing pocket (or bearing holder) 428 coaxial with the center opening 422 and having a larger diameter than the center opening 422. The center bearing pocket 428 receives the front bearing 414 of the motor spindle 410 to provide axial and radial support for the motor spindle 410 relative to the first end cap 420.

In an embodiment, the outer surface of the front cylindrical body 424 includes an annular groove 429 formed circumferentially therein that receives a portion of a first O-ring 430 therein. In an embodiment, the first O-ring 430 is securely fitted between an inner surface of the mounting frame 164 and the outer surface of the front cylindrical body 424 to substantially seal the drive motor 400 against ingress of air or water. In an embodiment, a bearing seal 435 is further mounted around the front end of the motor spindle 410 that substantially seals the center opening 422.

In an embodiment, the second end cap 440 includes a substantially radial body 442 positioned between the first end cap 420 and the motor cover 480 configured to mate with the first end cap 420 to form a first compartment 405 around the stator assembly 300 and the rotor assembly 330, and a second compartment 407 around the Hall assembly 360 and the wiring connections. In an embodiment, the first and second compartments are in fluid communication through a series of openings 444 formed through the second end cap 440. However, the second end cap 440 forms fully-sealed connections with the first end cap 420 and the motor cover 480 around the first and second compartments to substantially block ingress of liquid and air into the drive motor 400. In an embodiment, these include a second O-ring 432 disposed between the first end cap 420 and the second end cap 440, and a third O-ring 434 disposed between the second end cap 440 and the motor cover 480. In an embodiment, these seals provide a substantially and/or fully water-tight and a substantially and/or fully airtight motor housing around the internal motor components including the stator assembly 300, the rotor assembly 330, and the Hall assembly 360, with no air inlets or outlets to allow ingress of water or air inside the motor housing.

In an embodiment, the second end cap 440 includes a front annular projection 448 that is securely received, e.g., via slip-fitting or press-fitting, into the rear cylindrical body 426 of the first end cap 420. The front annular projection 448 includes an annular groove 450 formed circumferentially therein in the radial direction that receives the second O-ring 432 therein. The second O-ring 432 substantially seals the gap between the first and second end caps.

In an embodiment, the second end cap 440 further includes a cylindrical stator mount 443 projecting from its front surface radially inwardly of the front annular projection 448. The stator mount 443 is sized to be securely received, e.g. via slip-fitting or press-fitting, into at least a portion of the stator bore 304 of the stator assembly 300. In an embodiment, the rear end of the stator mount 443 forms a bearing pocket that securely received and supports the rear bearing 416 therein to provide axial and radial support for the motor spindle 410 relative to the second end cap 440. In an embodiment, stator assembly 300 may be fastened to the second end cap 440 via a series of fasteners 446.

In an embodiment, the second end cap 440 further includes a circular groove 452 formed along the axial direction in its rear surface facing the motor cover 480. In an embodiment the circular groove 452 receives the third O-ring 434 to substantially seal the gap between the second end cap 440 and the motor cover 480.

In an embodiment, the second end cap 440 further includes an annular or semi-annular rear wall 454 that is radially inward from the circular groove 452. In an embodiment, the Hall assembly 360 is mounted within the rear wall 454. In an embodiment, the stator terminals 310 also protrude through the second end cap 440 and are contained within the rear wall 454. Further, in an embodiment, rear wall 454 provides a mounting platform for mounting the electro-magnetic brake 490. In an embodiment, rear wall 454 includes a series of threaded openings 455 that receive a series of fasteners 492 to fasten the electro-magnetic brake 490 to the rear wall 454.

In an embodiment, the electro-magnetic brake 490, shown in at least FIGS. 30 and 31A, is provided as a safeguard in the parked position of the electric lawn apparatus 100. In an embodiment, the electro-magnetic brake 490 receives the pinion 411 of the motor spindle 410 and includes a friction disk mounted onto the pinion 411. The electro-magnetic brake 490 further includes a second plate that selectively engages the friction disk. When the electro-magnetic brake 490 is powered, it pulls the second plate away from the friction disk, therefore allowing the pinion 411 and the rotor spindle 410 to rotate freely. When it is not powered, the second plate is spring loaded to make contact with the friction disk to stop the rotation of the pinion 411 and the rotor spindle 410.

In an embodiment, a strain relief 472 of a wire cord (not shown) is mounted on the rear surface of the second end cap 440 to allow the end of the wire cord to be received into the rear wall 454 for connection with the Hall assembly 360, the stator terminals 310, and the electro-magnetic brake 490. In an embodiment, as discussed below, the motor cover 480 forms a seal around the strain relief 272.

In an embodiment, the second end cap 440 is securely fastened to the first end cap 420 via a series of fasteners 458. Further, in an embodiment, first and second end caps 420 and 440 respectively include a series of radially-projecting flanges 436 and 456 including through-holes that align to receive the outer fasteners 402. Outer fasteners 402 are inserted from a rear of the second end cap 440, traversed along or adjacent to the outer surface of the first end cap 420, and securely fastened into threaded openings 168 of the mounting frame 164 of the transmission assembly 160.

In an embodiment, the motor cover 480 encapsulates the second compartment 407 to complete the motor seal. In cooperation with other sealing components described above, the motor cover 480 protects motor power and signal wiring connections, the Hall assembly 360, the sense magnet 218, the electro-magnetic brake 490, and other motor components against ingress of water and contaminated air. Further, in an embodiment, the motor cover 480 cooperates with the second end cap 440 to form a grommet 482 around the strain relief 472 and fully seal the area around the strain relief 472.

In an embodiment, the motor cover 480 includes a radial encapsulation body 483, an annular wall 484 extending in the direction of the second end cap 440, and a flange 485 extending radially outwardly from a front end of the annular wall 484. In an embodiment, the flange 485 is mounted on the second end cap 440 with the third O-ring 434 in between and fastened to the second end cap 440 via a series of fasteners 486. In an embodiment, extending longitudinally between the annular wall 484 and the flange 485 are a series of fins 488 having sloped outer edges arranged to increase the outer surface area of the motor cover 480 for improved heat transfer from the drive motor 400. In an embodiment, the motor cover 480 is made of heat conductive material such as aluminum, thus acting as a heat sink for the drive motor 400 components.

In an embodiment, in addition to the motor cover 480, the first end cap 420 and the second end cap 440 are also made, fully or at least partially, of thermally-conducive material such as metal. These components, in addition to thermal gap pads and other features described below in detail, provide an effective thermal management system for the drive motor 400 despite its high voltage and power output.

The drive motor 400 assembly process is described herein with reference to FIGS. 32-35.

Figure 32:
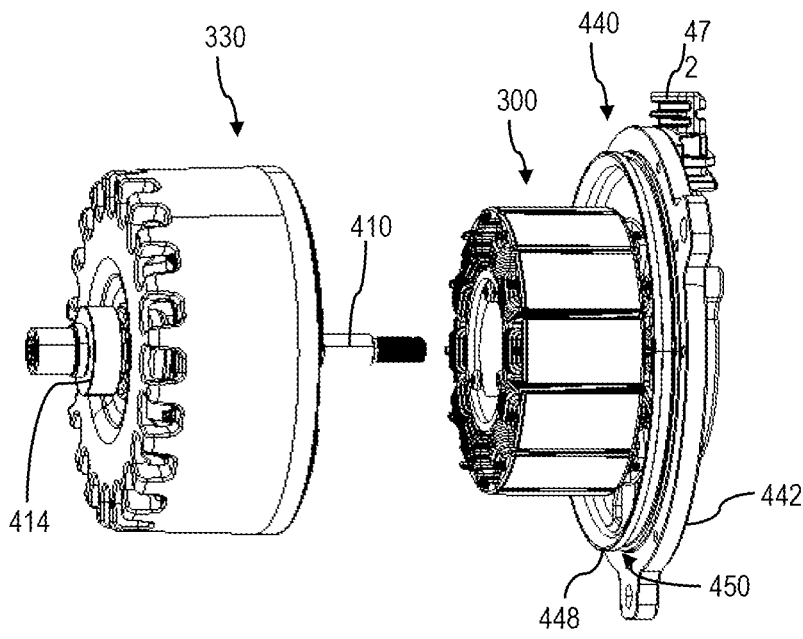
FIG. 32 depicts a partially-exploded view of the rotor assembly relative to a subassembly consisting of the stator assembly and the second end cap, according to an embodiment.

FIG. 32 depicts a partially-exploded view of the rotor assembly 330 relative to a subassembly consisting of the stator assembly 300 and the second end cap 440, according to an embodiment.

In an embodiment, in a first step of the assembly process, the stator assembly 300 is mounted on the second end cap 440, with stator mount 443 of the second end cap 440 received within the stator collar 312 and at least partially fitted into the body of the stator bore 304. In an embodiment, the stator terminals 310 are received through the series of slots provided in the second end cap 440. In an embodiment, the stator assembly 300 may be fastened to the second end cap 440 via fasteners 445.

In an embodiment, in a second step of the assembly process, the rotor assembly 330 is received into the subassembly consisting of the stator assembly 300 and the second end cap 440, with the rear bearing 416 passing through the stator bore 304 and inserted securely into the stator mount 443 of the second end cap 440.

Figure 33:
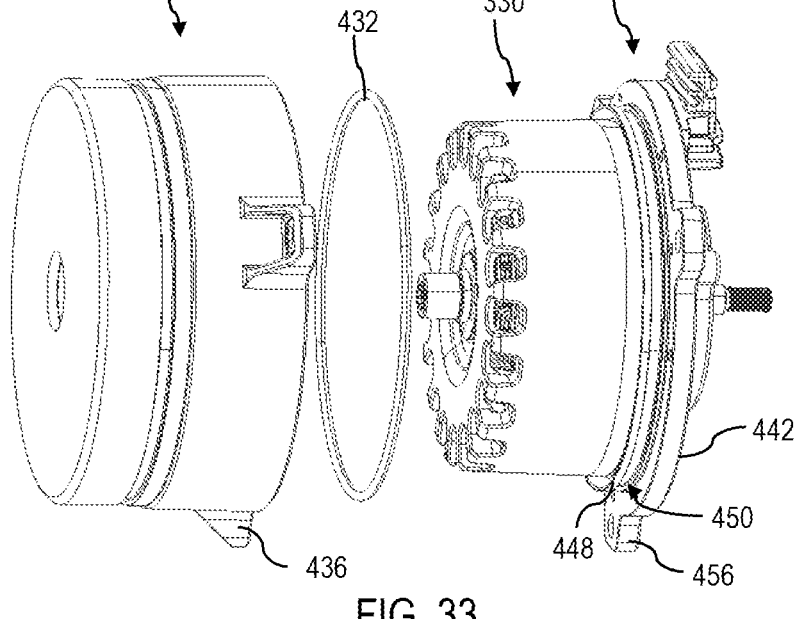
FIG. 33 depicts a partially-exploded view of the first end cap relative to the second end cap and stator/rotor subassembly, according to an embodiment.

FIG. 33 depicts a partially-exploded view of the first end cap 420 relative to the second end cap and stator/rotor subassembly in a third step of the assembly process, according to an embodiment. In an embodiment, in this step, the second O-ring 432 is mounted into the annual groove 450 of the front annular projection 448 of the second end cap 440. The first end cap 420 is mounted around the rotor assembly 330 and slid round the front annular projection 448 in contact with the second O-ring 432 with the radially-projecting flanges 436 and 456 aligned until the first end cap 420 meets the radial body 442. In an embodiment, the second end cap 440 is fastened to the first end cap via fasteners 458.

Figure 34:
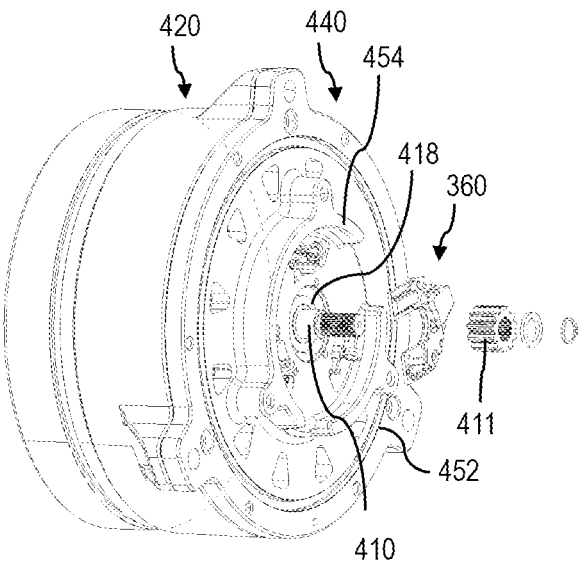
FIG. 34 depicts a partially-exploded view of the Hall assembly relative to the first and second end cap subassembly, according to an embodiment.

FIG. 34 depicts a partially-exploded view of the Hall assembly 360 relative to the first and second end cap subassembly in a fourth step of the assembly process, according to an embodiment. In an embodiment, in this step, the sense magnet 418 is mounted on the motor spindle 410 and inserted into the center opening until it reaches a prescribed location relative to the radial body 442. In an embodiment, the sense magnet 418 may be secured to the motor spindle 410 using any known method, including but not limited to gluing, clipping, etc. In an embodiment, Hall assembly 360 is then mounted on the radial body 442 within the rear wall 454 and secured via fasteners or other means. The pinion 411 is also mounted to the rear end of the motor spindle 410.

Figure 35:
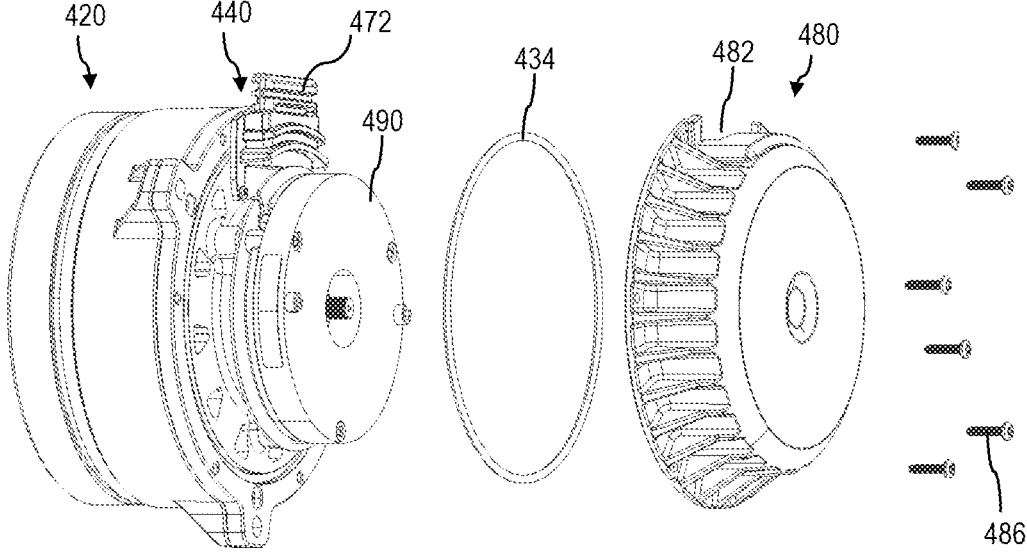
FIG. 35 depicts a partially-exploded view of a motor cover relative to the first and second end cap subassembly, according to an embodiment.

FIG. 35 depicts a partially-exploded view of a motor cover 480 relative to the first and second end cap subassembly, according to an embodiment.

In an embodiment, in a fifth step of the assembly process, the wire cord (not shown) is passed through the strain relief 472 and appropriate wiring connection is made to the stator terminals 310 and the Hall assembly 360. Further, although not explicitly shown in this figure, proper connections to a stator thermistor and the electro-magnetic brake 490 are also made. In an embodiment, the third O-ring 434 is mounted into the circular groove 452 and the strain relief 272 is fixed to the rear wall 454.

In an embodiment, in a sixth step of the assembly process, the motor cover 480 is mounted on the second end cap 440 and fastened via a series of fasteners 486, with the grommet 482 securely capturing the strain relief 472. This process completes the formation of the second compartment 407 for encapsulating the Hall assembly 360 and the wiring connections and completing the motor sealing process.

In an embodiment, utilizing at least aspects of the above-described embodiments, the drive motor 400 produces sufficient power to drive the electric lawn apparatus 100 at a top speed of at least approximately 10 to 15 mph. In an embodiment, drive motor 400 produces a maximum power output of at least 6,200 watts, preferably at least 6,600 watts, more preferably at least 7,000 watts; and a continuous (sustained and long—duration) power output of at least 3,200 watts, preferably at least 3,350 watts, more preferably at least 3,500 watts suitable for a high power riding mowing apparatus. In an embodiment, drive motor 400 produces a maximum torque output of at least 14 Newton·meters (N·m.), preferably at least 15 N·m, even more preferably at least 16 N·m; and a rated (long duration and continuous) torque output of at least 6 N·m, preferably at least 7 N·m. In an embodiment, the drive motor 400 has a total resistance (from input to output) of less than or equal to 0.02 ohms, preferably less than or equal to 0.015 ohms, more preferably less than or equal to 0.011 ohms. Further, the drive motor 400 has an efficiency of at least 87%, preferably 89%, and even more preferably at least 91%.

In an embodiment, the drive motor 400 provides aforementioned output power, torque, and output speed by utilizing a compact configuration that delivers high power density. In an embodiment, drive motor 400 has a maximum height, as measured from the rear surface of the motor cover 480 to the front surface of the first end cap 420, of at most approximately 14.5 cm, preferably at most approximately 13.9 cm, even more preferably at most 13.4 cm. In an embodiment, a height of the drive motor 400 and the transmission assembly 160 together is at most approximately 25.6 cm, preferably at most approximately 24.8 cm, even more preferably at most 24.4 cm. The outer diameter of the drive motor 400 as measured around the second end cap 440 or the first end cap 420, not including the flanges 436 and 456 and fasteners 402, is at most approximately 18 cm, preferably at most approximately 17.7 cm, even more preferably at most approximately 17.4 cm. The total weight of the drive motor 400 is at most 20 lbs, preferably at most 18 lbs, thus providing a maximum power to weight ratio of approximately greater than or equal to 375 watts/lbs.

Motor Control

The mechanism, construction, and circuitry for controlling the deck motors 200 and the drive motors 400 is described herein.

Figure 36:
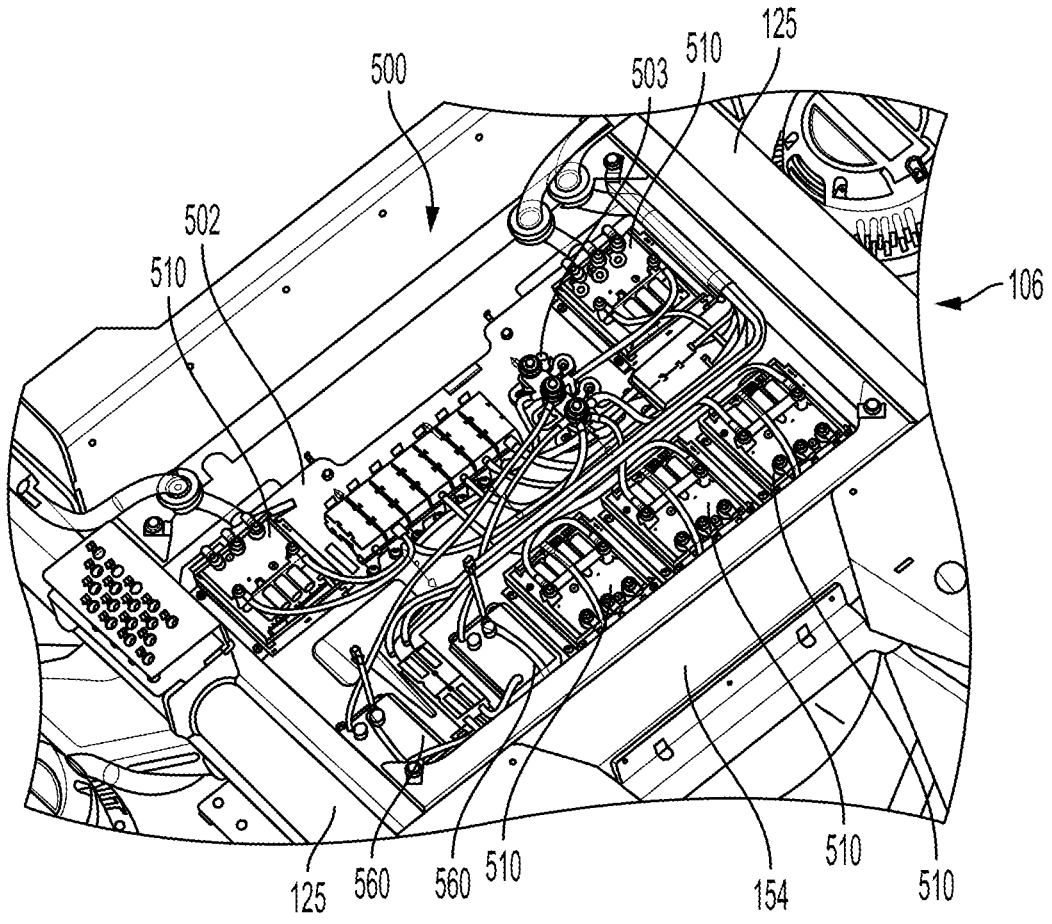
FIG. 36 depicts a partial top perspective view of a motor control panel mounted on the main frame of the electric lawn apparatus, according to an embodiment.

FIG. 36 depicts a partial top perspective view of a motor control panel 500 mounted on the main frame 106 of the electric lawn apparatus 100, according to an embodiment. In an embodiment, as previously described, motor control panel 500 includes a metal (e.g., steel) plate 502 securely received into a cavity of the lower support body 154. The metal plate 502 acts as a heat carrier for various components mounted on its top surface. In an embodiment, a series of five control and power modules 510 (e.g., in this example five) are mounted on the metal plate 502, three of which are used for controlling supply of electric power into the deck motors 200 and two of which do the same for the drive motors 400. In addition, two regenerative energy control modules 560 are also mounted on the control panel 500 that, as will be described in detail, monitor the voltage on bus lines between the motors and the batteries and absorbs any excess voltage above a threshold that may be present due to induced regenerative energy of the motors to protect the batteries and other electronics. In an embodiment, other electronics and circuitry for power supply management may be further mounted on the motor control panel 500. In an embodiment, a connector 503 provides proper connections to and from the control and power modules 510 and the regenerative energy control modules 560. In an embodiment, the motor control panel 500 is covered by the footrest platform 132 so as to be disposed below the feet of the operator in the seated configuration of the electric lawn apparatus 100.

In an embodiment, the metal plate 502 has a total surface area that is smaller than or equal to approximately 755 in^2, preferably smaller than or equal to approximately 740 in^2, even more smaller than or equal to approximately 725 in^2. In an embodiment, each control and power modules 510 occupies an area that is smaller than or equal to approximately 19.5 in^2, preferably smaller than or equal to approximately 18 in^2, more preferably smaller than or equal to approximately 16.5 in^2.

Figure 37:
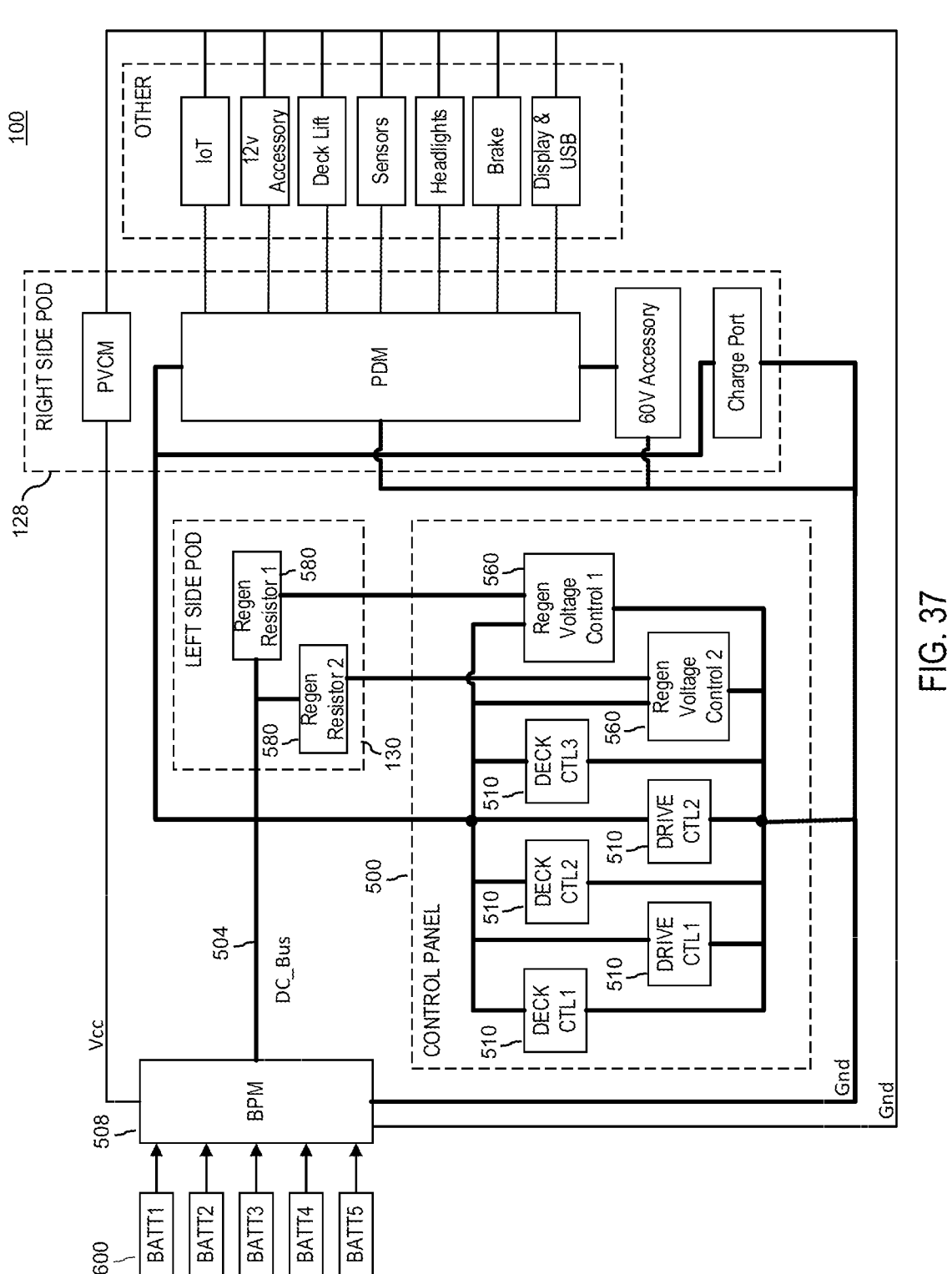
FIG. 37 depicts an electrical block diagram of the electric lawn apparatus, according to an embodiment.

FIG. 37 depicts an electrical block diagram of the electric lawn apparatus 100, according to an embodiment.

In an embodiment, electric lawn apparatus 100 receives direct-current (DC) electric power from a series of (in this example five) battery packs 600 removably provided within the battery compartment 126. In an embodiment, a battery protection module (BPM) 508 is mounted within the main frame 106 of the electric lawn apparatus 100 to control the supply of electric power from the battery packs 600. In an embodiment, the BPM 508 may also control charging of the battery packs 600. In an embodiment, high voltage (e.g., approximately 40-80 volts maximum voltage, preferably approximately 60 volts maximum voltage and 54 volts nominal voltage) electric power from the battery packs 600 is supplied by the BPM 508 via a DC bus line 504 for powering the deck motors 200 and drive motors 400. In an embodiment, a lower voltage power supply line Vcc (e.g., approximately 12 volts) is provided to for powering accessories, displays and other features of the electric lawn apparatus 100.

In an embodiment, each battery pack 600 includes a plurality of battery cells configured to output a nominal voltage of approximately 54 volts and a battery capacity of 60 ampere·hours. As discussed previously, in an embodiment, each battery pack 600 has an impedance of approximately 30 mOhms.

In an embodiment, control panel 500 receives the DC bus line 504 and powers each of the five control and power modules 510 and regenerative energy control modules 560. In an embodiment, each of the five control and power modules 510 is coupled to a respective deck motor 200 or drive motor 400.

In an embodiment, the left operator side pod 130 of the electric lawn apparatus 100 houses one or more regenerative energy absorbing modules 580. In an embodiment, the regenerative energy absorbing modules 580 are respectively activated by the regenerative energy control modules 560 when high voltage greater than a threshold, which may be generated during the braking of one of the motors, is detected on the DC bus line 504.

In an embodiment, the right operator side pod 128 of the electric lawn apparatus 100 houses a charging port, which supply current to the BPM 508 via the DC bus line 504 for charging the battery packs 600, an accessory, a power delivery module (PDM), and a Premium Vehicle Control Module (PVCM). In an embodiment, PDM is a voltage regulator that supplies electric power from the DC bus 504 to various component and accessories such as the display interface 112, the electro-magnetic brakes 490, headlights, sensors, deck lift (operable for lowering and lifting the mow deck 140), a 12 v accessory, and Internet-of-Things (IoT) module. In an embodiment, the PVCM is a control unit that controls various operations of the electric lawn apparatus.

Figure 38:
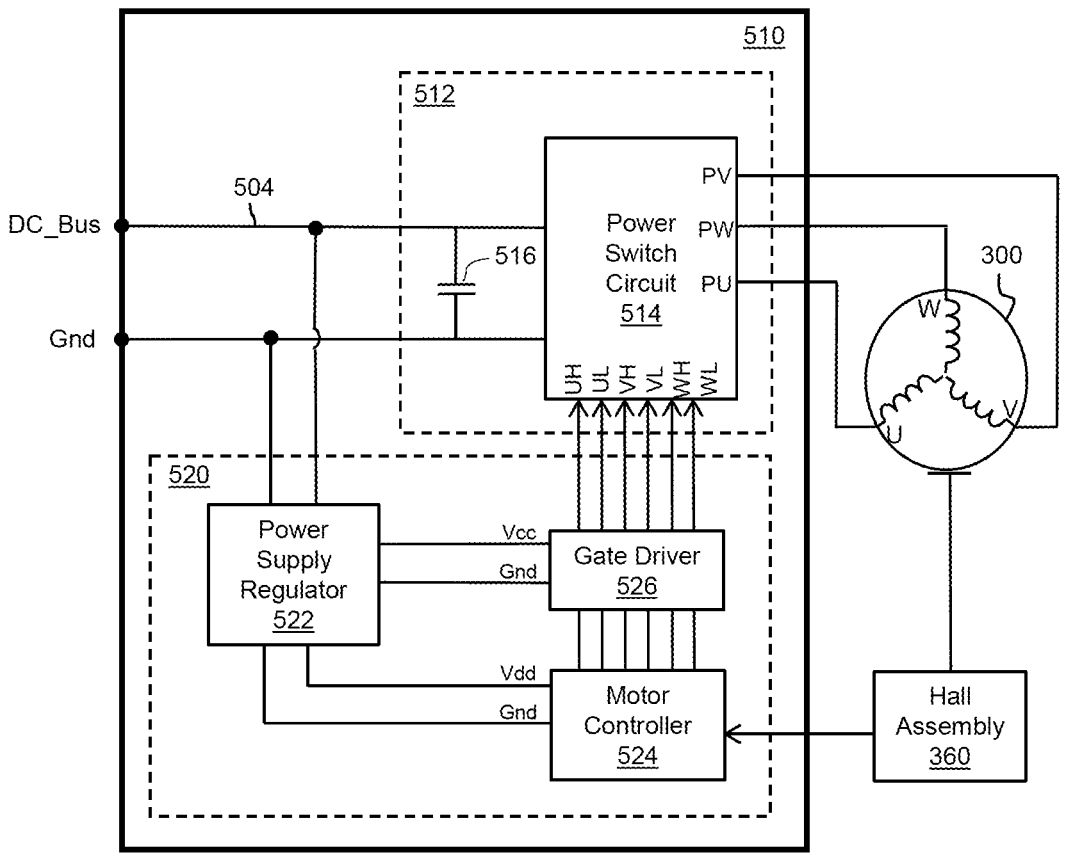
FIG. 38 depicts a block circuit diagram of a control and power module mounted on the motor control panel and in connection with a stator assembly of a corresponding deck or drive motor, according to an embodiment.

FIG. 38 depicts a block circuit diagram of a control and power module 510 in connection with a stator assembly 300 of a deck motor 200 or drive motor 400, according to an embodiment. In an embodiment, control and power module 510 includes a power unit 512 and a control unit 520.

In an embodiment, power unit 512 may include a power switch circuit 514 coupled between the DC bus line 504 and the stator assembly 300 to drive the motor. In an embodiment, power switch circuit 514 may be a three-phase bridge driver circuit including six controllable semiconductor power devices (e.g. FETs, BJTs, IGBTs, etc.). In an embodiment, power unit 512 may further include a DC bus capacitor 516 provided across the DC bus line 504 and Gnd.

In an embodiment, control unit 520 include a motor controller 524, a gate driver 526, a power supply regulator 522. In an embodiment, motor controller 524 is a programmable device arranged to control a switching operation of the power devices in power switching circuit 514. In an embodiment, motor controller 524 receives rotor rotational position signals from the Hall assembly 360 or other types of positional sensors that interact with the rotor. It should also be noted, however, that motor controller 524 may be configured to calculate or detect rotational positional information relating to the motor rotor using a sensorless control technique such as field-oriented control. In an embodiment, motor controller 524 may also receive a variable-speed signal that relates to the desired speed of the deck motors 200 (e.g., a desired blade speed set by the operator) and/or the drive motor 400 (e.g., directly from the foot pedal 134 and 136 or via an intermediary control system such as the PVCM). Based on the rotor rotational position signals from the position sensors 238 and the variable-speed signal, motor controller 524 controls a pulse-width modulation (PWM) control of drive signals UH, VH, WH, UL, VL, and WL through the gate driver 526, which provides a voltage level needed to drive the gates of the semiconductor switches within the power switch circuit 514 in order to control a PWM switching operation of the power switch circuit 514.

In an embodiment, power supply regulator 522 may include one or more voltage regulators to step down the power supply to a voltage level compatible for operating the motor controller 524 and/or the gate driver 526. In an embodiment, power supply regulator 522 may include a buck converter and/or a linear regulator to reduce the power voltage of the DC bus line 504 to, for example, 15V for powering the gate driver 526, and down to, for example, 3.2V for powering the motor controller 524.

Figure 39:
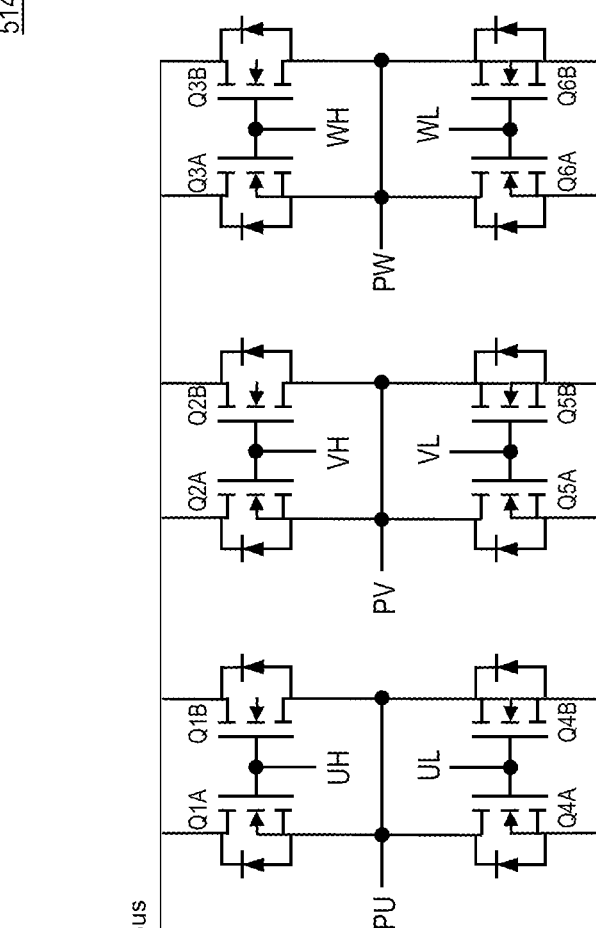
FIG. 39 depicts a circuit diagram of a power switch circuit of the control and power module, according to an embodiment.

FIG. 39 depicts a circuit diagram of the power switch circuit 514, according to an embodiment. As shown herein, the three-phase inverter bridge circuit includes three pairs of high-side FETs (Q1A and Q1B, Q2A and Q2B, and Q3A and Q3B) and three pairs of low-side FETs (Q4A and Q4B, Q5A and Q5B, and Q6A and Q6B). The FETs in each pair are provided in parallel to reduce the load on each FET. The gates of the high-side pair of FETs are driven via drive signals UH, VH, and WH, and the gates of the low-side pairs of FETs are driven via drive signals UL, VL, and WL. In an embodiment, the drains of the high-side pairs of FETs are coupled to the sources of the low-side pairs of FETs to output power signals PU, PV, and PW for driving the motor.

The mechanical construction of the control and power module 510 is described herein with reference to FIGS. 40-45, according to an embodiment.

Figure 40:
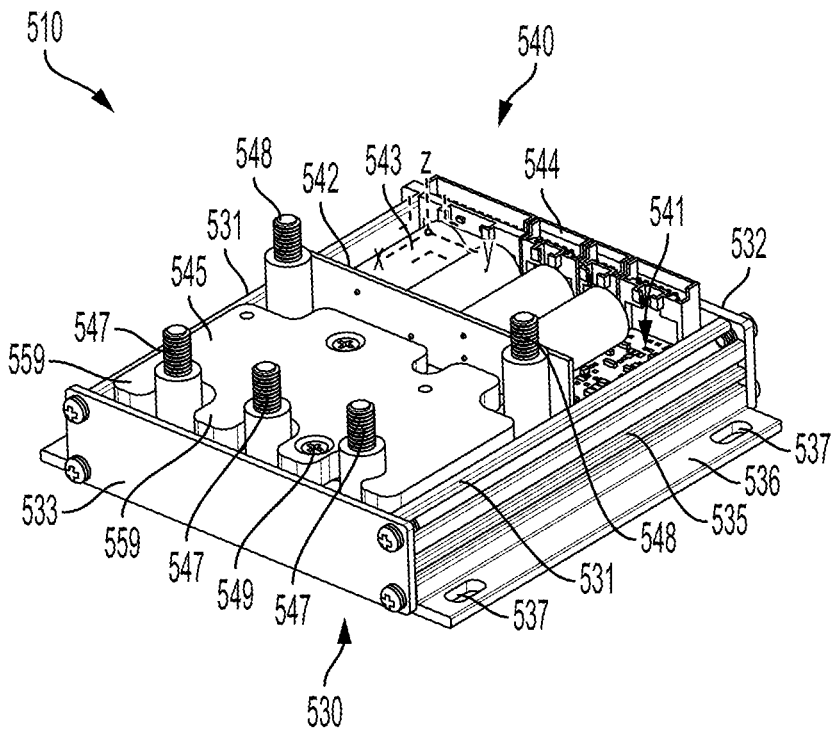
FIG. 40 depicts a perspective view of the control and power module including a mounting frame, according to an embodiment.

FIG. 40 depicts a perspective view of the control and power module 510, according to an embodiment. In an embodiment, the control and power module 510 includes a mounting frame (i.e., module housing) 530 that is made of thermally-conductive material and a circuit board assembly 540 mounted therein. In an embodiment, the mounting frame 530 includes two side walls 531 extending substantially in parallel, a rear wall 532 and a front wall 533 fastened to the two side walls 531 opposite one another, where the four walls cooperatively forming an open top for receiving the circuit board assembly 540. In an embodiment, each side wall 531 includes a series of longitudinally extending fins 535 arranged to increase thermal conductivity of the mounting frame 530. In an embodiment, each side wall 531 also includes a side foot 536 extending away at approximately a 90 degree angle, each side foot 536 including two openings 537 that receive fastener (not shown) for securing the control and power module 510 to the metal plate 502 of the motor control panel 500.

Figure 41A:
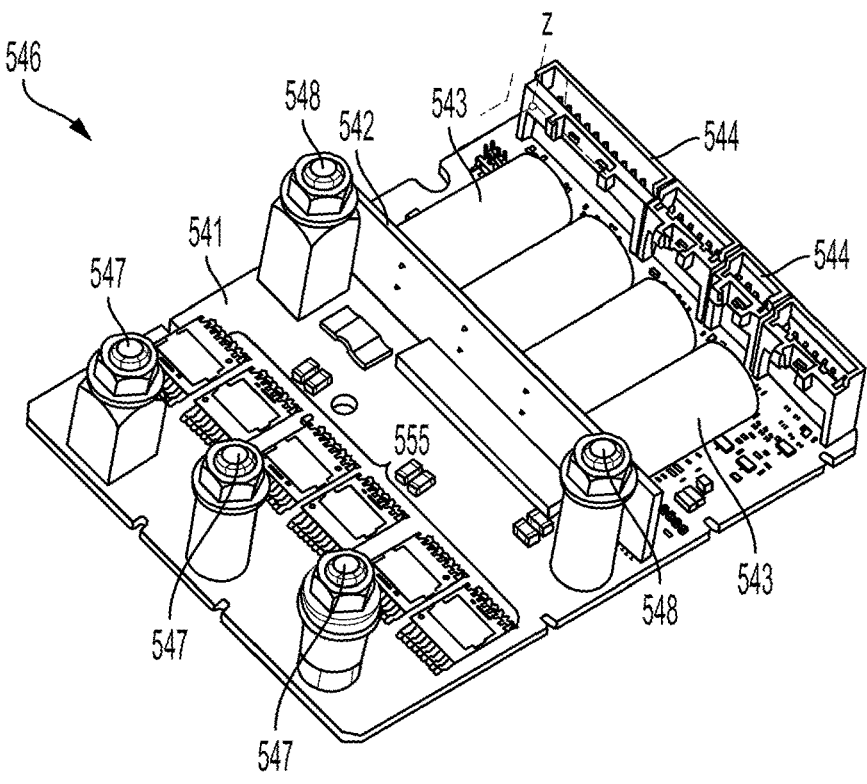
FIGS. 41A and 41B depict top and bottom perspective views of a circuit board assembly accommodated within the control and power module, according to an embodiment.
Figure 41B:
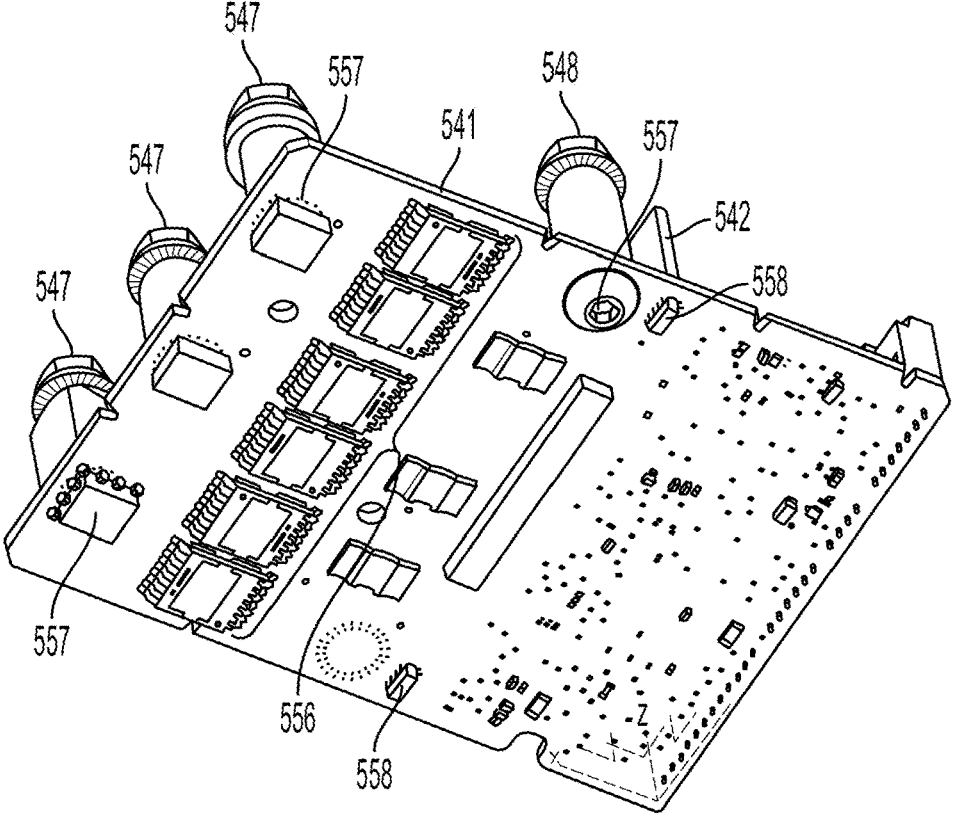

FIGS. 41A and 41B respectively depict top and bottom perspective views of a circuit board assembly 540, according to an embodiment.

As shown in these figures, and with continued reference to FIG. 40, in an embodiment, the circuit board assembly 540 includes a main circuit board 541 that is horizontally received within the mounting frame 530, and an auxiliary circuit board 542 that extends at approximately a 90 degree angle from the main circuit board 541. In an embodiment, the auxiliary circuit board 542 includes one or more legs 558 received through corresponding slots in the main circuit board 541 to supports its upright orientation. In an embodiment, the one or more legs 558 are soldered to the main circuit board 541. In an embodiment, a series of capacitors 543 are mounted on the auxiliary circuit board 542 and extend parallel to the main circuit board 541. This arrangement saves significantly reduces the length and the height of the control and power module 510. The height of the control and power module 510 is reduced because the capacitors 543 have a greater height than diameter, thus the capacitors 543 add significantly less height to the control and power module 510 in this orientation than they would in a conventional upright orientation. Further, the length of the control and power module 510 is also reduced because the capacitors 543 overlay other circuitry and electronic components mounted on the main circuit board 541, thus making no significant contribution to the overall length of the control and power module 510. In an embodiment, most components of the control unit 520 (FIG. 38), including the motor controller 524, the gate driver 526, and the power supply regulator 522, are mounted on the top surface of the main circuit board 541 and overlaid by the capacitors 543. In an embodiment, capacitors 543 may be connected in parallel to form the bus capacitor 516 (FIG. 38). In an embodiment, the capacitors 543 are electrically connected via conductive traces that pass along (or through) the one or more legs 558 and the soldering connections to the main circuit board 541.

In an embodiment, the circuit board assembly 540 further includes a series of connectors 544 mounted near a rear edge of the main circuit board 541 adjacent distal ends of the capacitors 543. Connectors 544 provide various digital and/or analog signal wires, including but not limited to temperature signals, Hall signals, speed signals, etc. to the motor controller 524.

In an embodiment, the circuit board assembly 540 additionally includes three power output posts 547 mounted near a front edge of the main circuit board 541 on the top surface for coupling to the phases PV, PW and PV of the respective motor. The circuit board assembly 540 also includes two power input posts 548 mounted approximately halfway between the front and rear edge of the main circuit board 541 on the top surface adjacent the auxiliary circuit board 542 for coupling to the DC bus line 504. In an embodiment, each of the output and input power posts 547 and 548 may be received through the main circuit board 541 and secured to a metal slug (or nut) 557 mounted on the bottom surface.

In an embodiment, circuit board assembly 540 also includes a first array of power switches 555 mounted on the top surface of the main circuit board 541, and a second array of power switches 556 mounted on the bottom surface of the main circuit board 541 in mirror opposite orientation. In an embodiment, first array of power switches 555 includes the three pairs of high-side FETs (Q1A and Q1B, Q2A and Q2B, and Q3A and Q3B) and the second array of power switches 556 incudes the three pairs of low-side FETs (Q4A and Q4B, Q5A and Q5B, and Q6A and Q6B). Alternatively, in an embodiment, each array includes one FET from each pair, i.e., the FETs within each pair (e.g., Q1A and Q1B) are mounted on the opposite surfaces of the main circuit board 541 in mirror-opposite of each other. In an embodiment, the interconnections configuring the FETs as a three-phase inverter circuit (see power switch circuit 514 of FIG. 39) are provided via metal traces on or through the main circuit board 541, with DC_Bus and Gnd nodes of the power switch circuit 514 electrically routed to the power input posts 548 and the outputs PU, PV and PW of the power switch circuit 514 electrically routed to the power output posts 547.

Figure 42:
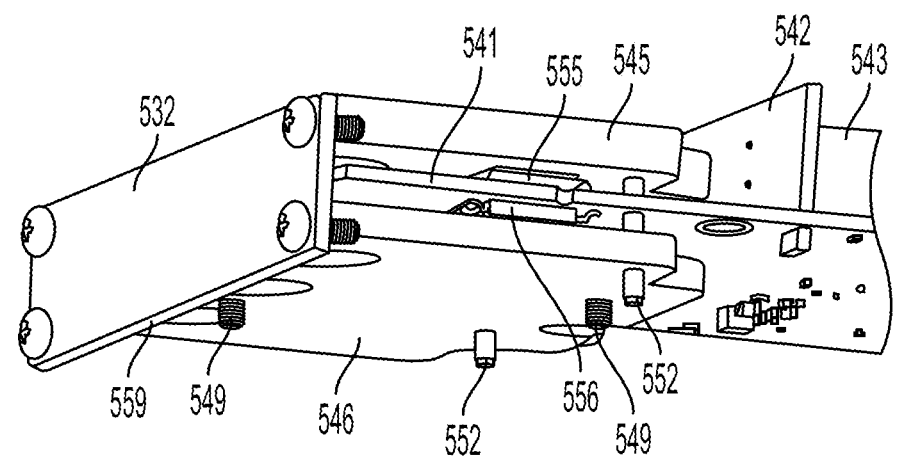
FIG. 42 depicts a partial perspective view of the circuit board assembly in thermal contact with an upper heat sink and a lower heat sink, according to an embodiment.

FIG. 42 depicts a partial perspective view of the circuit board assembly 540 showing an upper heat sink 545 and a lower heat sink 546 in thermal contact with the main circuit board 541, according to an embodiment. In an embodiment, as shown here and with continued reference to FIG. 40, the heat sinks are orientated parallel to main circuit board 541 adjacent opposite surfaces, with the upper heat sink 545 is thermal contact with the first array of power switches 555 and the lower heat sink 546 in thermal contact with the second array of power switches 556. In an embodiment, two alignment posts 552 are provided to ensure proper alignment of the heat sinks 545 and 546 relative to one another and the main circuit board 541. In an embodiment, one or more fasteners 549 are received through the upper heat sink 545 and the main circuit board 541 and fastened into corresponding threaded openings of the lower heat sink 546 to fixedly position the heat sinks 545 and 546 at predetermined desired positions relative to the power switches. In an embodiment, the heat sinks 545 and 546 may be disposed in contact with, or in very close proximity to, the power switches for effective heat transfer. In an embodiment, a layer of thermally-conductive but electrically-insulating gap pad may be disposed between the power switches and the heat sinks 545 and 546 to remove any air gaps while maintaining electrical insulation between the heat sinks 545 and 546 and the power switches. In an embodiment, the heat sinks 545 and 546 include circumferential ribs 559 arranged to penetrate into spaces between and around the power output post 547 and maximize the surface area of the heat sinks 545 and 546.

Figure 43:
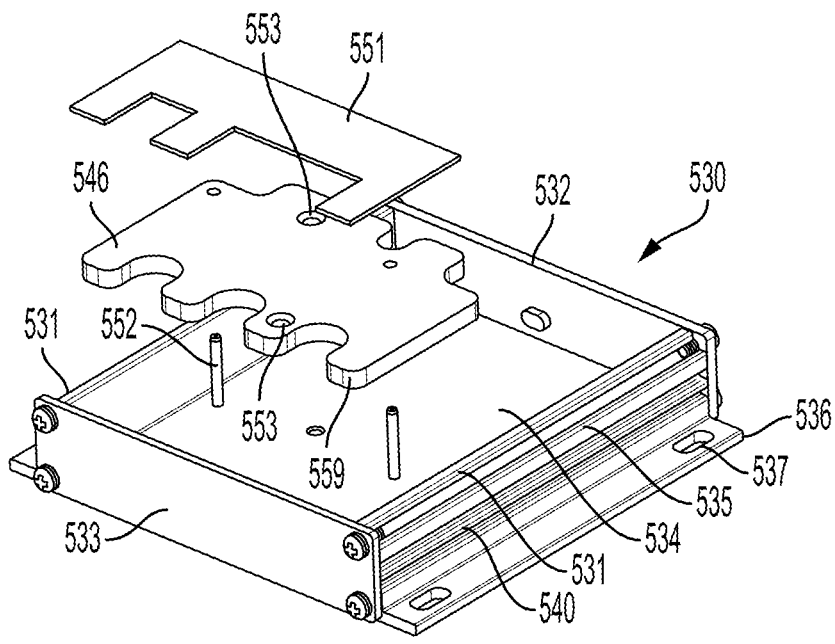
FIG. 43 depicts a perspective exploded view of the lower heat sink relative to a mounting frame, according to an embodiment.
Figure 44:
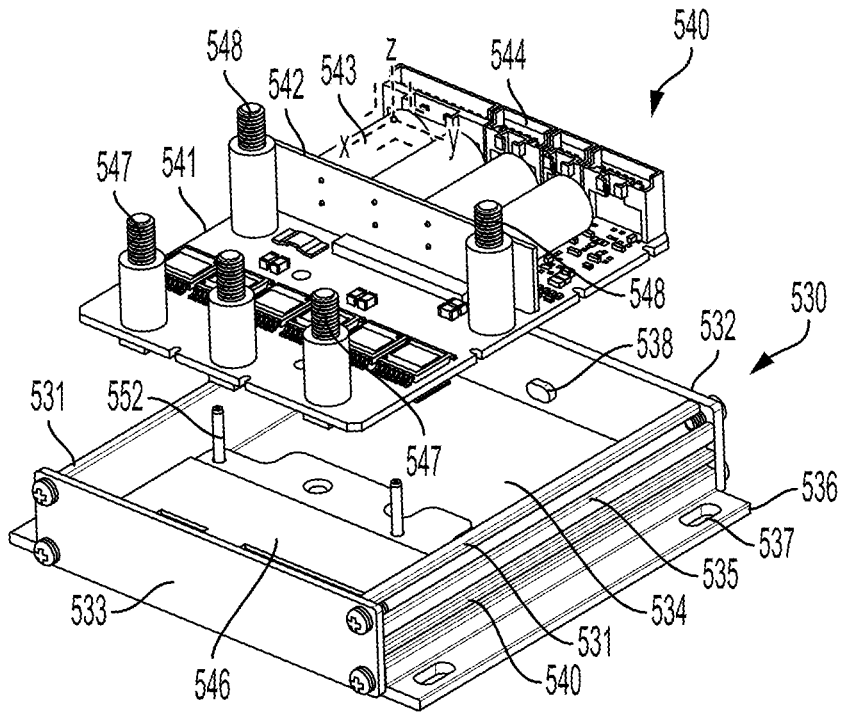
FIG. 44 depicts a perspective exploded view of the circuit board assembly relative to the mounting frame and the lower heat sink subassembly, according to an embodiment.
Figure 45:
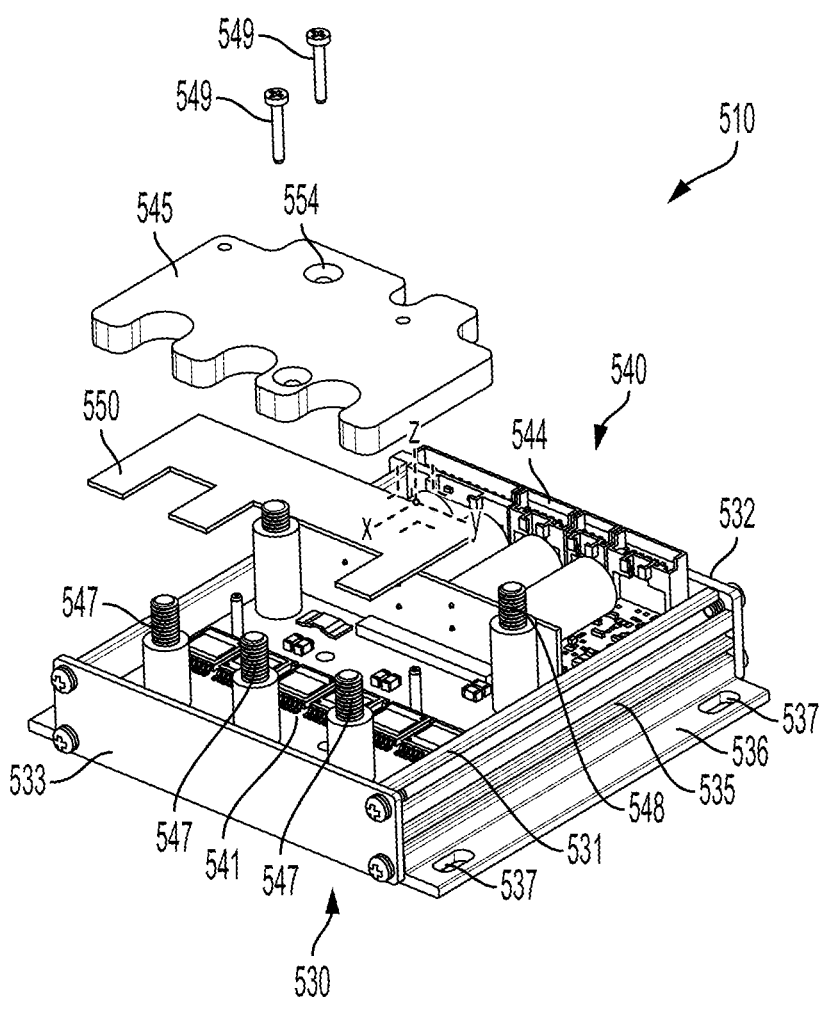
FIG. 45 depicts a perspective view of the upper heat sink relative to the mounting frame and circuit board assembly subassembly, according to an embodiment.

FIGS. 43 to 45 depict the steps in the assembly process of the control and power module 510, according to an embodiment.

FIG. 43 depicts a perspective exploded view of the lower heat sink 546 relative to the mounting frame 530, according to an embodiment. In an embodiment, the mounting frame 530 is initially constructed by securing the four walls 531-533 and a bottom wall 534 as depicted. In an embodiment, the alignment posts 552 are mounted perpendicularly on the bottom wall 534. The lower heat sink 546 is then slid along the alignment posts 552 and mounted on the bottom wall 534 in its predetermined position. In an embodiment, a lower gap pad 551 is laid on top of the lower heat sink 546.

FIG. 44 depicts a perspective exploded view of the circuit board assembly 540 relative to the mounting frame 530 and the lower heat sink 546 subassembly, according to an embodiment. In an embodiment, the circuit board assembly 540 is slid along the alignment posts 552 and mounted on the lower gap pad 551 and the lower heat sink 546. In an embodiment, the rear wall 532 includes a notch 538 that supports the rear end of the main circuit board 541 away from the lower heat sink 546 is supported at a distance from the bottom wall 534.

FIG. 45 depicts a perspective view of the upper heat sink 545 relative to the mounting frame 530 and circuit board assembly 540 subassembly, according to an embodiment. In an embodiment, an upper gap pad 550 is secured to a lower surface of the upper heat sink 545, and the upper heat sink 545 is slid along the alignment posts 552 and mounted on the main circuit board 541 until the upper gap pad 550 comes into contact with the first array of power switches 555. Fasteners 549 are received through openings 554 of the upper heat sink 545 and the main circuit board 541 and fastened into corresponding threaded openings 553 of the lower heat sink 546 to complete the assembly process.

The regenerative energy control module 560 and regenerative energy absorbing module 580 are described herein with reference to FIGS. 46-49, according to an embodiment.

Figure 46:
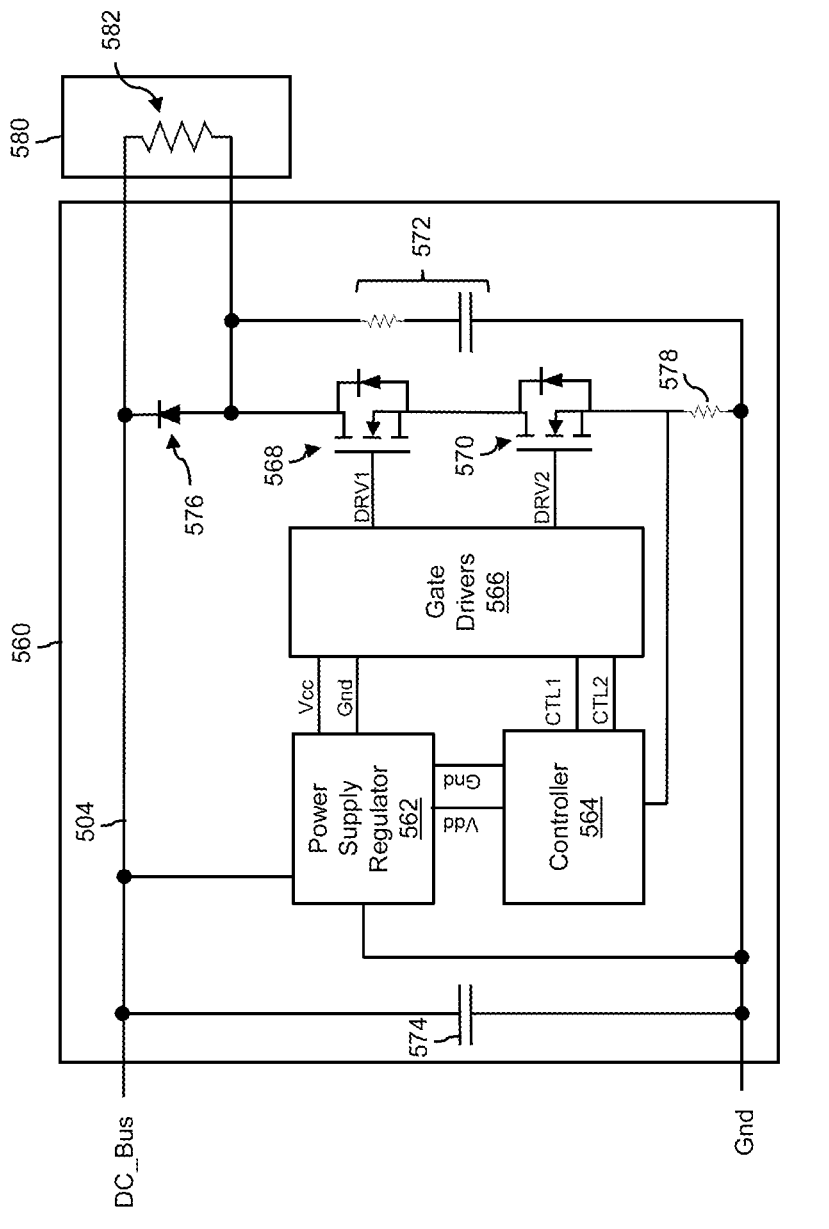
FIG. 46 depicts a block circuit diagram of a regenerative voltage control module and regenerative energy absorbing resistor, according to an embodiment.

FIG. 46 depicts a block circuit diagram of the regenerative energy control module 560 and the regenerative energy absorbing module 580, according to an embodiment. In an embodiment, the regenerative energy control module 560 is coupled to the DC bus line 504 and includes a controller 564, gate driver 566, a power supply regulator 562, two power switches 568 and 570, a resistor-capacitor (RC) circuit 572, a bus capacitor 574, and a flyback diode 576.

In an embodiment, controller 564 is a programmable device arranged to detect the voltage on the DC bus line 504 and switchably activate the regenerative energy absorbing module 580 across the DC bus line 504 if the detected voltage is above a voltage threshold. In an example, the controller 562 may be configured to activate the regenerative energy absorbing module 580 if the detected voltage is above a first voltage threshold (e.g. 70V) and deactivate it if the detected voltage is below a second voltage threshold (e.g., 65V). In doing so, the controller 562 protects various components including the batteries 600, the BPM 508, and the control and power modules 510 against high voltage. Thus, in the event of electronic braking of the deck motors 200 or drive motors 400, where high amounts of regenerative braking current flow back into the DC bus line 504, while the BPM 508 uses the excess regenerative energy to recharge the battery packs 600, the controller 562 ensures that the voltage on the DC bus line 504 is maintained below a reliably safe level. In an embodiment, controller receives the bus voltage via a voltage sensor (not shown) coupled to the DC bus line 504.

In an embodiment, the controller 562 drives the gates of the power switches 568 and 570 via the gate drivers 566. The power supply regulator 562 is provided to power the controller 564 and the gate drivers 566 at suitable voltage levels.

In an embodiment, power switches 568 and 570 are disposed between the DC_Bus and Gnd nodes of the DC bus line 504. In this embodiment, two power switches are provided for fault redundancy and improved reliability, though a single power switch may be sufficient. If both power switches are activated by the controller 564, a current path through the regenerative energy absorbing module 580 and the two power switches 568 and 570 is activated between the DC_Bus and Gnd nodes of the DC bus line 504. Regenerative energy absorbing module 580 includes a resistor network 582 that absorbs the excess voltage from the DC bus line 504 until one or both of the power switches 568 or 570 are deactivated by the controller 564.

In an embodiment, the shunt resistor 578 is disposed on the current path in series with the power switches 568 and 570 to allow the controller 564 to measure the current through the resistor network 582. In an embodiment, the flyback diode 576 is provided in parallel with the regenerative energy absorbing module 580 to provide a return path for the inductive energy of the resistor network 582 back into the DC bus line 504 when the power switches 568 or 570 are opened. The R-C circuit 572 is provided to stabilize the switching transients across the across the power switches 568 and 570. The bus capacitor, which in an example is approximately 80 uF to 120 uF, stabilizes the voltage on the DC bus line 504.

Figure 47:
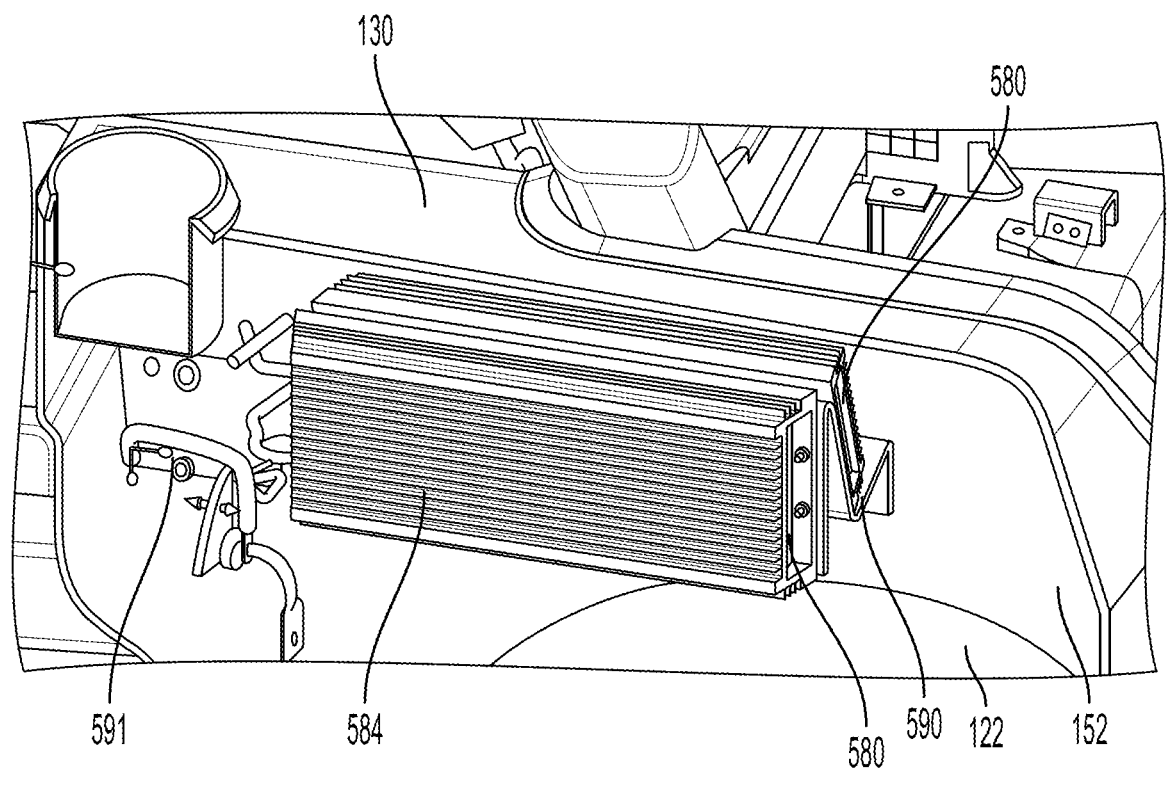
FIG. 47 depicts a cross-sectional perspective view of a left operator side pod of the electric lawn apparatus housing two regenerative energy absorbing modules, according to an embodiment.

FIG. 47 depicts a cross-sectional perspective view of the left operator side pod 130 of the electric lawn apparatus 100 housing two regenerative energy absorbing modules 580, according to an embodiment. In an embodiment, a mounting bracket 590 is secured to the side plate 152 of the of the main frame 106 of the electric lawn apparatus 100. The mounting bracket 590 in this embodiment includes leg secured to the main frame 106 and a V-shaped frame extending from the leg. In the embodiment, the two regenerative energy absorbing modules 580 are mounted on opposite faces of the V-shaped frame. Each regenerative energy absorbing module 580, as previously discussed, houses a resistor network 582 therein, each being selectively activated by a respective regenerative energy control module 560. In an embodiment, electrical wires 591 electrically couple each regenerative energy absorbing modules 580 to the respective regenerative energy control module 560. In an embodiment, the left operator side pod 130 forms a housing around the mounting bracket 590 and the regenerative energy absorbing modules 580.

Figure 48:
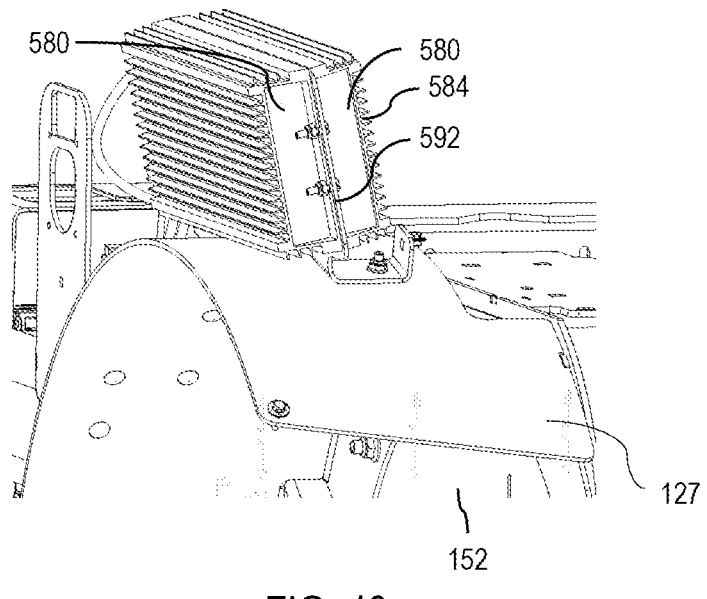
FIG. 48 depicts a cross-sectional perspective view of an alternative left operator side pod configuration for housing the two regenerative energy absorbing modules, according to an embodiment.

FIG. 48 depicts a partial perspective view of the left operator side pod 130 of the electric lawn apparatus 100 housing two regenerative energy absorbing modules 580, according to an alternative embodiment. In this embodiment, a mounting bracket 592 is mounted on the fender 127, which is in turn fastened to the side plate 152 of the of the main frame 106. The mounting bracket 592 in this embodiment includes a leg that is fastened on top of the fender 127, and a plate extending angularly from the leg. The two regenerative energy absorbing modules 580 are secured to the opposite faces of the plate.

In an embodiment, each regenerative energy absorbing module 580 includes a finned metal outer housing 584 to dissipate heat away from the resistor network 582.

The features and embodiments described above, including but not limited to the deck motor 200, the drive motor 400, and the control and power module 510, may be incorporated in other motorized powered apparatuses other than mowing and outdoor products. These include, but are not limited to, battery powered power tools such as grinders, hammer drills, demolition hammers, etc.

Some of the techniques described herein may be implemented by one or more computer programs executed by one or more processors residing, for example on a power tool or an outdoor apparatus. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

The invention claimed is:

1. An electric motor comprising:
a stator having a stator core, a plurality of stator teeth extending radially from the stator core, and a plurality of windings wound around the plurality of stator teeth;
a rotor rotatably positioned relative to the stator and having a rotor core and a plurality of permanent magnets secured to the rotor core in magnetic interface with the plurality of stator windings;
a motor spindle coupled to the rotor and extending along a center axis;
a first end cap formed on a first side of the stator;
a second end cap formed on a second side of the stator and secured to the first end cap to form a first compartment around the stator and the rotor;
an electro-magnetic brake module disposed on a side of the second end cap opposite the stator and engaged with the motor spindle, electro-magnetic brake module being configured to selectively apply a braking force to the motor spindle; and
a motor cover mounted on the second end cap to form a second compartment around the electro-magnetic brake module,
wherein the first end cap, the second end cap, and the motor cover form a substantially watertight seal around the stator, the rotor, and the electro-magnetic brake module.

2. The electric motor of claim 1, wherein the second end cap comprises a rear wall having an annular or semi-annular profile formed on a surface thereof facing away from the stator and around the center axis, wherein the electro-magnetic brake module is mounted on the rear wall.

3. The electric motor of claim 2, further comprising a position sensor assembly mounted within the rear wall and arranged to sense a magnetic orientation of the motor spindle.

4. The electric motor of claim 2, further comprising:
a plurality of stator terminals electrically coupled to the plurality of windings and projecting axially from the stator through at least one slot of formed in the second end cap such that a distal end of the plurality of stator terminals is located within the rear wall; and
a wire cord including a plurality of power wires coupled to the distal end of the plurality of stator terminals to supply electric power to the plurality of stator windings via the plurality of stator terminals and at least one additional wire coupled to the electro-magnetic brake module.

5. The electric motor of claim 1, wherein the electro-magnetic brake module is configured to apply the braking force to the output spindle when it does not receive a supply of electric power.

6. The electric motor of claim 5, wherein the electro-magnetic brake module receives a pinion mounted on the output spindle, and comprises a friction disc mounted onto the pinion and a plate that selectively disengages the friction disk when the electro-magnetic brake module receives the supply of electric power.

7. The electric motor of claim 1, wherein the first end cap, the second end cap, and the cover comprise thermally-conductive material, the electric motor further comprising a plurality of gap pads mounted on an axial end of the plurality of windings in contact with the second end cap, the plurality of gap pads being made of thermally-conductive but electrically-insulating material to transfer heat from the plurality of windings to the second end cap.

8. The electric motor of claim 1, further comprising a first elastically-deformable ring member disposed between the first end cap and the second end cap to provide a seal between the first end cap and the second end cap, and a second elastically-deformable ring member disposed between the second end cap and the motor cover to provide a seal between the second end cap and the motor cover.

9. The electric motor of claim 1, wherein
the first end cap includes a first cylindrical body that surrounds the rotor;
the second end cap includes a front annular projection arranged to be fittingly received within an end of the first cylindrical body forming a seal therebetween; and
the end cap comprises a second cylindrical body having a smaller diameter than the first cylindrical body, a flange projecting outwardly from the second cylindrical body and mounted on the second end cap, and a plurality fins having sloped external edges extending from the second cylindrical body to a peripheral portion of the flange.

10. The electric motor of claim 1, wherein the rotor core comprises an outer annular body surrounding the stator configured to support the plurality of permanent magnets, a radial wall extending from the outer annular body and coupled to the motor spindle, a plurality of peripheral openings formed in the radial wall, and a plurality of ribs formed between the plurality of peripheral openings and configured to generate an airflow circulated through the electric motor.

11. An electric apparatus comprising:
a frame;
a drive motor secured to the frame and having a motor spindle;

a transmission assembly mounted on the drive motor and drivably coupled to the motor spindle;

an output hub mounted on the transmission assembly for driving a tire located adjacent the frame; and a mounting bracket mounted on the frame and including a body having a substantially cylindrical profile and an annular rim formed proximate a front end of the body, wherein the drive motor is mounted at least partially within the body, and the transmission assembly is mounted outside the body and fastened to the annular rim.

12. The electric apparatus of claim 11, wherein the drive motor is a brushless direct-current (BLDC) motor including a stator, rotor mounted on the motor spindle, a first end cap, a second end cap configured to secure the stator and coupled to the first end cap to form a first containment around the stator and the rotor, and a motor cover coupled to the second end cap to form a second containment around at least one of electronic components or current-carrying components of the motor, wherein the first end cap, the second end cap, and the cover cooperate to form a substantially watertight seal around the first containment and the second containment.

13. The electric apparatus of claim 12, wherein the motor cover is located adjacent the frame with a space therebetween.

14. The electric apparatus of claim 12, wherein the first end cap includes a cylindrical body that surrounds the rotor;

the second end cap includes an annular projection arranged to be fittingly received within an end of the cylindrical body along approximately a radial plane that intersects an axial end of the plurality of stator windings; and the motor further comprises an elastically-deformable ring member located between the of the cylindrical body of the first end cap and the annular projection of the second end cap to provide a substantially watertight seal between the first end cap and the second end cap.

15. The electric apparatus of claim 12, wherein the first end cap includes a first radial body and a first substantially cylindrical body extending from the radial portion; and the transmission assembly includes a mounting frame including a second radial body that forms a mounting surface for contact with the first radial body, and a second substantially cylindrical body that extends fittingly around the first substantially cylindrical body.

16. The electric apparatus of claim 15, wherein the motor further comprises a first plurality of fasteners that fastens the first end cap to the second end cap, and a second plurality of fasteners that fastens the first end cap to the mounting frame of the transmission assembly.

17. The electric apparatus of claim 15, wherein the motor further comprises an elastically-deformable ring member located between the of the first substantially cylindrical body and the second substantially cylindrical body to provide a substantially watertight seal between the first end cap and the second end cap.

18. The electric apparatus of claim 15, wherein the first end cap further includes a rear substantially cylindrical body extending from the first substantially cylindrical body to the second end cap, wherein the rear substantially cylindrical body has a larger diameter than the first substantially cylindrical body and is disposed outside the mounting frame of the transmission assembly.

19. The electric apparatus of claim 12, further comprising an electro-magnetic brake module disposed within the second compartment and configured to selectively apply a braking force to the motor spindle.

20. The electric motor of claim 1, wherein the second end cap comprises a rear wall having an annular or semi-annular profile formed on a surface thereof facing away from the stator and around the center axis, wherein the electro-magnetic brake module is mounted on the rear wall.

* * * * *